(12) United States Patent
Jang

(10) Patent No.: US 9,130,037 B2
(45) Date of Patent: Sep. 8, 2015

(54) METHOD OF FORMING SEMICONDUCTOR DEVICE

(71) Applicant: SAMSUNG ELECTRONICS CO., LTD., Suwon-si, Gyeonggi-do (KR)

(72) Inventor: Jae-June Jang, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/333,908

(22) Filed: Jul. 17, 2014

(65) Prior Publication Data

US 2014/0339637 A1  Nov. 20, 2014

Related U.S. Application Data

(62) Division of application No. 13/908,300, filed on Jun. 3, 2013, now Pat. No. 8,786,016.

(30) Foreign Application Priority Data

Nov. 5, 2012  (KR) .......................... 10-2012-0124424

(51) Int. Cl.
*H01L 21/8238* (2006.01)
*H01L 29/78* (2006.01)
*H01L 21/02* (2006.01)
(Continued)

(52) U.S. Cl.
CPC ...... *H01L 29/7816* (2013.01); *H01L 21/02233* (2013.01); *H01L 21/76224* (2013.01); *H01L 29/0649* (2013.01); *H01L 29/1079* (2013.01);
(Continued)

(58) Field of Classification Search
CPC ............... H01L 21/823493; H01L 21/823892; H01L 27/0928; H01L 29/7816; H01L 29/66681
USPC .................. 257/223, 224, 227, 228, 358, 369
See application file for complete search history.

(56) References Cited

U.S. PATENT DOCUMENTS 5,811,850 A  9/1998 Smayling et al.
6,924,531 B2  8/2005 Chen et al.
(Continued)

FOREIGN PATENT DOCUMENTS

JP  2004-063918  2/2004
JP  2008-091689  4/2008
KR  10-2001-0009586 A  2/2001

OTHER PUBLICATIONS

Chang, et al. Advanced 0.13um Smart Power Technology from 7V to 70V, Proceedings of the 2012 24th International Symposium on Power Semiconductor Devices and ICs, , pp. 217-220 (Jun. 3-7, 2012).

*Primary Examiner* — Tan N Tran
(74) *Attorney, Agent, or Firm* — Lee & Morse, P.C.

(57) ABSTRACT

A semiconductor device may include a semiconductor substrate, a first conductive type well and a second conductive type drift region in the semiconductor substrate, the drift region including a first drift doping region and a second drift doping region, the second drift doping region vertically overlapping the well, and a first conductive type body region in the well, the body region being in contact with a side of the first drift doping region. The first drift doping region and the second doping region may include a first conductive type dopant and a second conductive type dopant, and an average density of the first conductive type dopant in the first drift doping region may be less than an average density of the first conductive type dopant in the second drift doping region.

9 Claims, 46 Drawing Sheets

(51) Int. Cl.
*H01L 21/762* (2006.01)
*H01L 29/06* (2006.01)
*H01L 29/10* (2006.01)
*H01L 29/66* (2006.01)

(52) U.S. Cl.
CPC ...... *H01L 29/1095* (2013.01); *H01L 29/66659* (2013.01); *H01L 29/66681* (2013.01)

(56) References Cited

U.S. PATENT DOCUMENTS

| | | |
|---|---|---|
| 7,851,314 B2 | 12/2010 | Mallikarjunaswamy et al. |
| 8,058,129 B2 | 11/2011 | Lee |
| 2007/0069288 A1 | 3/2007 | Takeda |
| 2011/0269286 A1 | 11/2011 | Zuniga et al. |
| 2012/0037984 A1 | 2/2012 | Yu |

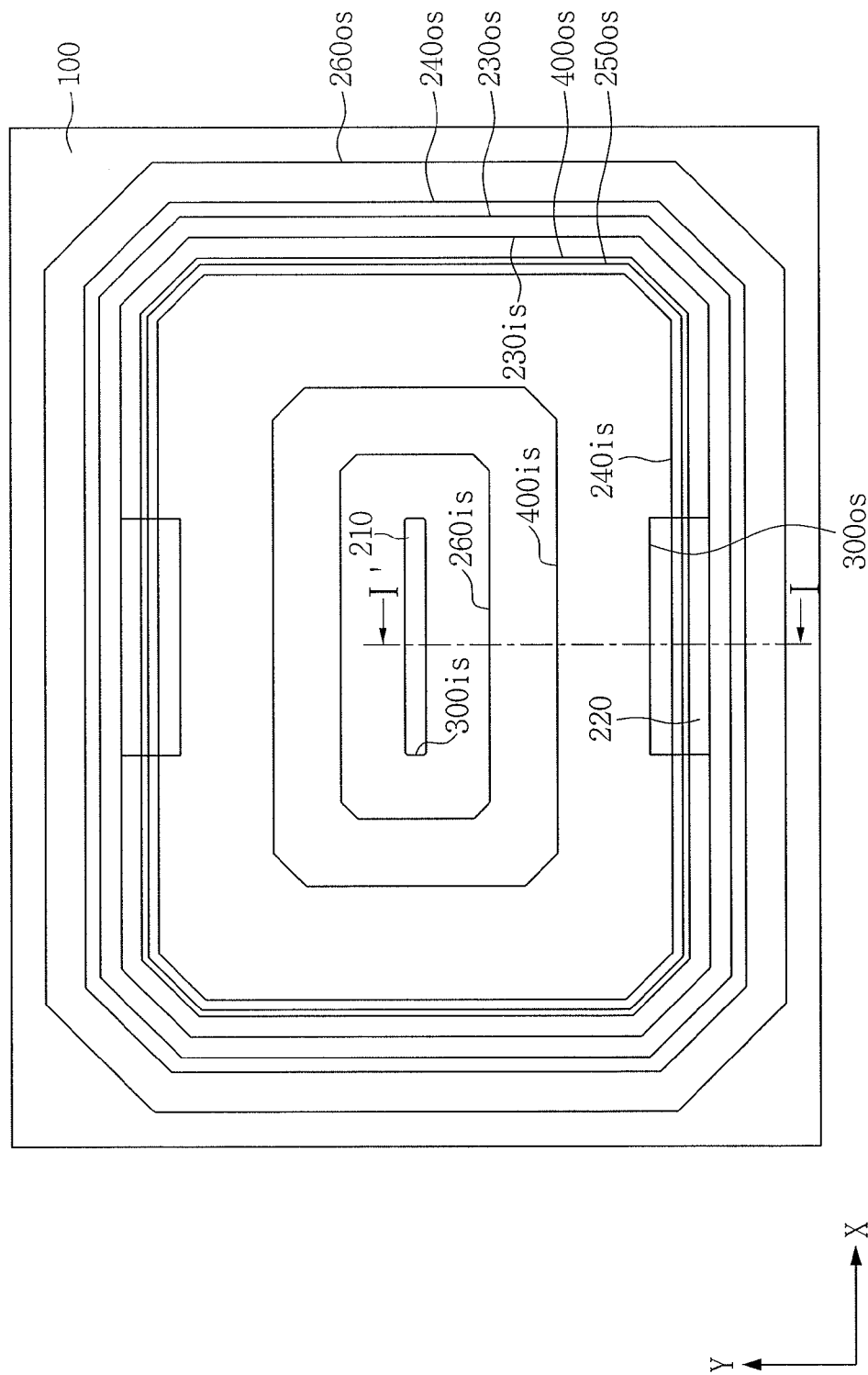

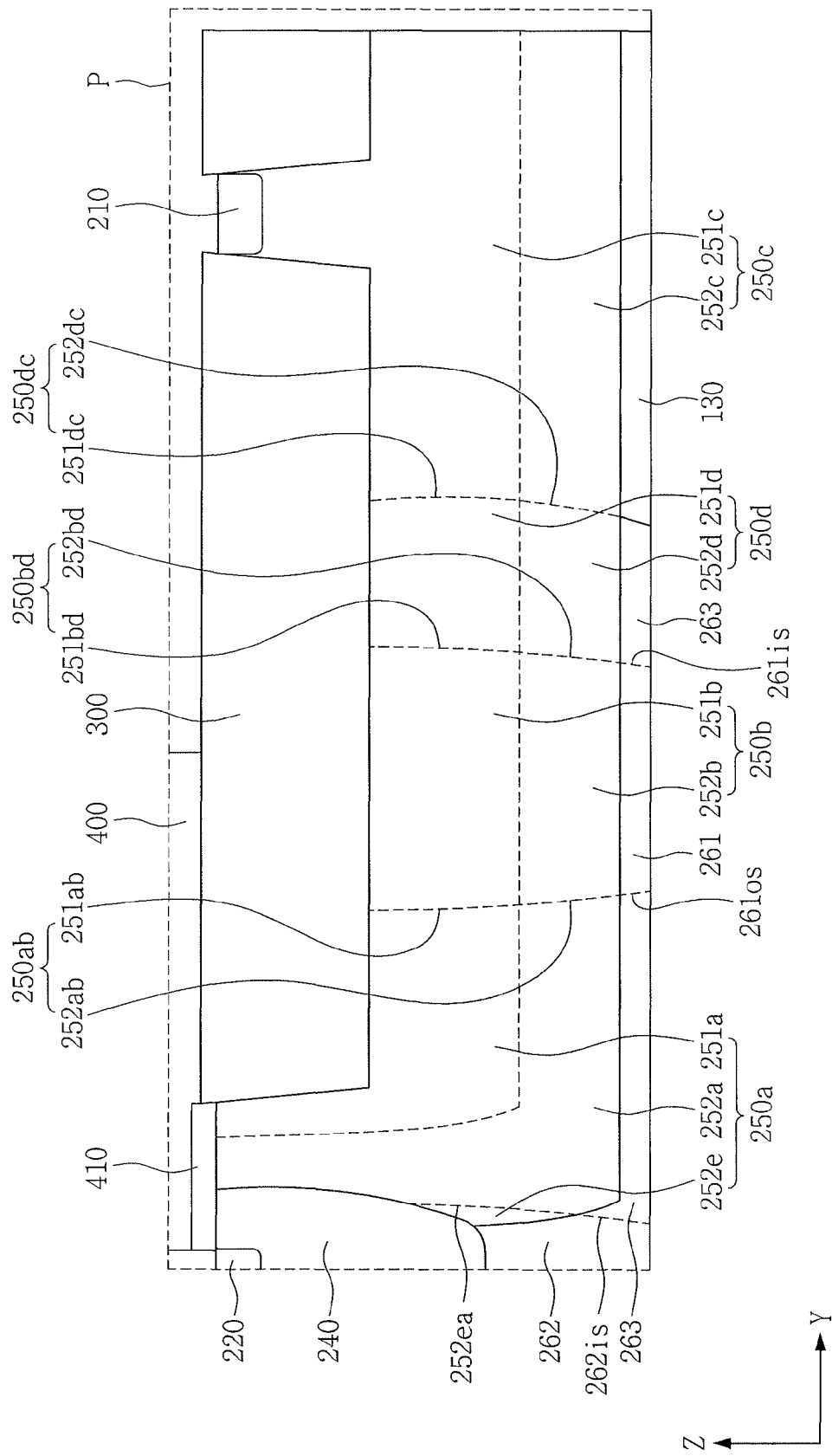

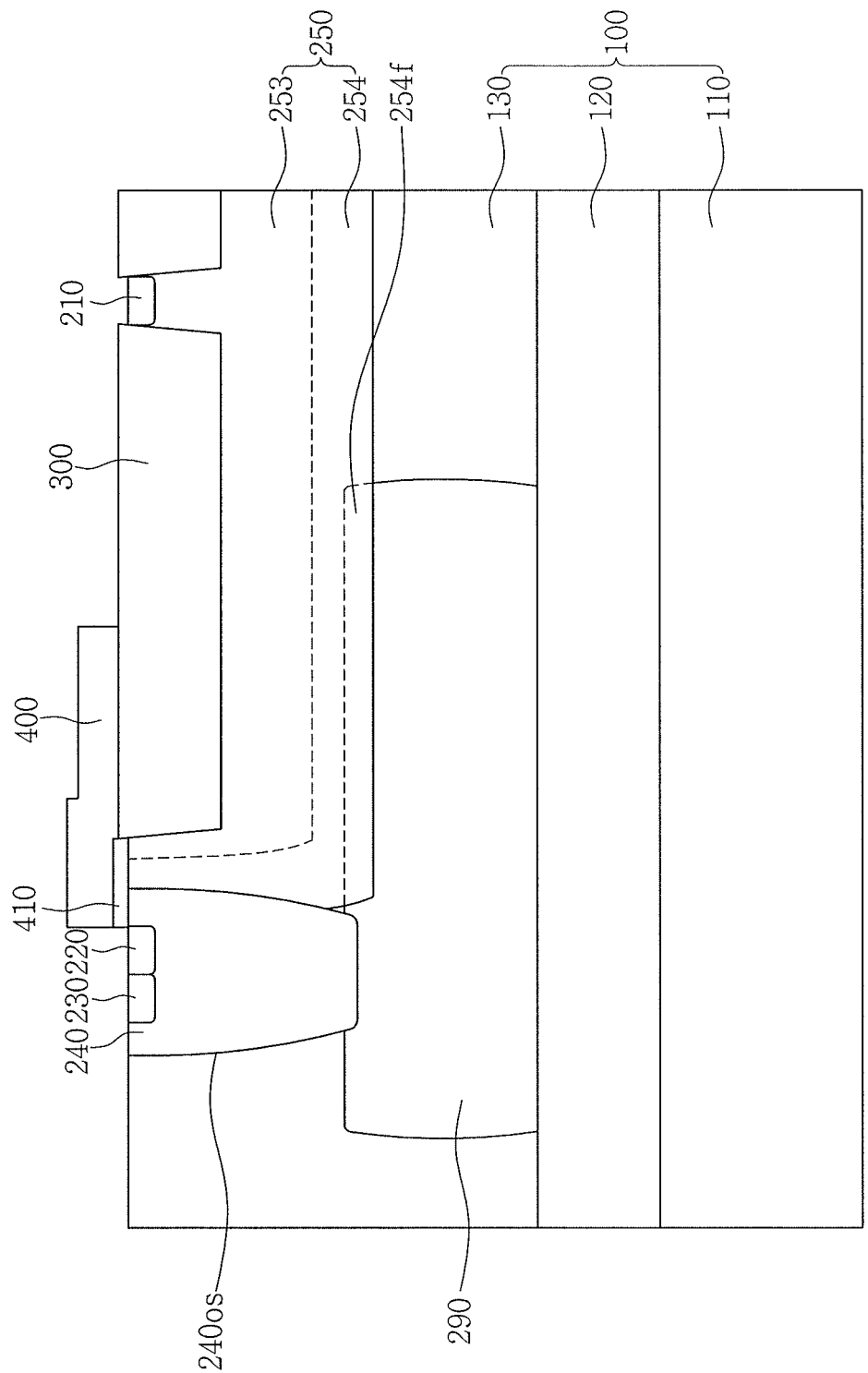

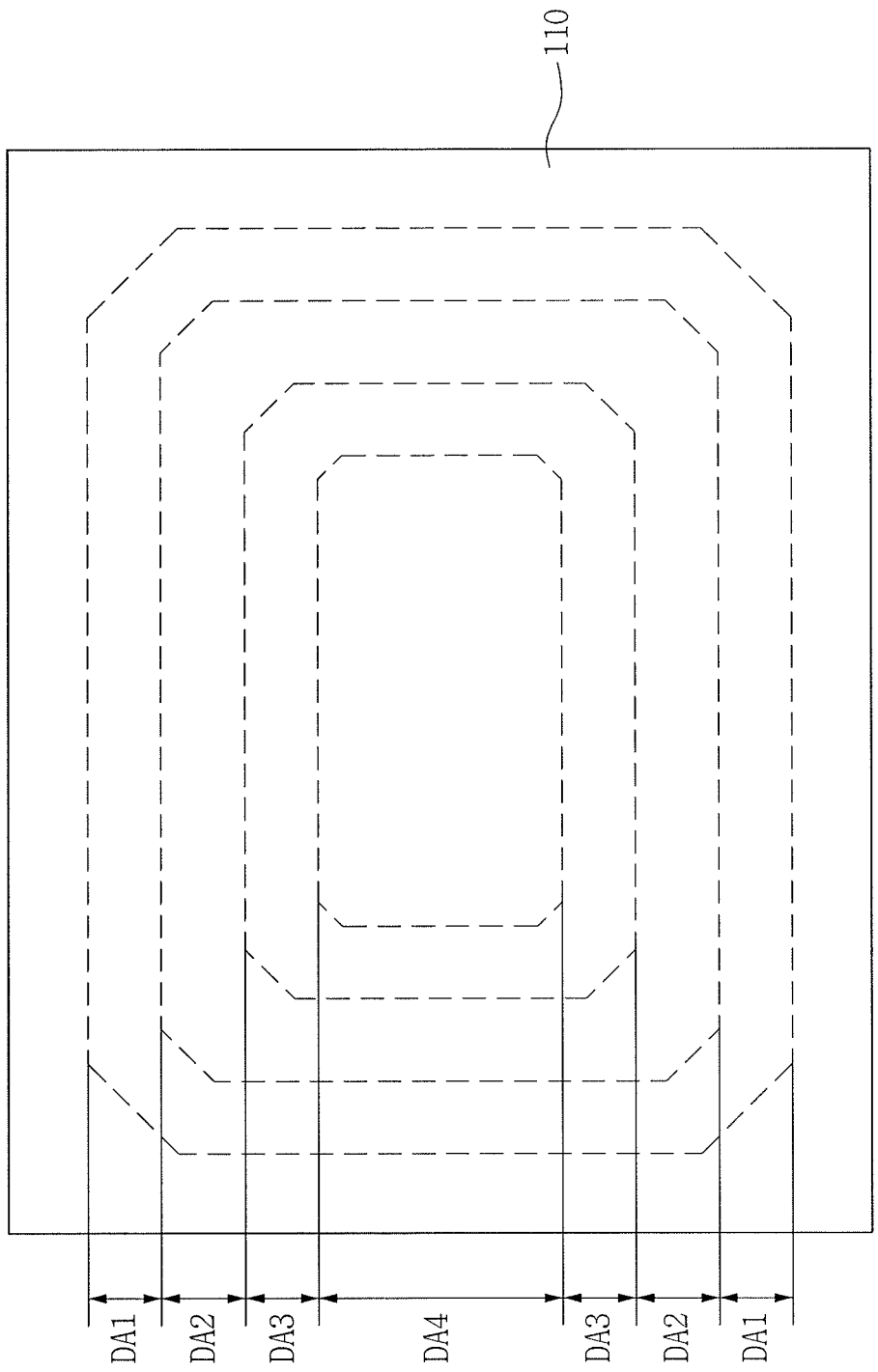

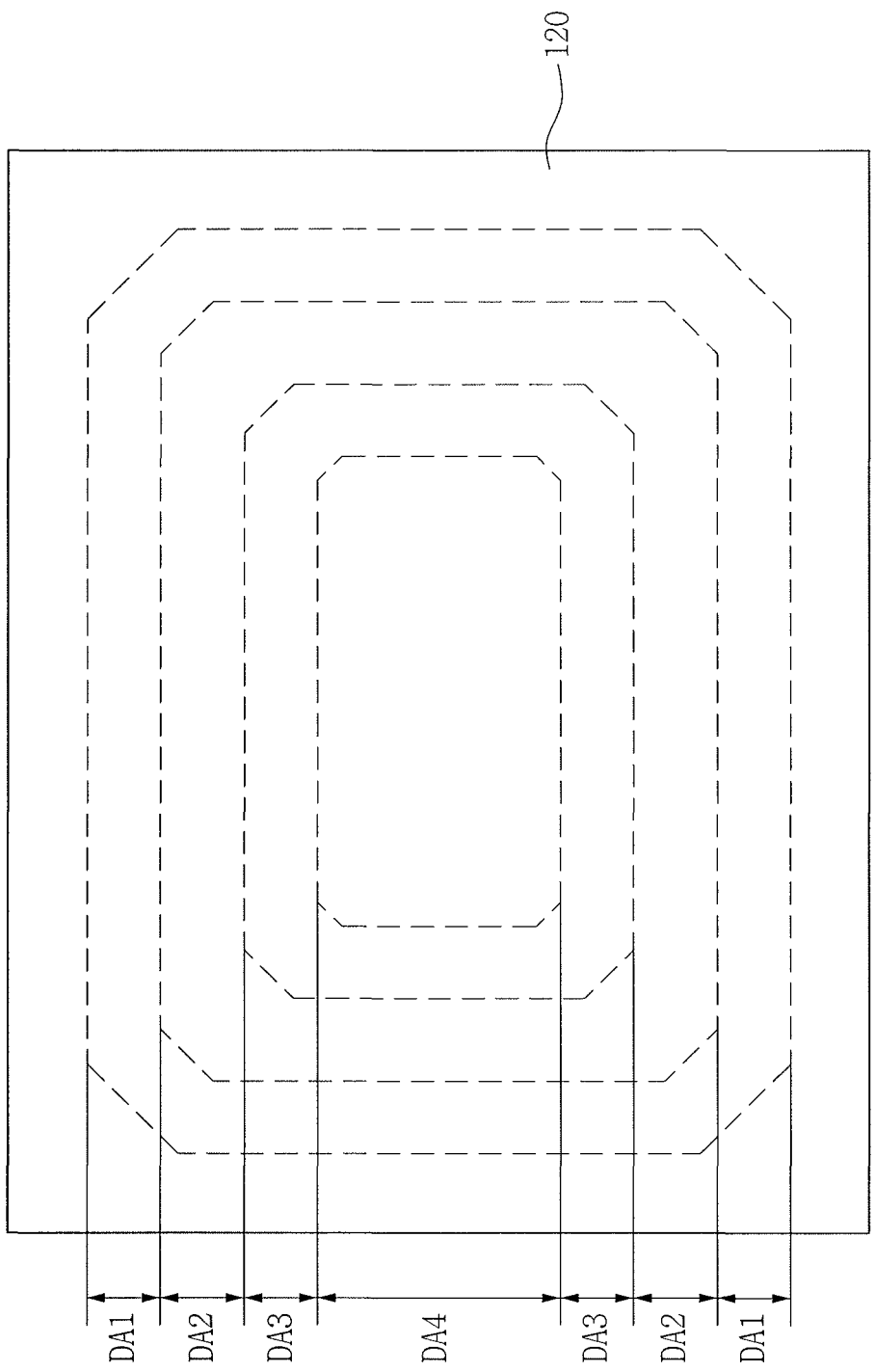

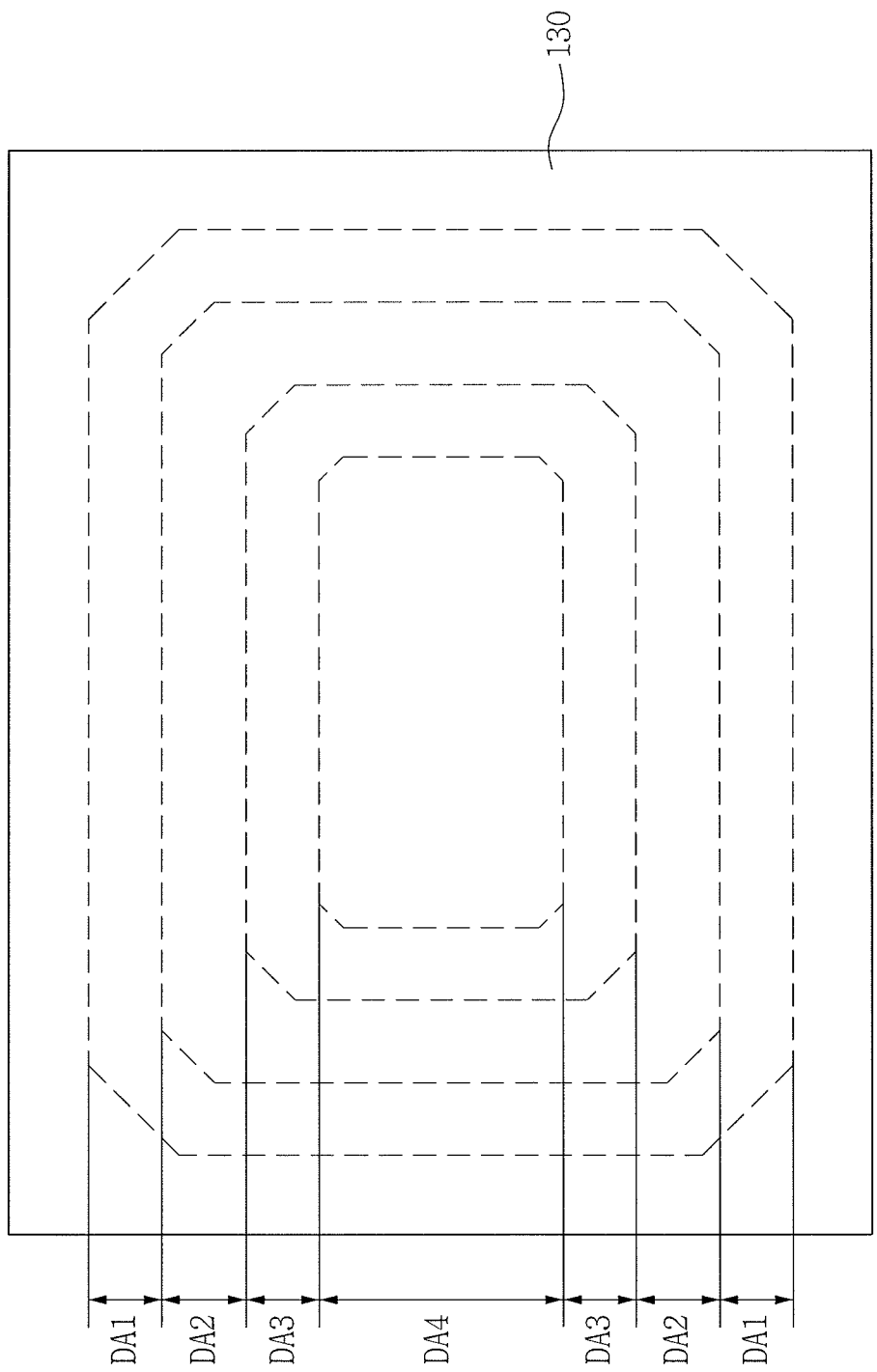

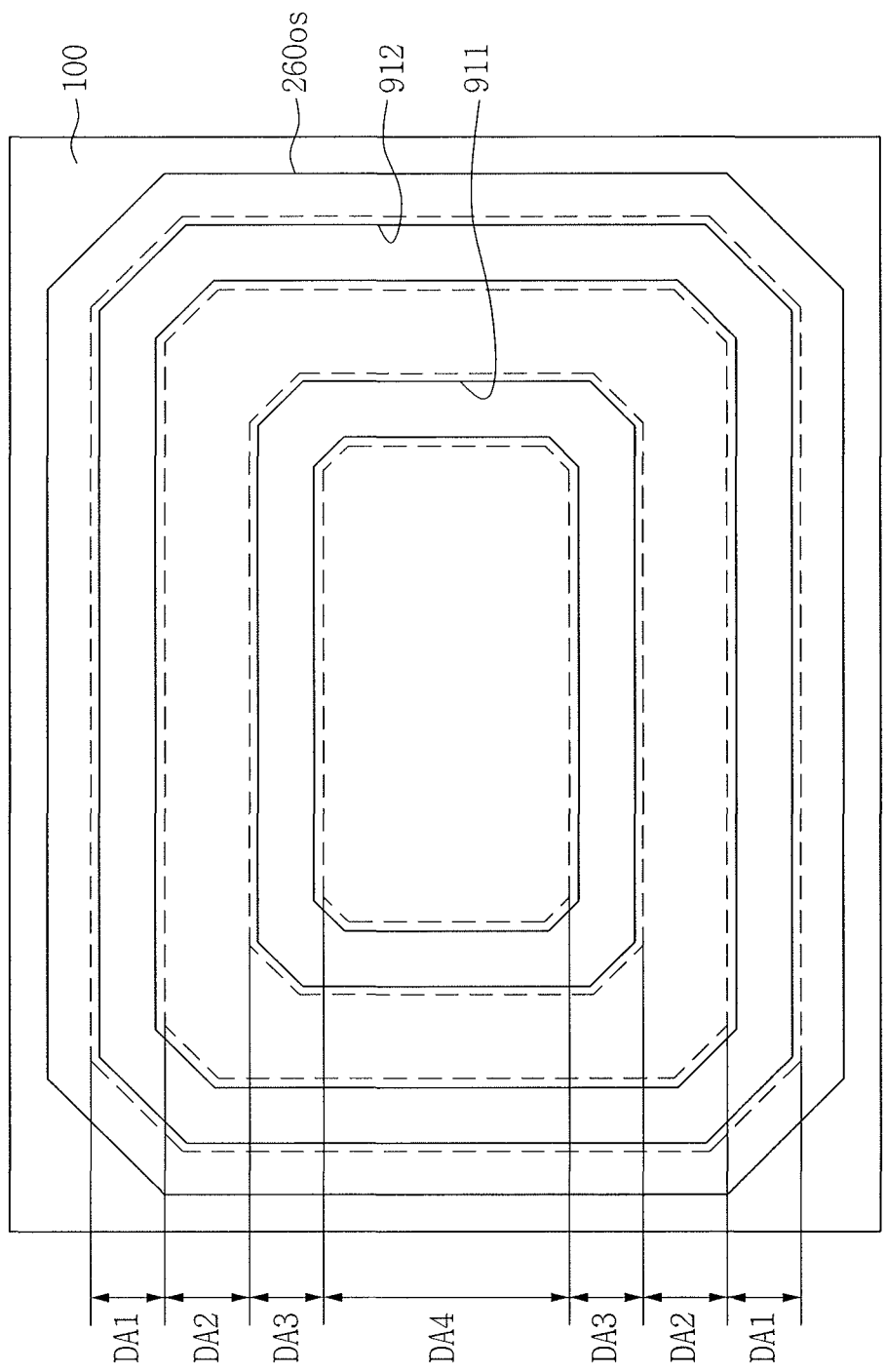

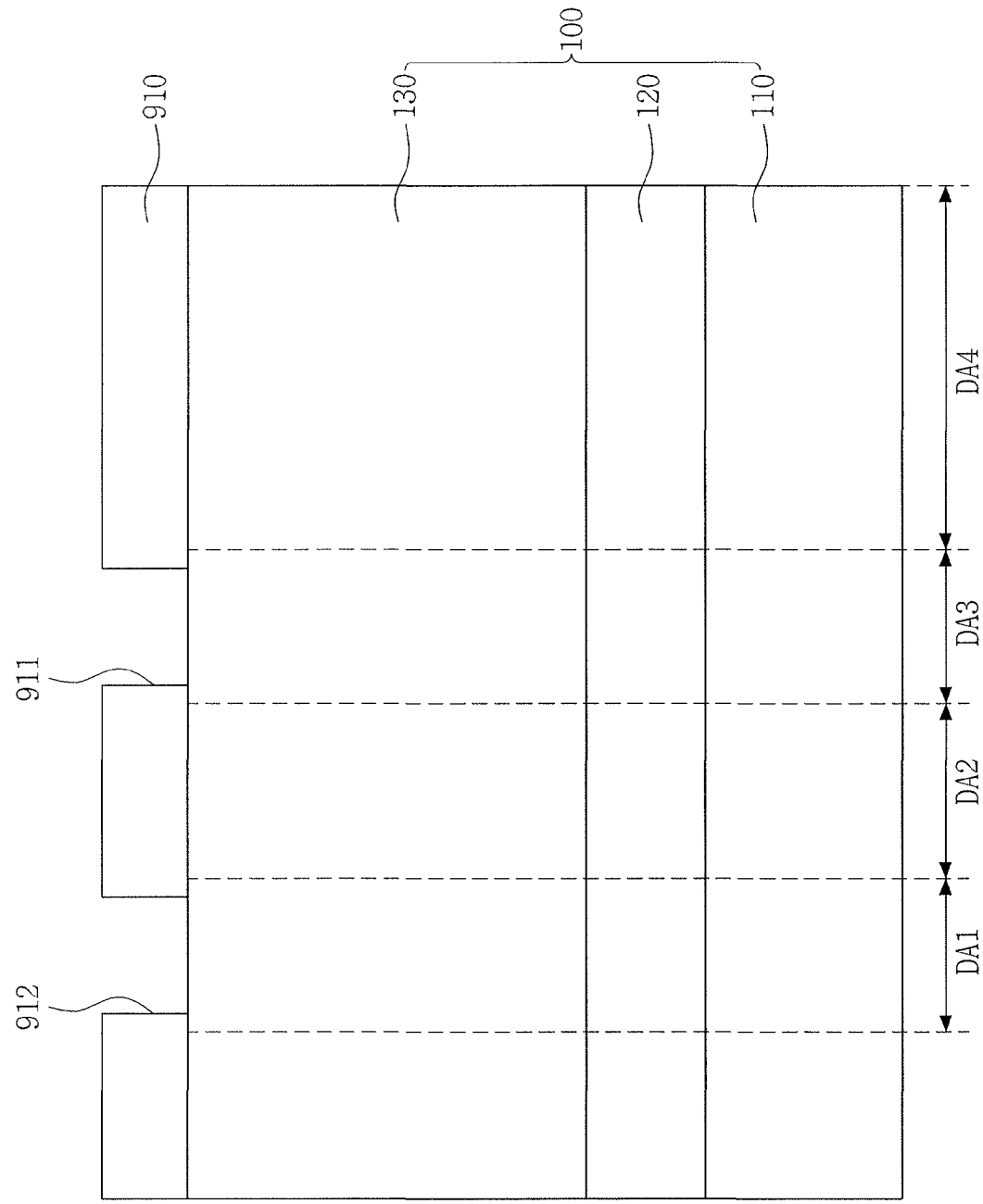

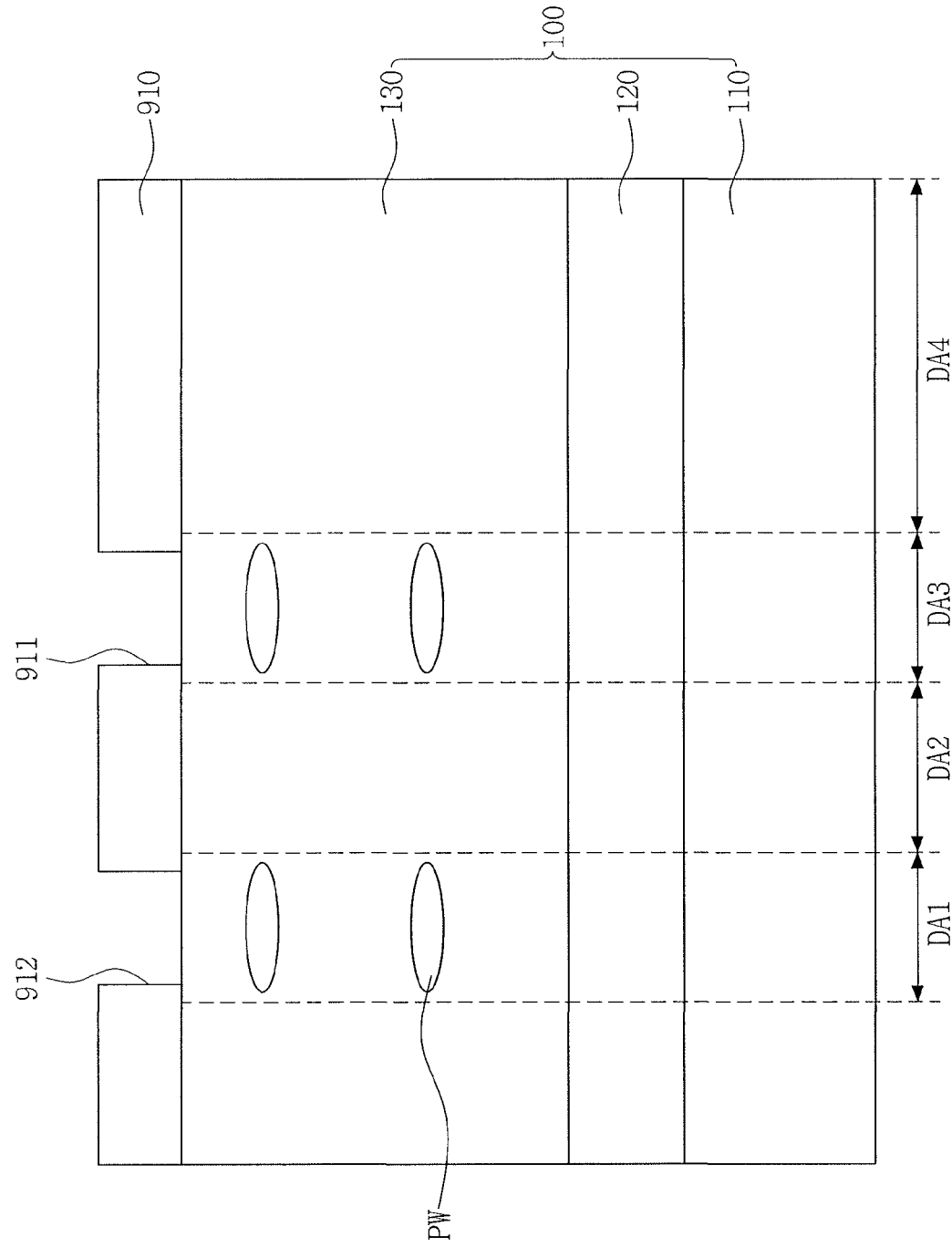

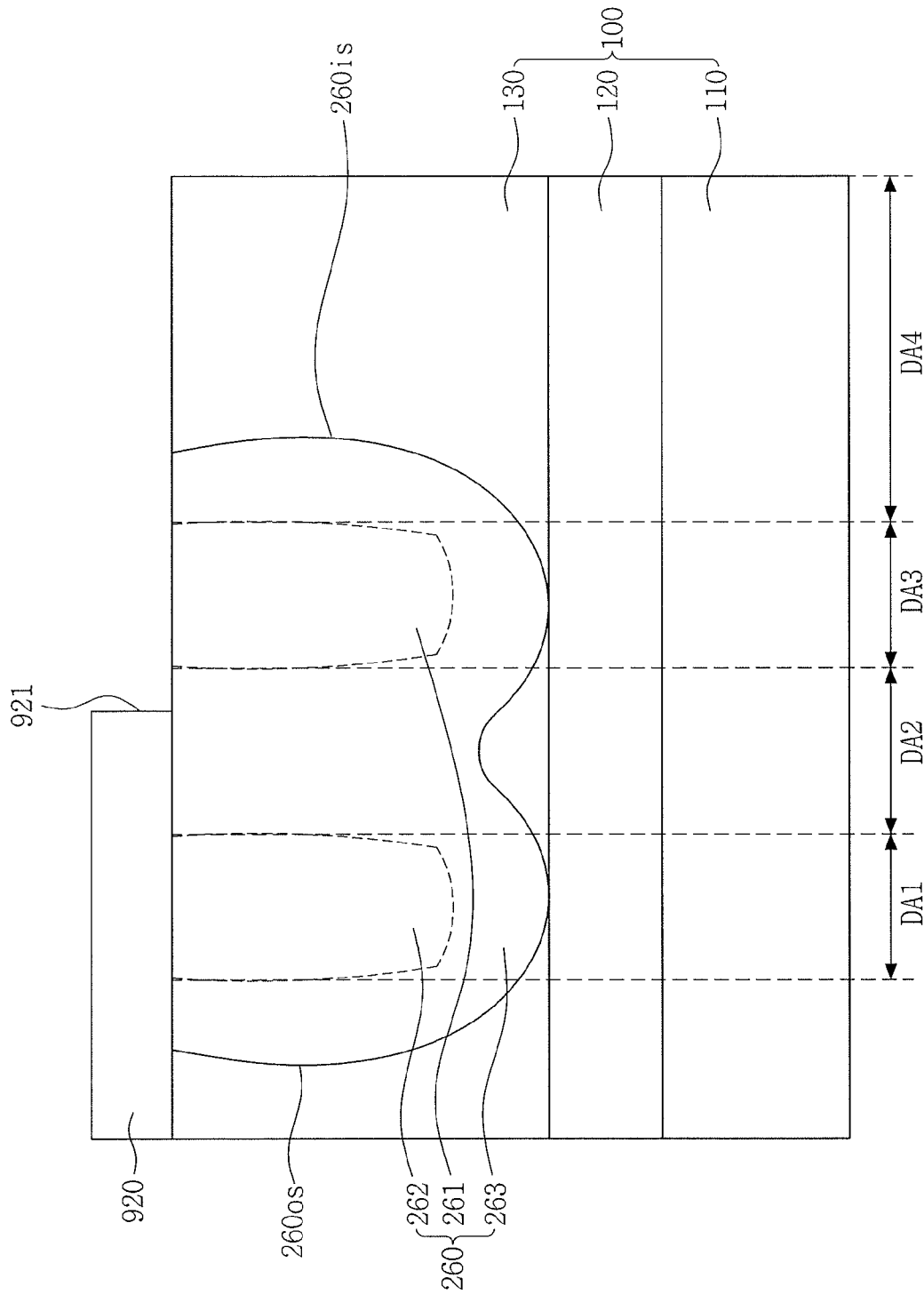

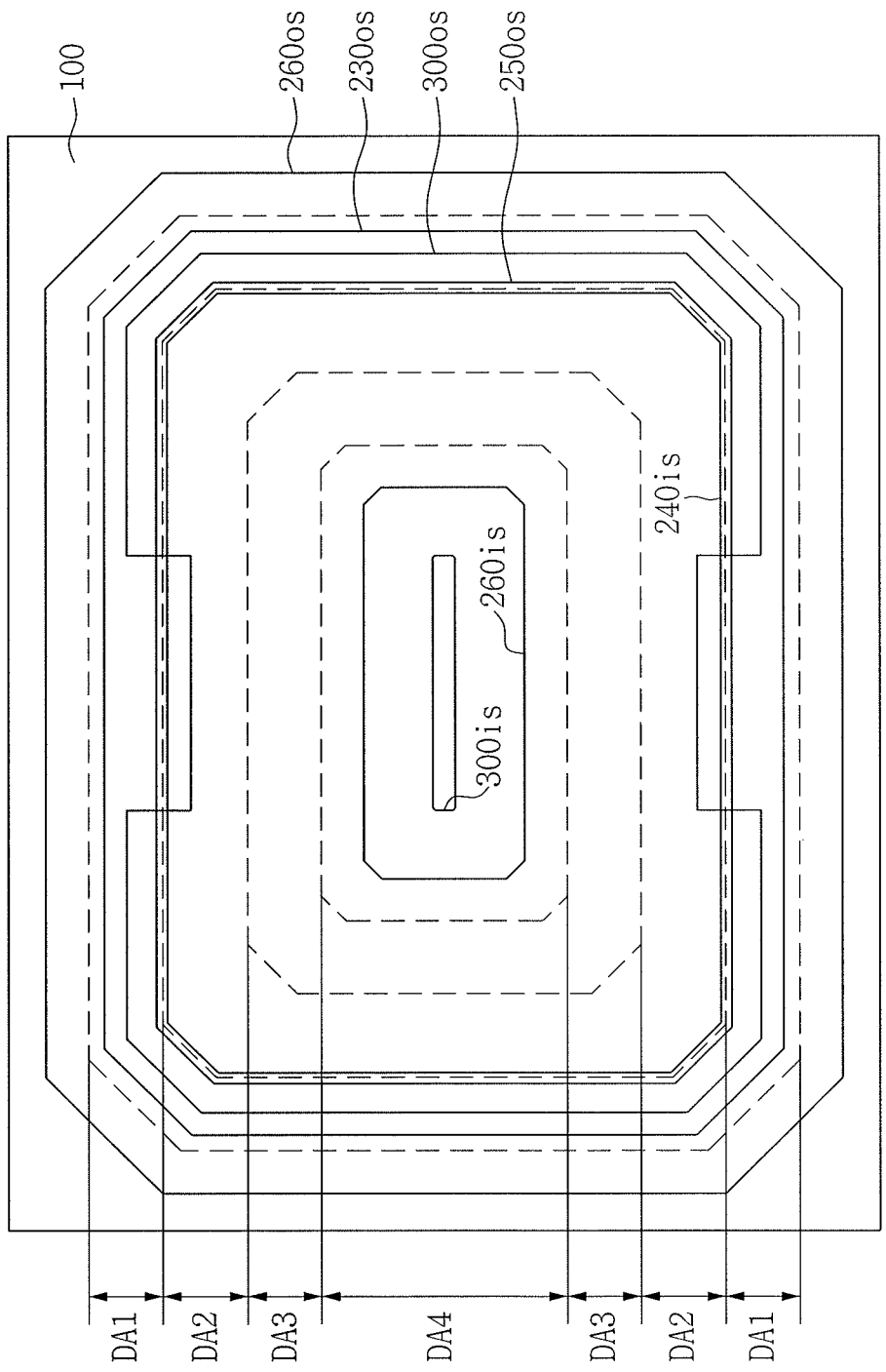

METHOD OF FORMING SEMICONDUCTOR DEVICE

CROSS-REFERENCE TO RELATED APPLICATIONS

This is a divisional application based on pending application Ser. No. 13/908,300, filed Jun. 3, 2013, the entire contents of which is hereby incorporated by reference.

This application claims priority under 35 U.S.C. §119 to Korean Patent Application No. 10-2012-0124424 filed on Nov. 5, 2012, in the Korean Intellectual Property Office, and entitled: "SEMICONDUCTOR DEVICE AND METHOD OF FORMING THE SAME," the entire disclosure of which is hereby incorporated by reference in its entirety.

BACKGROUND

Embodiments relate to a semiconductor device and a method of forming the same.

SUMMARY

Embodiments are directed to a semiconductor device that may include a semiconductor substrate, a first conductive type well in the semiconductor substrate, and a second conductive type drift region in the semiconductor substrate, the drift region including a first drift doping region and a second drift doping region, and the second drift doping region vertically overlap the well. The semiconductor device may further include a first conductive type body region in the well, the body region may be in contact with a side of the first drift doping region. The first drift doping region may include a first conductive type dopant and a second conductive type dopant, and the second drift doping region may include the first conductive type dopant and the second conductive type dopant. An average density of the first conductive type dopant in the first drift doping region may be less than an average density of the first conductive type dopant in the second drift doping region.

An average density of the second conductive type dopant in the first drift doping region may be substantially equal to an average density of the second conductive type dopant in the second drift doping region.

The drift region may further include a third drift doping region that does not vertically overlap the well, the third drift doping region may include the second conductive type dopant, and an average density of the second conductive type dopant in the third drift doping region may be substantially equal to the average density of the second conductive type dopant in the first drift doping region.

The drift region may further include a fourth drift doping region between the second drift doping region and the third drift doping region, the fourth drift doping region may include the first conductive type dopant and the second conductive type dopant, and a boundary between the third drift doping region and the fourth drift doping region may be aligned with an extension line from a side of the well.

An average density of the first conductive type dopant in the fourth drift doping region may be less than the average density of the first conductive type dopant in the second drift doping region, and an average density of the second conductive type dopant in the fourth drift doping region may be substantially equal to the average density of the second conductive type dopant in the second drift doping region.

The well may include a well outer region in contact with a bottom of the first drift doping region and a first well inner region in contact with a bottom of the second drift doping region. The well outer region may include the first conductive type dopant, the first well inner region may include the first conductive type dopant, and an average density of the first conductive type dopant in the well outer region may be less than an average density of the first conductive type dopant in the first well inner region.

The average density of the first conductive type dopant in the first well inner region may be substantially equal to the average density of the first conductive type dopant in the second drift doping region.

The well may further include a second well inner region in contact with a bottom of the body region, the second well inner region may include the first conductive type dopant, and an average density of the first conductive type dopant in the second well inner region may be substantially equal to the average density of the first conductive type dopant in the first well inner region.

The well outer region may surround the first well inner region and the second well inner region.

Embodiments are also directed to a semiconductor device that may include a semiconductor substrate, a first conductive type body region in the semiconductor substrate, a second conductive type first source/drain region in the semiconductor substrate, the first source/drain region being spaced apart from the body region, a second conductive type second source/drain region in the body region, a shallow trench isolation between the body region and the first source/drain region, the shallow trench isolation being spaced apart from the body region, a second conductive type drift region surrounding the first source/drain region and the shallow trench isolation, the drift region including first and second drift inner regions adjacent to the shallow trench isolation. The second drift inner region may be below the shallow trench isolation, and the first drift inner region may be between the body region and the second drift inner region. The semiconductor device may further include a first conductive type well in contact with a bottom of the body region and a bottom of the drift region, the well vertically overlapping the first and second drift inner regions, and a gate pattern on the semiconductor substrate, the gate pattern being between the first source/drain region and the second source/drain region. The first drift inner region may include a first conductive type dopant and a second conductive type dopant, the second drift inner region may include the first conductive type dopant and the second conductive type dopant, and a difference between an average density of the first conductive type dopant and an average density of the second conductive type dopant in the first drift inner region may be greater than a difference between an average density of the first conductive type dopant and an average density of the second conductive type dopant in the second drift inner region.

The drift region may further include a first drift outer region between the first drift inner region, the body region, and the well, the first drift outer region may include the first conductive type dopant and the second conductive type dopant, and a difference between an average density of the first conductive type dopant and an average density of the second conductive type dopant in the first drift outer region may be less than the difference between the average density of the first conductive type dopant and the average density of the second conductive type dopant in the first drift inner region.

The average density of the first conductive type dopant in the first drift outer region may be substantially equal to the average density of the first conductive type dopant in the first drift inner region.

The drift region may further include a second drift outer region between the second drift inner region and the well, the second drift outer region may include the first conductive type dopant and the second conductive type dopant, and a difference between an average density of the first conductive type dopant and an average density of the second conductive type dopant in the second drift outer region may be less than the difference between the average density of the first conductive type dopant and the average density of the second conductive type dopant in the first drift outer region.

The average density of the second conductive type dopant in the second drift outer region may be substantially equal to the average density of the second conductive type dopant in the first drift outer region.

The average density of the first conductive type dopant in the second drift outer region may be substantially equal to the average density of the first conductive type dopant in the second drift inner region.

Embodiments are also directed to a method of forming a semiconductor device. The method may include providing a semiconductor substrate including a first doping region, a second doping region, a third doping region, and a fourth doping region, the second doping region being between the first doping region and the third doping region, and the third doping region being between the second doping region and the fourth doping region, forming a preliminary well region by injecting a first conductive type dopant into the first doping region and the third doping region, and forming a well including a first well inner region, a second well inner region, and a well outer region by diffusing the first conductive type dopant, the first well inner region may be in the first doping region, the second well inner region may be in the third doping region, and the well outer region may surround the first well inner region and the second well inner region. The method may further include forming a drift region by doping a second conductive type dopant into the second to fourth doping regions. A lowest level of the drift region may be above a lowest level of the well. The method may further include forming a body region by doping a first conductive type dopant into the first doping region. The body region may be in contact with a side of the drift region.

Forming the well may include doping the second doping region between the first well inner region and the second well inner region with the first conductive type dopant.

Forming the drift region may include injecting the second conductive type dopant into the second to fourth doping regions and diffusing the second conductive type dopant to form a drift inner region and a drift outer region, and the drift outer region may surround the drift inner region.

Forming the body region may include forming the body region spaced apart from the drift inner region, and the body region may partially overlap the drift outer region.

The method may further include forming a shallow trench isolation in the drift region, the shallow trench isolation being spaced apart from the drift outer region.

The method may further include forming an oxide layer by oxidizing a surface of the semiconductor substrate, forming a gate layer on the oxide layer, and forming an oxide pattern and a gate pattern by patterning the oxide layer and the gate layer.

Forming the oxide layer may include oxidizing the surface of the semiconductor substrate at a temperature that is less than temperatures for forming the well and the drift region.

Providing the semiconductor substrate may include providing a base substrate, forming a buried layer by doping a second conductive type dopant in the base substrate, and forming an epitaxial layer including the second conductive type dopant on the buried layer.

The well may be formed such that the well outer region is in contact with the buried layer.

Embodiments are also directed to a method of forming a semiconductor device. The method may include forming a first conductive type well including a first well inner region, a second well inner region, and a well outer region in a semiconductor substrate, the well outer region being between the first well inner region and the second well inner region, the first well inner region including a first conductive type dopant, the second well inner region including the first conductive type dopant, and the well outer region including the first conductive type dopant. An average density of the first conductive type dopant in the well outer region may be less than an average density of the first conductive type dopant in the first well inner region. The method may further include forming a second conductive type drift region including a first drift doping region and a second drift doping region in the semiconductor substrate, the first drift doping region being in contact with the well outer region, the second drift doping region being in contact with the first well inner region, the first drift doping region including the first conductive type dopant and the second conductive type dopant, the second drift doping region including the first conductive type dopant and the second conductive type dopant. An average density of the first conductive type dopant in the second drift doping region may be substantially equal to the average density of the first conductive type dopant in the first well inner region, and an average density of the first conductive type dopant in the first drift doping region may be lower than the average density of the first conductive type dopant in the second drift doping region. The method may further include forming a first conductive type body region including the first conductive type dopant in the well. The body region may be in contact with a side of the first drift region.

Embodiments are also directed to a semiconductor device that may include a semiconductor substrate, a first conductive type body region in the semiconductor substrate, a second conductive type first source/drain region in the semiconductor substrate, the first source/drain region being spaced apart from the body region, a second conductive type second source/drain region in the body region, a shallow trench isolation between the body region and the first source/drain region, the shallow trench isolation being spaced apart from the body region, and a second conductive type drift region surrounding the first source/drain region and the shallow trench isolation, the drift region including a lower drift region, a first upper drift region, a second upper drift region, and a third upper drift region. The lower drift region may be between the body region and the first upper drift region and extends below the first, second, and third upper drift regions, the first upper drift region may be between the body region and the second upper drift region, the second upper drift region may be between the first upper drift region and the third upper drift region, and the third upper drift region may be between the second upper drift region and the first source/drain region, the lower drift region and the first to third upper drift regions each may include a first conductive type dopant and a second conductive type dopant, an average density of the first conductive type dopant in the second upper drift region may be greater than an average density of the first conductive type dopant in the first upper drift region and an average density of the first conductive type dopant in the third upper drift region.

A density of the second conductive type dopant in the first to third upper drift regions may be substantially uniform.

The drift region may further include a fourth upper drift region that includes the second conductive type dopant and does not include the first conductive type dopant, and the fourth upper drift region may be between the third upper drift region and the first source/drain region.

The density of the second conductive type dopant in the first to fourth upper drift regions may be substantially uniform, and an average density of the second conductive type dopant in the lower drift region may be less than an average density of the second conductive type dopant in each of the first to fourth upper drift regions.

The drift region may further include a fourth upper drift region that includes the second conductive type dopant and does not include the first conductive type dopant, the fourth upper drift region may be between the third upper drift region and the first source/drain region, and the first upper drift region may directly contact the second upper drift region, the second upper drift region may directly contact the third upper drift region, and the third upper drift region may directly contact the fourth upper drift region.

BRIEF DESCRIPTION OF THE DRAWINGS

Features will become apparent to those of skill in the art by describing in detail exemplary embodiments with reference to the attached drawings in which:

FIG. 1A illustrates a layout view of a semiconductor device in accordance with an embodiment;

FIG. 1C illustrates an enlarged cross-sectional view of the P region in FIG. 1B;

FIG. 5 illustrates a cross-sectional view of a semiconductor device in accordance with another embodiment;

FIGS. 6A, 7A, 8A, 9A, 10A, 11A, 12A, 13A, 14A, 15A, 16A, 17A, 18A, 19A, and 20A illustrate layout views of sequential stages in a method of forming a semiconductor device in accordance with an embodiment;

FIGS. 6B, 7B, 8B, 9B, 10B, 11B, 12B, 13B, 14B, 15B, 16B, 17B, 18B, 19B, and 20B illustrate cross-sectional views of sequential stages in a method of forming a semiconductor device in accordance with an embodiment;

DETAILED DESCRIPTION

Figure 1B:
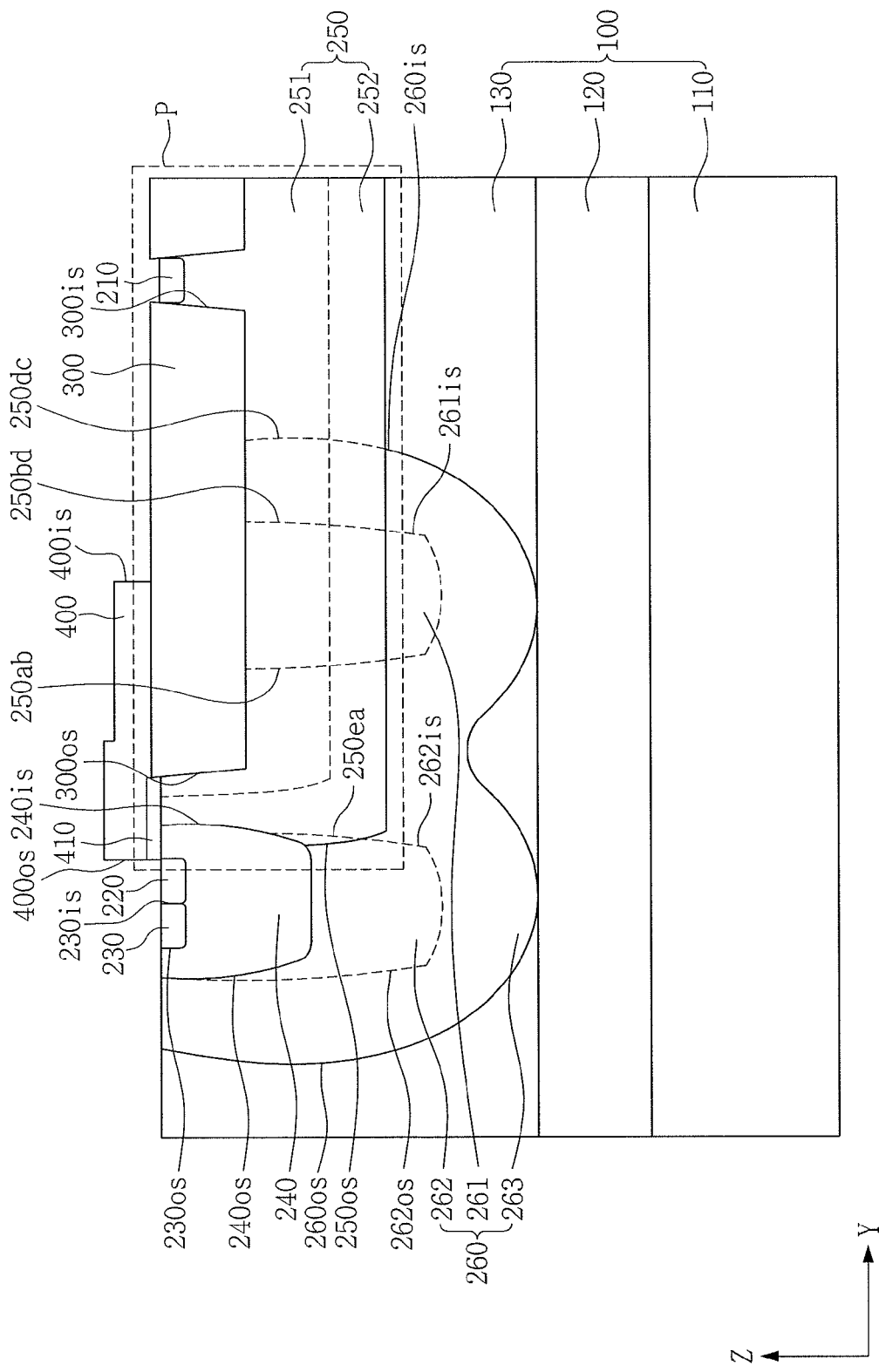
FIG. 1B illustrates a cross-sectional view taken along line I-I' in FIG. 1A.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the embodiments. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments is not intended to limit the scope of the invention. The articles "a," "an," and "the" are singular in that they have a single referent, however the use of the singular form in the present disclosure should not preclude the presence of more than one referent. In other words, elements referred to in the singular may number one or more, unless the context clearly indicates otherwise. It will be further understood that the terms "comprises," "comprising," "includes," and/or "including," when used herein, specify the presence of the stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant of density at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the embodiments.

Unless otherwise defined, all terms (including technical and scientific terms) used herein are to be interpreted as is customary in the art to which the embodiments belong. It will be further understood that terms in common usage should also be interpreted as is customary in the relevant art and not in an idealized or overly formal sense unless expressly so defined herein.

FIG. 1A illustrates a layout view of a semiconductor device in accordance with an embodiment. FIG. 1B illustrates a cross-sectional view taken along line I-I' in FIG. 1A. FIG. 1C illustrates an enlarged cross-sectional view of the P region in FIG. 1B.

Referring to FIGS. 1A to 1C, a semiconductor device in accordance with an embodiment may include a semiconductor substrate 100, a first source/drain region 210, a second source/drain region 220, a body region 240, a drift region 250, a first well 260, a shallow trench isolation 300, and a gate pattern 400.

The semiconductor substrate 100 may include a base substrate 110, a buried layer 120, and an epitaxial layer 130. The epitaxial layer 130 may be located near to the buried layer 120.

The base substrate 110 may include a silicon semiconductor substrate. The base substrate 110 may include a first conductive type dopant. For example, the base substrate 110 may include a p-type dopant.

The buried layer 120 may be located in the base substrate 110. The buried layer 120 may be located near to a top surface of the base substrate 110. The buried layer 120 may be a different conductive type from the base substrate 110. The buried layer 120 may include a second conductive type dopant. For example, the buried layer 120 may include an n-type dopant.

The epitaxial layer 130 may be located on the buried layer 120. The epitaxial layer 130 may be in direct contact with a top surface of the buried layer 120. The epitaxial layer 130 may be the same conductive type as the buried layer 120. The epitaxial layer 130 may include the second conductive type dopant. For example, the epitaxial layer 130 may include an n-type dopant.

The average density of the second conductive type dopant in the epitaxial layer 130 may be lower than that in the buried layer 120. For example, the average density of the second conductive type dopant in the buried layer 120 may be about $1 \times 10^{16}$ to about $5 \times 10^{17}$ atoms/cm$^2$. The average density may refer to a density per unit region in a corresponding region.

The first source/drain region 210 may be located in the semiconductor substrate 100. The first source/drain region 210 may be located in the epitaxial layer 130. The lowest level of the first source/drain region 210 may be higher than (i.e., above) a level of the top surface of the buried layer 120. The first source/drain region 210 may be located near to a top surface of the epitaxial layer 130. For example, the first source/drain region 210 may be a bar shape extending along the top surface of the epitaxial layer 130.

The first source/drain region 210 may be the same conductive type as the epitaxial layer 130. The first source/drain region 210 may include the second conductive type dopant. For example, the first source/drain region 210 may include an n-type dopant.

The average density of the second conductive type dopant in the first source/drain region 210 may be higher than that in the epitaxial layer 130.

The second source/drain region 220 may be located in the semiconductor substrate 100. The second source/drain region 220 may be located in the epitaxial layer 130. The lowest level of the second source/drain region 220 may be higher than the level of the top surface of the buried layer 120. The second source/drain region 220 may be located near to the top surface of the epitaxial layer 130. The lowest level of the second source/drain region 220 may be substantially the same as the lowest level of the first source/drain region 210.

The second source/drain region 220 may be spaced apart from the first source/drain region 210. The shape of the second source/drain region 220 may be substantially the same as that of the first source/drain region 210. For example, the second source/drain region 220 may be a bar shape extending along the top surface of the epitaxial layer 130. The second source/drain region 220 may be parallel to the first source/drain region 210.

In the semiconductor device in accordance with the embodiment, the second source/drain region 220 may be located at both sides of the first source/drain region 210. That is, the first source/drain region 210 may be located between two second source/drain regions 220 in the semiconductor device in accordance with the embodiment. However, the semiconductor device in accordance with the embodiment may include one second source/drain region 220 parallel to the first source/drain region 210.

The second source/drain region 220 may be the same conductive type as the epitaxial layer 130. The second source/drain region 220 may be the same conductive type as the first source/drain region 210. The second source/drain region 220 may include the second conductive type dopant. For example, the second source/drain region 220 may include an n-type dopant.

The average density of the second conductive type dopant in the second source/drain region 220 may be higher than that in the epitaxial layer 130. The average density of the second conductive type dopant in the second source/drain region 220 may be substantially the same as that in the first source/drain region 210.

The body region 240 may be located in the semiconductor substrate 100. The body region 240 may be located in the epitaxial layer 130. The lowest level of the body region 240 may be lower than (i.e., below or closer to the base substrate 110) the lowest level of the second source/drain region 220. The lowest level of the body region 240 may be higher than (i.e., above or farther from the base substrate 110) the level of the top surface of the buried layer 120. The body region 240 may be located near to the top surface of the epitaxial layer 130. The body region 240 may surround a side and bottom of the second source/drain region 220. The body region 240 may be in direct contact with the side and bottom of the second source/drain region 220.

The body region 240 may be spaced apart from the first source/drain region 210. The body region 240 may surround a side of the first source/drain region 210. An inner side 240*is* of the body region 240 may be a shape of a closed curve surrounding the side of the first source/drain region 210. An outer side 240*os* of the body region 240 may have substantially the same shape as the inner side 240*is* of the body region 240. For example, the body region 240 may have a shape of an octagonal ring surrounding the side of the first source/drain region 210.

The body region 240 may be a different conductive type from the second source/drain region 220. The body region 240 may be the same conductive type as the base substrate 110. The body region 240 may include the first conductive type dopant. For example, the body region 240 may include a p-type dopant.

The average density of the first conductive type dopant in the body region 240 may be lower than the average density of the second conductive type dopant in the second source/drain region 220. The average density of the first conductive type dopant in the body region 240 may be higher than the average density of the second conductive type dopant in the epitaxial layer 130. For example, the average density of the first conductive type dopant in the body region 240 may be about $5 \times 10^{16}$ to about $8 \times 10^{17}$ atoms/cm$^2$.

The semiconductor device in accordance with the embodiment may further include a body contact region 230 located in the body region 240. The body contact region 230 may be located near to a top surface of the body region 240. The lowest level of the body contact region 230 may be higher than the lowest level of the body region 240. The lowest level of the body contact region 230 may be substantially the same as the lowest level of the second source/drain region 220.

The body contact region 230 may be located between the second source/drain region 220 and the outer side 240*os* of the body region 240. An inner side 230*is* of the body contact region 230 may be in direct contact with the second source/drain region 220. An outer side 230*os* of the body contact region 230 may be spaced apart from the outer side 240*os* of the body region 240. The body contact region 230 may have substantially the same shape as the body region 240. For example, the body contact region 230 may have a shape of an octagonal ring surrounding the side of the first source/drain region 210.

The body contact region 230 may be the same conductive type as the body region 240. The body contact region 230 may include the first conductive type dopant. For example, the body contact region 230 may include a p-type dopant.

The average density of the first conductive type dopant in the body contact region 230 may be higher than that in the body region 240. The average density of the first conductive type dopant in the body contact region 230 may be substantially the same as that of the second conductive type dopant in the second source/drain region 220.

The drift region 250 may be located in the semiconductor substrate 100. The drift region 250 may be located in the epitaxial layer 130. The lowest level of the drift region 250 may be lower than the lowest level of the first source/drain region 210. The lowest level of the drift region 250 may be higher than the top surface of the buried layer 120. The drift region 250 may be located near to the top of the epitaxial layer 130. The drift region 250 may surround the side and bottom of the first source/drain region 210. The drift region 250 may be in direct contact with the side and bottom of the first source/drain region 210.

The drift region 250 may be in contact with the body region 240. An outer side 250*os* of the drift region 250 may be located between the inner side 240*is* and the outer side 240*os* of the body region 240. The drift region 250 may partially vertically overlap the body region 240. The body region 240 may define the drift region 250. The lowest level of the drift region 250 may be lower than that of the body region 240. The outer side 250*os* of the drift region 250 may be in direct contact with a bottom of the body region 240.

The drift region 250 may be the same conductive type as the first source/drain region 210. The drift region 250 may be the same conductive type as the epitaxial layer 130. The drift region 250 may include the second conductive type dopant. For example, the drift region 250 may include an n-type dopant.

The drift region 250 may include a drift inner region 251 and a drift outer region 252. The drift inner region 251 may be located close to the first source/drain region 210. The drift outer region 252 may surround a side and bottom of the drift inner region 251. The drift inner region 251 may be located between the first source/drain region 210 and the drift outer region 252. The drift inner region 251 may be spaced apart from the body region 240. The inner side 240*is* of the body region 240 may be located between the outer side 250*os* of the drift region 250 and the side of the drift inner region 251. The body region 240 may partially vertically overlap the drift outer region 252.

The drift inner region 251 may include a first drift inner region 251*a*, a second drift inner region 251*b*, a third drift inner region 251*c*, and a fourth drift inner region 251*d*. The first drift inner region 251*a* may be located near to the body region 240. The second drift inner region 251*b* may be located near to the first drift inner region 251*a*. The first drift inner region 251*a* may be located between the body region 240 and the second drift inner region 251*b*. The third drift inner region 251*c* may be located under the first source/drain region 210. The third drift inner region 251*c* may be in direct contact with the bottom of the first source/drain region 210. The fourth drift inner region 251*d* may be located between the second drift inner region 251*b* and the fourth drift inner region 251*d*.

The average density of the second conductive type dopant in the first drift inner region 251*a* may be lower than that in the epitaxial layer 130. The average density of the second conductive type dopant in the first drift inner region 251*a* may be lower than that in the first source/drain region 210. For example, the average density of the second conductive type dopant in the first drift inner region 251*a* may be about $5 \times 10^{15}$ to about $7 \times 10^{16}$ atom s/cm$^2$.

The first drift inner region 251*a* may include the first conductive type dopant. The first drift inner region 251*a* may include both of the first conductive type dopant and the second conductive type dopant. The average density of the first conductive type dopant in the first drift inner region 251*a* may be lower than that of the second conductive type dopant in the first drift inner region 251*a*.

The average density of the first conductive type dopant in the first drift inner region 251*a* may be lower than that in the body region 240. For example, average density of the first conductive type dopant in the first drift inner region 251*a* may be about $1 \times 10^{15}$ to about $5 \times 10^{16}$ atoms/cm$^2$.

The average density of the second conductive type dopant in the second drift inner region 251*b* may be substantially the same as that in the first drift inner region 251*a*.

The second drift inner region 251*b* may include the first conductive type dopant. The second drift inner region 251*b* may include both of the first conductive type dopant and the second conductive type dopant. The average density of the first conductive type dopant in the second drift inner region 251*b* may be lower than that of the second conductive type dopant in the second drift inner region 251*b*.

The average density of the first conductive type dopant in the second drift inner region 251b may be higher than that in the first drift inner region 251a. The average density of the first conductive type dopant in the second drift inner region 251b may be lower than that in the body region 240. For example, the average density of the first conductive type dopant in the second drift inner region 251b may be $1\times10^{16}$ to $5\times10^{17}$ atoms/cm$^2$.

The difference between the average density of the first conductive type dopant and the average density of the second conductive type dopant in the second drift inner region 251b may be smaller than the difference between the average density of the first conductive type dopant and the average density of the second conductive type dopant in the first drift inner region 251a.

The average density of the second conductive type dopant in the third drift inner region 251c may be substantially the same as that in the second drift inner region 251b.

The third drift inner region 251c may not include the first conductive type dopant. The third drift inner region 251c may only include the second conductive type dopant.

The average density of the second conductive type dopant in the fourth drift inner region 251d may be substantially the same as that in the third drift inner region 251c.

The fourth drift inner region 251d may include the first conductive type dopant. The fourth drift inner region 251d may include both of the first conductive type dopant and the second conductive type dopant. The average density of the first conductive type dopant in the fourth drift inner region 251d may be lower than that of the second conductive type dopant in the fourth drift inner region 251d.

The average density of the first conductive type dopant in the fourth drift inner region 251d may be lower than that in the second drift inner region 251b. The average density of the first conductive type dopant in the fourth drift inner region 251d may be substantially the same as that in the first drift inner region 251a.

The difference between the average density of the first conductive type dopant and the average density of the second conductive type dopant in the fourth drift inner region 251d may be smaller than the difference between the average density of the first conductive type dopant and the average density of the second conductive type dopant in the second drift inner region 251b. The difference between the average density of the first conductive type dopant and the average density of the second conductive type dopant in the fourth drift inner region 251d may be substantially the same as the difference between the average density of the first conductive type dopant and the average density of second conductive type dopant in the first drift inner region 251a.

The drift outer region 252 may include a first drift outer region 252a, a second drift outer region 252b, a third drift outer region 252c, a fourth drift outer region 252d, and the drift side region 252e. The first drift outer region 252a may be located close to the body region 240. The first drift outer region 252a may be located between the body region 240 and the first drift inner region 251a. The second drift outer region 252b may be near to the first drift outer region 252a. The second drift outer region 252b may be located below the second drift inner region 251b. The first drift outer region 252a may be located between the body region 240 and the second drift outer region 252b. A boundary 252ab between the first drift outer region 252a and the second drift outer region 252b may be substantially the same as (i.e., may be aligned along the z-direction with) an extension line of a boundary 251ab between the first drift inner region 251a and the second drift inner region 251b. The third drift outer region 252c may be located under the first source/drain region 210.

The third drift outer region 252c may be located below the third drift inner region 251c. The third drift inner region 251c may be located between the first source/drain region 210 and the third drift outer region 252c. The fourth drift outer region 252d may be located between the second drift outer region 252b and the third drift outer region 252c. The fourth drift outer region 252d may be located below the fourth drift inner region 251d. A boundary 252dc between the third drift outer region 252c and the fourth drift outer region 252d may be substantially the same as (i.e., may be aligned along the z-direction with) an extension line of a boundary 251dc between the third drift inner region 251c and the fourth drift inner region 251d. A boundary 252bd between the second drift outer region 252b and the fourth drift outer region 252d may be substantially the same as (i.e., may be aligned along the z-direction with) an extension line of a boundary 251bd between the second drift inner region 251b and the fourth drift inner region 251d. The drift side region 252e may be located near to the bottom of the body region 240. The drift side region 252e may be located near to the outer side 250os of the drift region 250. The drift side region 252e may be located between the outer side 250os of the drift region 250 and the first drift outer region 252a. The drift side region 252e may be in direct contact with the inner side 240is of the body region 240. The drift side region 252e may be surrounded by the inner side 240is of the body region 240, the outer side 250os of the drift region 250, and the first drift outer region 252a.

The average density of the second conductive type dopant in the drift side region 252e may be higher than that in the epitaxial layer 130. The average density of the second conductive type dopant in the drift side region 252e may be lower than that in the first drift inner region 251a.

The drift side region 252e may include the first conductive type dopant. The drift side region 252e may include both of the first conductive type dopant and the second conductive type dopant. The average density of the first conductive type dopant in the drift side region 252e may be lower than that of the second conductive type dopant in the drift side region 252e.

The average density of the first conductive type dopant in the drift side region 252e may be higher than that in the first drift inner region 251a. The average density of the first conductive type dopant in the drift side region 252e may be substantially the same as that in the second drift inner region 251b.

The difference between the average density of the first conductive type dopant and the average density of the second conductive type in the drift side region 252e may be smaller than the difference between the average density of the first conductive type dopant and the average density of the second conductive type in the first drift inner region 251a. The difference between the average density of the first conductive type dopant and the average density of the second conductive type in the drift side region 252e may be smaller than the difference between the average density of the first conductive type dopant and the average density of the second conductive type in the second drift inner region 251b.

The average density of the second conductive type dopant in the first drift outer region 252a may be substantially the same as that in the drift side region 252e. The average density of the second conductive type dopant in the first drift outer region 252a may be lower than that in the first drift inner region 251a.

The first drift outer region 252a may include the first conductive type dopant. The first drift outer region 252a may include both of the first conductive type dopant and the second conductive type dopant. The average density of the first conductive type dopant in the first drift outer region 252a may be lower than that of the second conductive type dopant in the first drift outer region 252a.

The average density of the first conductive type dopant in the first drift outer region 252a may be lower than that in the drift side region 252e. The average density of the first conductive type dopant in the first drift outer region 252a may be substantially the same as that in the first drift inner region 251a.

The difference between the average density of the first conductive type dopant and the average density of second conductive type dopant in the first drift outer region 252a may be greater than the difference between the average density of the first conductive type dopant and the average density of second conductive type dopant in the drift side region 252e. The difference between the average density of the first conductive type dopant and the average density of second conductive type dopant in the first drift outer region 252a may be smaller than the difference between the average density of the first conductive type dopant and the average density of second conductive type dopant in the first drift inner region 251a.

The first drift inner region 251a, the first drift outer region 252a, and the drift side region 252e may constitute a first drift doping region 250a. The first drift doping region 250a may be in direct contact with the inner side 240is of the body region 240. The first drift doping region 250a may partially vertically overlap the body region 240.

The average density of the first conductive type dopant in the first drift doping region 250a may be higher than that in the first drift inner region 251a. The average density of the first conductive type dopant in the first drift doping region 250a may be lower than that in the drift side region 252e.

The average density of the second conductive type dopant in the first drift doping region 250a may be lower than that in the first drift inner region 251a. The average density of the second conductive type dopant in the first drift doping region 250a may be higher than that in the first drift outer region 252a.

The difference between the average density of the first conductive type dopant and the average density of the second conductive type dopant in the first drift doping region 250a may be smaller than the difference between the average density of the first conductive type dopant and the average density of the second conductive type dopant in the first drift inner region 251a. The difference between the average density of the first conductive type dopant and the average density of the second conductive type dopant in the first drift doping region 250a may be greater than the difference between the average density of the first conductive type dopant and the average density of the second conductive type dopant in the first drift outer region 252a.

The average density of the second conductive type dopant in the second drift outer region 252b may be substantially the same as that in the first drift outer region 252a. The average density of the second conductive type dopant in the second drift outer region 252b may be lower than that in the second drift inner region 251b.

The second drift outer region 252b may include the first conductive type dopant. The second drift outer region 252b may include both of the first conductive type dopant and the second conductive type dopant. The average density of the first conductive type dopant in the second drift outer region 252b may be lower than that of the second conductive type dopant in the second drift outer region 252b.

The average density of the first conductive type dopant in the second drift outer region 252b may be higher than that in the first drift outer region 252a. The average density of the first conductive type dopant in the second drift outer region 252b may be substantially the same as that in the second drift inner region 251b.

The difference between the average density of the first conductive type dopant and the average density of the second conductive type dopant in the second drift outer region 252b may be smaller than the difference between the average density of the first conductive type dopant and the average density of the second conductive type dopant in the first drift outer region 252a. The difference between the average density of the first conductive type dopant and the average density of the second conductive type dopant in the second drift outer region 252b may be smaller than the difference between the average density of the first conductive type dopant and the average density of the second conductive type dopant in the second drift inner region 251b.

The second drift inner region 251b and the second drift outer region 252b may constitute a second drift doping region 250b. The second drift doping region 250b may be located close to the first drift doping region 250a. The first drift doping region 250a may be located between the first body region 240 and the second drift doping region 250b.

The average density of the first conductive type dopant in the second drift doping region 250b may be substantially the same as that in the second drift inner region 251b. The average density of the first conductive type dopant in the second drift doping region 250b may be higher than that in the first drift doping region 250a.

The average density of second conductive type dopant in the second drift doping region 250b may be lower than that in the second drift inner region 251b. The average density of second conductive type dopant in the second drift doping region 250b may be higher than that in the second drift outer region 252b. The average density of second conductive type dopant in the second drift doping region 250b may be substantially the same as that in the first drift doping region 250a.

The difference between the average density of the first conductive type dopant and the average density of the second conductive type dopant in the second drift doping region 250b may be smaller than the difference between the average density of the first conductive type dopant and the average density of the second conductive type dopant in the first drift doping region 250a.

In the semiconductor device in accordance with the embodiment, the difference between the average density of the first conductive type dopant and the average density of the second conductive type dopant in the first drift doping region 250a may be greater than the difference between the average density of the first conductive type dopant and the average density of the second conductive type dopant in the second drift doping region 250b. That is, compensation for the second conductive type dopant by the first conductive type dopant in the first drift doping region 250a may be smaller than that in the second drift doping region 250b in the semiconductor device in accordance with the embodiment. As a result, the resistance of the first drift doping region 250a may be lower than that of the second drift doping region 250b in the semiconductor device in accordance with the embodiment. Accordingly, the turn-on resistance may decrease in the semiconductor device in accordance with the embodiment.

The average density of the second conductive type dopant in the third drift outer region 252c may be substantially the same as that in the second drift outer region 252b. The average density of the second conductive type dopant in the third drift outer region 252c may be lower than that in the third drift inner region 251c. The third drift outer region 252c may not include the first conductive type dopant. The third drift outer region 252c may include only the second conductive type dopant.

The third drift inner region 251c and the third drift outer region 252c may constitute the third drift doping region 250c. The third drift doping region 250c may be located below the first source/drain region 210. The third drift doping region 250c may be in direct contact with the bottom of the first source/drain region 210.

The average density of the second conductive type dopant in the third drift doping region 250c may be lower than that in the third drift inner region 251c. The average density of the second conductive type dopant in the third drift doping region 250c may be higher than that in the third drift outer region 252c. The average density of the second conductive type dopant in the third drift doping region 250c may be substantially the same as that in the second drift doping region 250b.

The average density of the second conductive type dopant in the fourth drift outer region 252d may be substantially the same as that in the third drift outer region 252c. The average density of the second conductive type dopant in the fourth drift outer region 252d may be lower than that in the fourth drift inner region 251d.

The fourth drift outer region 252d may include the first conductive type dopant. The fourth drift outer region 252d may include both of the first conductive type dopant and the second conductive type dopant. The average density of the first conductive type dopant in the fourth drift outer region 252d may be lower than that of the second conductive type dopant in the fourth drift outer region 252d.

The average density of the first conductive type dopant in the fourth drift outer region 252d may be lower than that in the second drift outer region 252b. The average density of the first conductive type dopant in the fourth drift outer region 252d may be substantially the same as that in the fourth drift inner region 251d.

The difference between the average density of the first conductive type dopant and the average density of the second conductive type dopant in the fourth drift outer region 252d may be greater than the difference between the average density of the first conductive type dopant and the average density of the second conductive type dopant in the second drift outer region 252b. The difference between the average density of the first conductive type dopant and the average density of the second conductive type dopant in the fourth drift outer region 252d may be substantially the same as the difference between the average density of the first conductive type dopant and the average density of the second conductive type dopant in the first drift outer region 252a. The difference between the average density of the first conductive type dopant and the average density of the second conductive type dopant in the fourth drift outer region 252d may be smaller than the difference between the average density of the first conductive type dopant and the average density of the second conductive type dopant in the fourth drift inner region 251d.

The fourth drift inner region 251d and the fourth drift outer region 252d may constitute a fourth drift doping region 250d. The fourth drift doping region 250d may be located between the second drift doping region 250b and the third drift doping region 250c.

The average density of the first conductive type dopant in the fourth drift doping region 250d may be substantially the same as that in the fourth drift inner region 251d. The average density of the first conductive type dopant in the fourth drift doping region 250d may be lower than that in the second drift doping region 250b.

The average density of the second conductive type dopant in the fourth drift doping region 250d may be lower than that in the fourth drift inner region 251d. The average density of the second conductive type dopant in the fourth drift doping region 250d may be higher than that in the fourth drift outer region 252d. The average density of the second conductive type dopant in the fourth drift doping region 250d may be substantially the same as that in the second drift doping region 250b.

The difference between the average density of the first conductive type dopant and the average density of the second conductive type dopant in the fourth drift doping region 250d may be greater than the difference between the average density of the first conductive type dopant and the average density of the second conductive type dopant in the second drift doping region 250b. The difference between the average density of the first conductive type dopant and the average density of the second conductive type dopant in the fourth drift doping region 250d may be greater than the difference between the average density of the first conductive type dopant and the average density of the second conductive type dopant in the first drift doping region 250a.

In the semiconductor device in accordance with the embodiment, the resistance of the fourth drift doping region 250d may be lower than that of the second drift doping region 250b. In addition, the resistance of the third drift doping region 250c may be lower than that of the fourth drift doping region 250d in the semiconductor device in accordance with the embodiment. Accordingly, the resistance between the second drift doping region 250b and the first source/drain region 210 may be sequentially changed in the semiconductor device in accordance with the embodiment. Accordingly, the turn-on resistance may decrease in the semiconductor device in accordance with the embodiment.

The first well 260 may form a vertical electric field in the drift region 250. A reduced surface field (RESUF) effect may occur in the drift region 250 by the first well 260. As a result, the breakdown voltage may increase in the semiconductor device in accordance with the embodiment.

The first well 260 may be located in the semiconductor substrate 100. The first well 260 may be located in the epitaxial layer 130. The lowest level of the first well 260 may be substantially the same as the top level of the buried layer 120, and the highest level of the first well 260 may be substantially the same as a top level of the epitaxial layer 130.

The first well 260 may be located under the body region 240. The first well 260 may surround the outer side 240os and the bottom of the body region 240. The body region 240 may be located between an inner side 260is and an outer side 260os of the first well 260. The first well 260 may be in direct contact with the bottom of the body region 240.

The first well 260 may be located under the drift region 250. The first well 260 may be in direct contact with a bottom of the drift region 250. The first well 260 may partially vertically overlap the drift region 250. The outer side 250os of the drift region 250 may be located between the inner side 260is and the outer side 260os of the first well 260. The first well 260 may be located along the outer side 250os of the drift region 250. The first well 260 may surround the outer side 250os of the drift region 250.

The first well 260 may not vertically overlap (i.e., along the z-direction) the first source/drain region 210. The inner side 260is of the first well 260 may be a shape of a closed curve surrounding the first source/drain region 210. An extension line of the inner side 260is of the first well 260 may be substantially the same as (i.e., may be aligned along the z-direction with) the boundary 250*dc* between the third drift doping region 250*c* and the fourth drift doping region 250*d*.

The shape of the first well 260 may be substantially the same as that of the body region 240. For example, the first well 260 may be a shape of an octagonal ring surrounding the side of the first source/drain region 210.

The first well 260 may be the same conductive type as the body region 240. The first well 260 may include the first conductive type dopant. For example, the first well 260 may include a p-type dopant.

The first well 260 may include a first well inner region 261, a second well inner region 262, and a well outer region 263. The second well inner region 262 may be spaced apart from the first well inner region 261. The well outer region 263 may surround a side and bottom of the first well inner region 261 and a side and bottom of the second well inner region 262.

The first well inner region 261 may be located below the second drift doping region 250*b*. The first well inner region 261 may vertically overlap the second drift inner region 251*b*. The lowest level of the first well inner region 261 may be higher than the top level of the buried layer 120. The lowest level of the first well inner region 261 may be lower than the lowest level of the drift region 250. The first well inner region 261 may be located close to a bottom of the second drift doping region 250*b*. The second drift outer region 252*b* may be located between the second drift inner region 251*b* and the first well inner region 261. The first well inner region 261 may be in direct contact with a bottom of the second drift outer region 252*b*.

An extension line of an outer side 261*os* of the first well inner region 261 may be substantially the same as (i.e., may be aligned along the z-direction with) the boundary 250*ab* between the first drift doping region 250*a* and the second drift doping region 250*b*, and an extension line of an inner side 261*is* of the first well inner region 261 may be substantially the same as (i.e., may be aligned along the z-direction with) the boundary 250*bd* between the second drift doping region 250*b* and the fourth drift doping region 250*d*.

The average density of the first conductive type dopant in the first well inner region 261 may be substantially the same as that in the second drift doping region 250*b*. The average density of the first conductive type dopant in the first well inner region 261 may be substantially the same as that in the second drift inner region 251*b*.

The second well inner region 262 may be located below the body region 240. The second well inner region 262 may vertically overlap the body region 240. The lowest level of the second well inner region 262 may be higher than the top level of the buried layer 120. The lowest level of the second well inner region 262 may be substantially the same as the lowest level of the first well inner region 261. The second well inner region 262 may be located close to the bottom of the body region 240. The second well inner region 262 may be in direct contact with the bottom of the body region 240. The second well inner region 262 may be in direct contact with the outer side 240*os* of the body region 240.

The second well inner region 262 may be in direct contact with the outer side 250*os* of the drift region 250. The first drift outer region 252*a* may be located between the first drift inner region 251*a* and the body region 240 and second well inner region 262. An extension line of an inner side 262*is* of the second well inner region 262 may be substantially the same as (i.e., may be aligned along the z-direction with) the boundary 252*ea* between the first drift outer region 252*a* and the drift side region 252*e*. The drift side region 252*e* may be surrounded by the body region 240, the first drift outer region 252*a*, and the second well inner region 262. An outer side 262*os* of the second well inner region 262 may be opposite the inner side 262*is* of the second well inner region 262.

The average density of the first conductive type dopant in the second well inner region 262 may be lower than that in the body region 240. The average density of the first conductive type dopant in the second well inner region 262 may be substantially the same as that in the drift side region 252*e*. The average density of the first conductive type dopant in the second well inner region 262 may be substantially the same as that in the first well inner region 261.

The well outer region 263 may be located between the first well inner region 261 and the second well inner region 262. The well outer region 263 may fill (e.g., extend) between the outer side 261*os* of the first well inner region 261 and the inner side 262*is* of the second well inner region 262. The well outer region 263 may be in direct contact with a bottom of the first drift outer region 252*a*. The well outer region 263 may be in direct contact with a bottom of the fourth drift outer region 252*d*.

The well outer region 263 may be in direct contact with the buried layer 120 under the body region 240 and the second drift doping region 250*b*. The well outer region 263 may be spaced apart from the buried layer 120 under the first drift doping region 250*a*. The distance between the well outer region 263 and the buried layer 120 may increase from under the body region 240 and second drift doping region 250*b* toward under the first drift doping region 250*a*.

The average density of the first conductive type dopant in the well outer region 263 may be substantially the same as that in the first drift inner region 251*a*. The average density of the first conductive type dopant in the well outer region 263 may be lower than that in the first drift doping region 250*a*. The average density of the first conductive type dopant in the well outer region 263 may be substantially the same as the fourth drift doping region 250*d*. The average density of the first conductive type dopant in the well outer region 263 may be lower than that in the first well inner region 261.

The average density of the first conductive type dopant in the first well inner region 261 may be higher than that in the well outer region 263 in the semiconductor device in accordance with the embodiment. Accordingly, a stronger vertical electric field may be formed in the second drift doping region 250*b* than in the first drift doping region 250*a* in the semiconductor device in accordance with the embodiment.

In addition, the difference between the average density of the first conductive type dopant and the average density of the second conductive type dopant in the first drift doping region 250*a* may be greater than the difference between the average density of the first conductive type dopant and the average density of the second conductive type dopant in the second drift doping region 250*b*. As a result, a depletion region may be wider in the well outer region 263 than in the first well inner region 261 in the semiconductor device in accordance with the embodiment. Accordingly, the threshold voltage may increase, and the turn-on resistance may decrease in the semiconductor device in accordance with the embodiment.

The shallow trench isolation 300 may be located close to the first source/drain region 210. The lowest level of the shallow trench isolation 300 may be lower than the lowest level of the first source/drain region 210. The lowest level of the shallow trench isolation 300 may be higher than the lowest level of the body region 240. An inner side 300*is* of the shallow trench isolation 300 may be in direct contact with the first source/drain region 210. The highest level of the shallow trench isolation 300 may be higher than the top level of the semiconductor substrate 100.

The shallow trench isolation 300 may be located between the first source/drain region 210 and the second source/drain region 220 in the drift region 250. The shallow trench isolation 300 may be located in the drift inner region 251 in a region in which the first source/drain region 210 horizontally overlaps the second source/drain region 220. The outer side 300os of the shallow trench isolation 300 may be spaced apart from the inner side 240is of the body region 240 in a region located between the first source/drain region 210 and the second source/drain region 220.

The outer side 300os of the shallow trench isolation 300 may be located between the inner side 240is and the outer side 240os of the body region 240 in a region in which the first source/drain region 210 does not horizontally overlap (i.e., along the x-direction) the second source/drain region 220. The shallow trench isolation 300 may partially vertically overlap the body region 240 in the region in which the first source/drain region 210 does not horizontally overlap the second source/drain region 220. The outer side 300os of the shallow trench isolation 300 may be the same as the inner side 230is of the body contact region 230 in the region in which the first source/drain region 210 does not horizontally overlap the second source/drain region 220.

The first drift inner region 251a, the second drift inner region 251b, the third drift inner region 251c, and the fourth drift inner region 251d may be located close to the shallow trench isolation 300. The first drift inner region 251a may be located between the inner side 240is of the body region 240 and the outer side 300os of the shallow trench isolation 300 in the region in which the first source/drain region 210 horizontally overlaps (i.e., along the y-direction) the second source/drain region 220.

The gate pattern 400 may be located on the semiconductor substrate 100. The gate pattern 400 may be located between the first source/drain region 210 and the second source/drain region 220. The gate pattern 400 may partially vertically overlap the body region 240. The second source/drain region 220 may be located outside of an outer side 400os of the gate pattern 400. An inner side 400is of the gate pattern 400 may be spaced apart from the first source/drain region 210. The inner side 400is of the gate pattern 400 may be a shape of a closed curve surrounding the side of the first source/drain region 210. For example, the gate pattern 400 may be a shape of an octagonal ring surrounding the side of the first source/drain region 210.

The gate pattern 400 may partially vertically overlap the shallow trench isolation 300 between the first source/drain region 210 and the second source/drain region 220. A bottom of the gate pattern 400 may be in direct contact with a top of the shallow trench isolation 300 in a region in which the first source/drain region 210 horizontally overlaps the second source/drain region 220.

The semiconductor device in accordance with an embodiment may further include an oxide pattern 410 located between the semiconductor substrate 100 and the gate pattern 400 in a region between the first source/drain region 210 and the second source/drain region 220. The outer side 400os of the gate pattern 400 may be vertically aligned (i.e., aligned along the z-direction) with a side of the oxide pattern 410. The oxide pattern 410 may be in direct contact with the outer side 300os of the shallow trench isolation 300.

Figure 2:
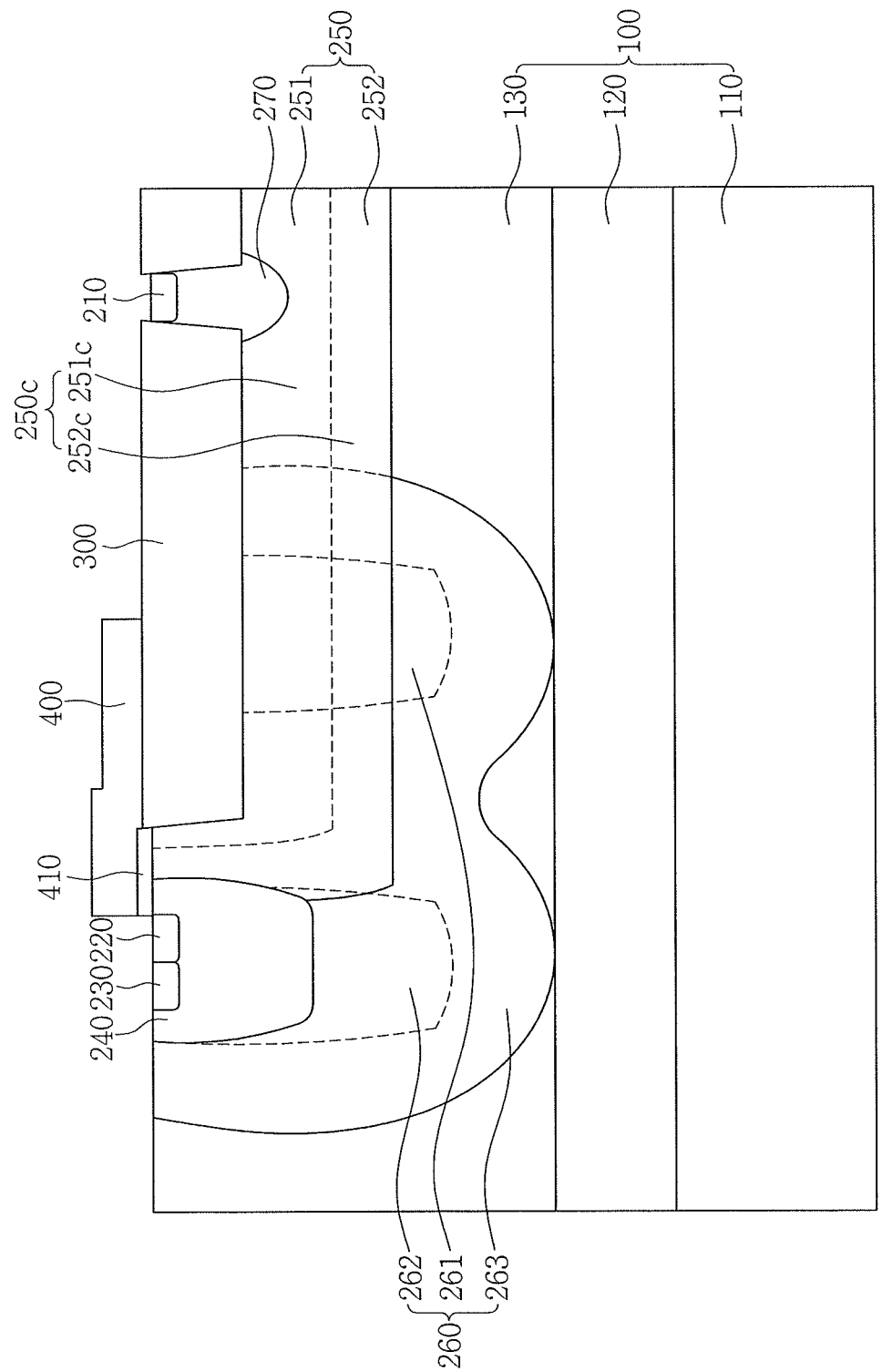
FIG. 2 illustrates a cross-sectional view of a semiconductor device in accordance with another embodiment.

FIG. 2 illustrates a cross-sectional view of a semiconductor device in accordance with another embodiment.

Referring to FIG. 2, a semiconductor device in accordance with an embodiment may include a semiconductor substrate 100, a first source/drain region 210, a second source/drain region 220, a body contact region 230, a body region 240, a drift region 250, a first well 260, a second well 270, a shallow trench isolation 300, an oxide pattern 410, and a gate pattern 400.

The semiconductor substrate 100 may include a base substrate 110, a buried layer 120, and an epitaxial layer 130. The drift region 250 may include a drift inner region 251 and a drift outer region 252. The drift inner region 251 may include a third drift inner region 251c. The drift outer region 252 may include a third drift outer region 252c. The third drift inner region 251c and the third drift outer region 252c may constitute a third drift doping region 250c. The first well 260 may include a first well inner region 261, a second well inner region 262, and a well outer region 263.

The second well 270 may be located in the drift region 250. The second well 270 may be located close to the first source/drain region 210. The second well 270 may not vertically overlap the first well 260. The second well 270 may be located outside of the first well 260. The second well 270 may be located in the third drift doping region 250c. The second well 270 may be located in the third drift inner region 251c. The second well 270 may surround the bottom of the first source/drain region 210.

The second well 270 may be the same conductive type as the drift region 250. The second well 270 may be the same conductive type as the first source/drain region 210. The second well 270 may include the second conductive type dopant. For example, the second well 270 may include an n-type dopant. The second well 270 may not include the first conductive type dopant.

The average density of the second conductive type dopant in the second well 270 may be higher than that in the third drift doping region 250c. The average density of the second conductive type dopant in the second well 270 may be higher than that in the third drift inner region 251c. The average density of the second conductive type dopant in the second well 270 may be lower than that in the first source/drain region 210.

Figure 3A:
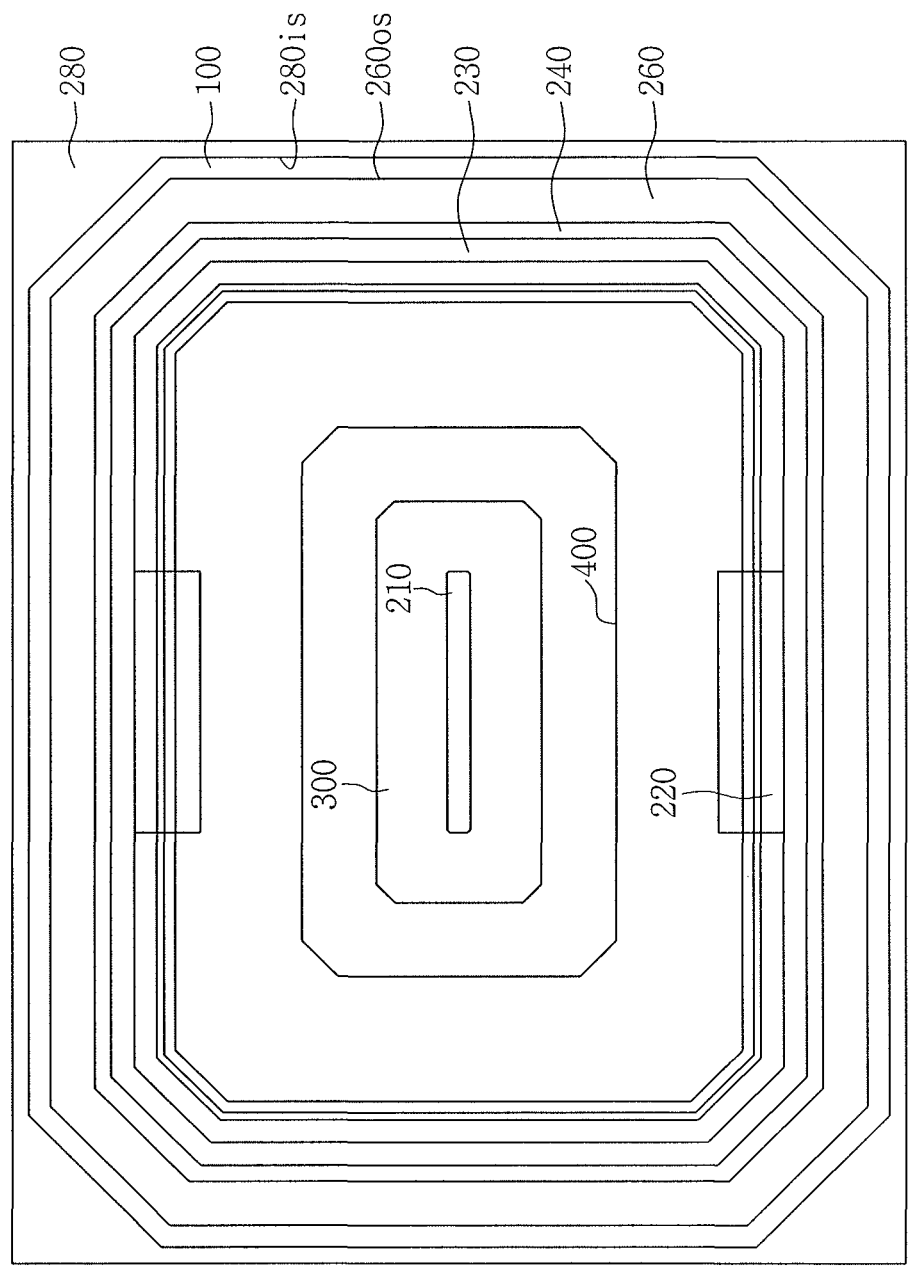
FIG. 3A illustrates a layout view of a semiconductor device in accordance with another embodiment.
Figure 3B:
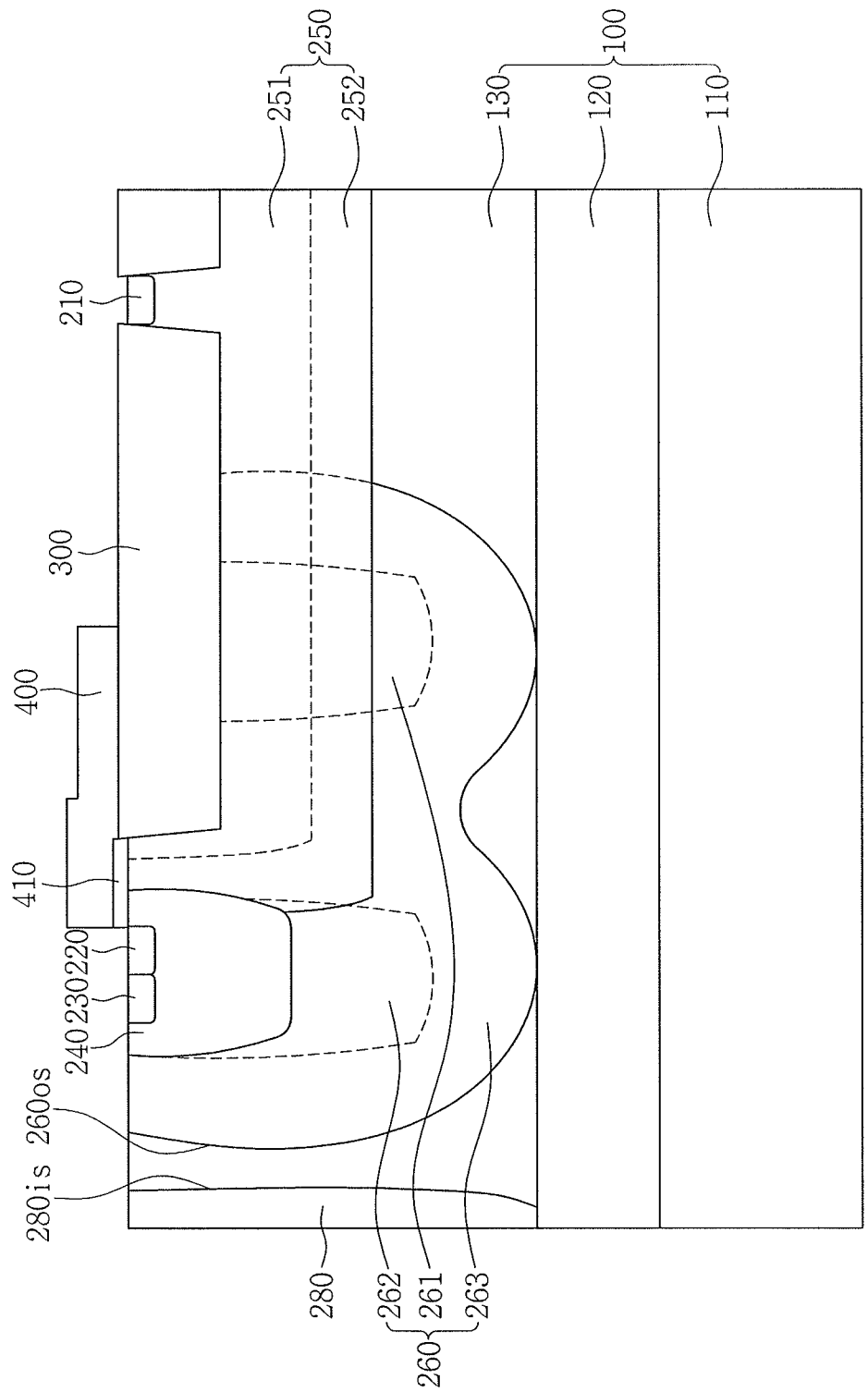
FIG. 3B illustrates a cross-sectional view of a semiconductor device in accordance with another embodiment.

FIG. 3A illustrates a layout view of a semiconductor device in accordance with an embodiment. FIG. 3B illustrates a cross-sectional view of a semiconductor device in accordance with an embodiment.

Referring to FIGS. 3A and 3B, a semiconductor device in accordance with an embodiment may include a semiconductor substrate 100, a second conductive type first source/drain region 210, a second conductive type second source/drain region 220, a first conductive type body contact region 230, a first conductive type body region 240, a second conductive type drift region 250, a first conductive type first well 260, a second conductive type sink 280, a shallow trench isolation 300, an oxide pattern 410, and a gate pattern 400.

The semiconductor substrate 100 may include a first conductive type base substrate 110, a second conductive type buried layer 120, and a second conductive type epitaxial layer 130. The drift region 250 may include a second conductive type drift inner region 251 and a second conductive type drift outer region 252. The first well 260 may include a first conductive type first well inner region 261, a first conductive type second well inner region 262, and a first conductive type well outer region 263.

The sink 280 may be located in the semiconductor substrate 100. The sink 280 may be located in the epitaxial layer 130. The lowest level of the sink 280 may be substantially the same as a top level of the buried layer 120. The highest level of the sink 280 may be substantially the same as a top level of the epitaxial layer 130.

The sink 280 may surround an outer side 260os of the first well 260. An inner side 280is of the sink 280 may be spaced apart from the first well 260. The inner side 280is of the sink 280 may face the outer side 260os of the first well 260. The inner side 280is of the sink 280 may be a shape of a closed curve surrounding the outer side 260os of the first well 260.

The sink 280 may include a second conductive type dopant. The sink 280 may not include a first conductive type dopant. The average density of the second conductive type dopant in the sink 280 may be higher than that in the epitaxial layer 130. The average density of the second conductive type dopant in the sink 280 may be higher than that in the drift region 250. The average density of the second conductive type dopant in the sink 280 may be lower than that in the buried layer 120.

Figure 4:
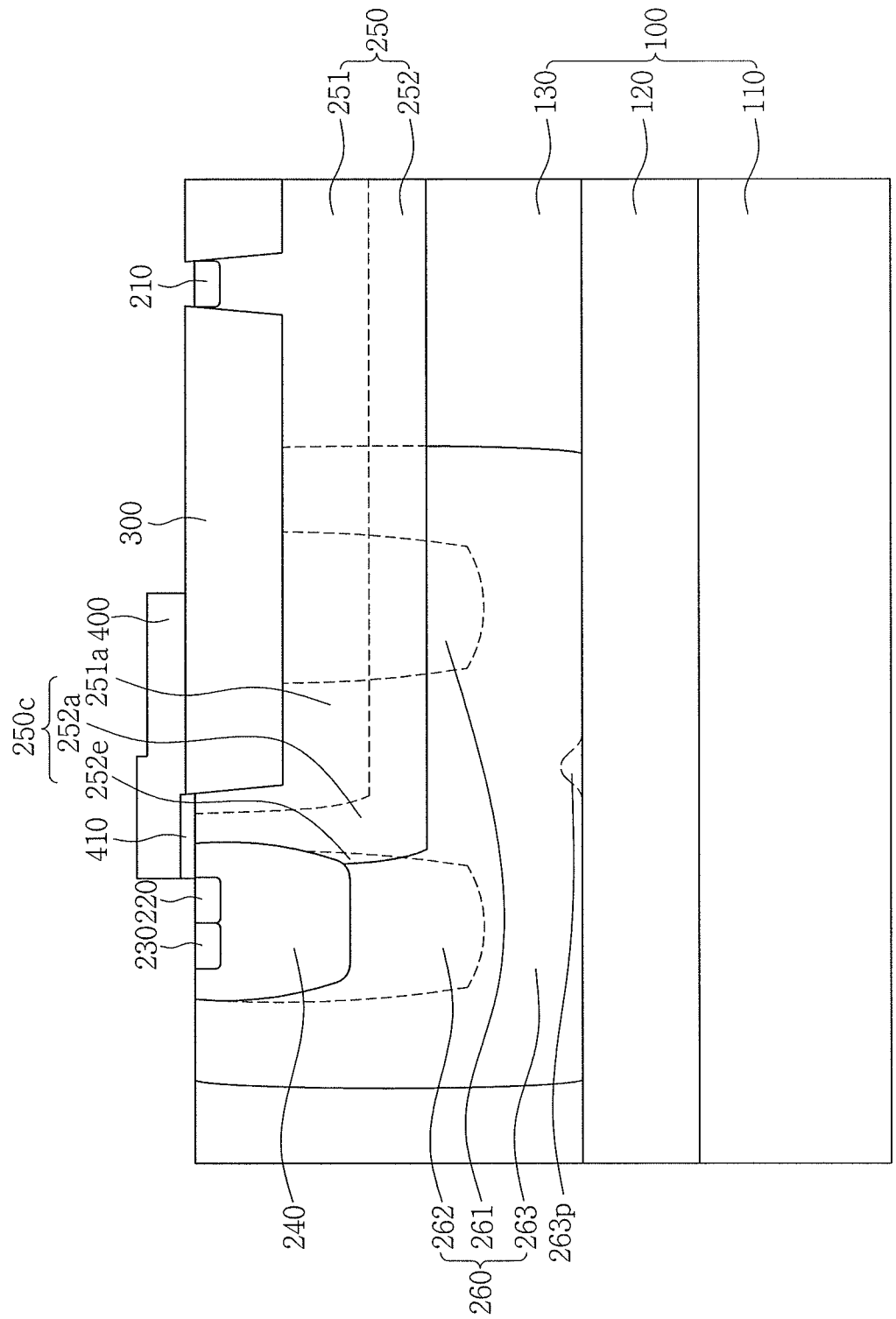
FIG. 4 illustrates a cross-sectional view of a semiconductor device in accordance with another embodiment.
Figure 6B:
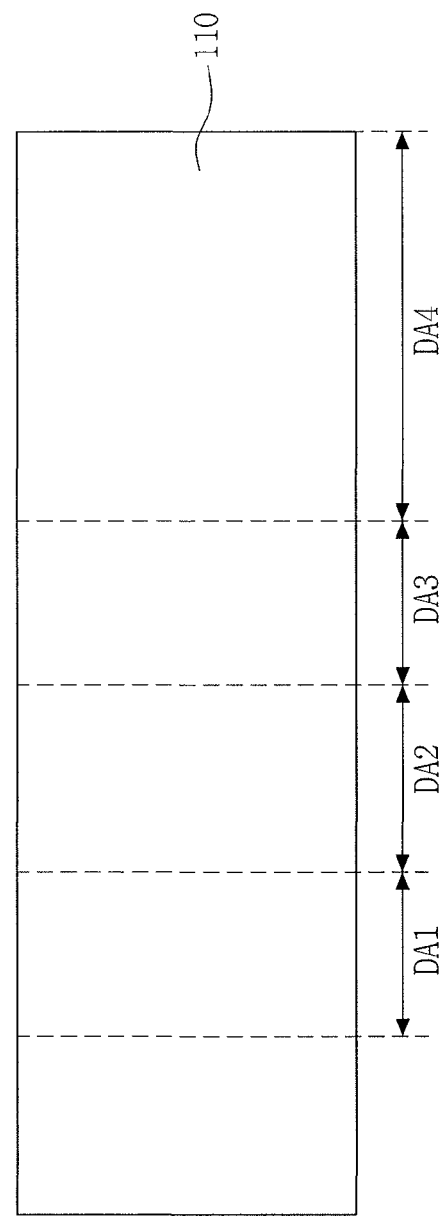

FIG. 4 illustrates a cross-sectional view of a semiconductor device in accordance with an embodiment.

Referring to FIG. 4, a semiconductor device in accordance with an embodiment may include a semiconductor substrate 100 in which a first source/drain region 210, a second source/drain region 220, a body contact region 230, a body region 240, a drift region 250, a first well 260, and a shallow trench isolation 300 are formed, an oxide pattern 410 is located on the semiconductor substrate 100, and a gate pattern 400 is located on the oxide pattern 410.

The semiconductor substrate 100 may include a base substrate 110, a buried layer 120, and an epitaxial layer 130. The drift region 250 may include a drift inner region 251 and a drift outer region 252. The drift inner region 251 may include a first drift inner region 251a. The drift outer region 252 may include a first drift outer region 252a and a drift side region 252e. The first drift inner region 251a, the first drift outer region 252a, and the drift side region 252e may constitute a first drift doping region 250a. The first well 260 may include a first well inner region 261, a second well inner region 262, and a well outer region 263. The entire bottom of the well outer region 263 may be in direct contact with the top of the buried layer 120.

The well outer region 263 may include a first conductive type dopant. The density of the first conductive type dopant may not be uniform in the well outer region 263. For example, the density of the first conductive type dopant may decrease as thr distance from the first well inner region 261 and the second well inner region 262 increases.

The well outer region 263 may include a well deep region 263p. The well deep region 263p may be located between the first well inner region 261 and the second well inner region 262. The well deep region 263p may be located below the first drift doping region 250a. The well deep region 263p may vertically overlap the first drift doping region 250a. The average density of the first conductive type dopant in the well deep region 263p may be lower than that in the well outer region 263.

FIG. 5 illustrates a cross-sectional view of a semiconductor device in accordance with an embodiment.

Referring to FIG. 5, a semiconductor device in accordance with an embodiment may include a semiconductor substrate 100 in which a base substrate 110, a buried layer 120, and an epitaxial layer 130 are formed, a drift region 250 located in the epitaxial layer 130, a first source/drain region 210 located in the drift region 250, a shallow trench isolation 300 in contact with a side of the first source/drain region 210, a body region 240 in contact with a side of the drift region 250, a second source/drain region 220 in the body region 240, a body contact region 230 in contact with the second source/drain region 220, a first well 290 located between the body region 240, the drift region 250, and the buried layer 120, a gate pattern 400 located on the semiconductor substrate 100, and an oxide pattern 410 located between the semiconductor substrate 100 and the gate pattern 400.

A top level of the first well 290 may be lower than a top level of the epitaxial layer 130. A bottom level of the body region 240 may be lower than the top level of the first well 290. The first well 290 may be in direct contact with a bottom of the body region 240. The outer side 240os of the body region 240 may be in direct contact with the epitaxial layer 130. A bottom level of the drift region 250 may be lower than the top level of the first well 290. The first well 290 may be in direct contact with a bottom of the drift region 250. The bottom level of the drift region 250 may be lower than the bottom level of the body region 240.

The drift region 250 may include a drift inner region 253 and a drift outer region 254. A bottom level of the drift inner region 253 may be higher than the top level of the first well 290. The top level of the first well 290 may be located between a bottom level of the drift outer region 254 and the bottom level of the drift inner region 253.

The drift outer region 254 may include a drift lower region 254f. The drift lower region 254f may include both of a first conductive type dopant and a second conductive type dopant. The first well 290 may include the first conductive type dopant. The average density of the first conductive type dopant in the first well 290 may be substantially the same as that in the drift lower region 254f. The drift outer region 254 may include the second conductive type dopant. The average density of the second conductive type dopant in the drift outer region 254 may be substantially the same as that in the drift lower region 254f. The drift outer region 254 excluding the drift lower region 254f may not include the first conductive type dopant. The drift inner region 253 may include the second conductive type dopant. The drift inner region 253 may not include the first conductive type dopant.

In the semiconductor device in accordance with the embodiment, the drift inner region 253 may not include the first conductive type dopant. Accordingly, the turn-on resistance may decrease in the semiconductor device in accordance with the embodiment.

FIGS. 6A, 7A, 8A, 9A, 10A, 11A, 12A, 13A, 14A, 15A, 16A, 17A, 18A, 19A, and 20A illustrate layout views of sequential stages in a method of forming a semiconductor device in accordance with an embodiment. FIGS. 6B, 7B, 8B, 9B, 10B, 11B, 12B, 13B, 14B, 15B, 16B, 17B, 18B, 19B, and 20B illustrate cross-sectional views of sequential stages in a method of forming a semiconductor device in accordance with an embodiment.

A method of forming a semiconductor device in accordance with an embodiment will be described with reference to FIGS. 1A to 1C, 6A to 20A, and 6B to 20B. First, referring to FIGS. 6A and 6B, the method of forming a semiconductor device in accordance with the embodiment may include providing a base substrate 110 having a first doping region DA1, a second doping region DA2, a third doping region DA3, and a fourth doping region DA4.

The provision of the base substrate 110 may include doping the base substrate 110 with a first conductive type dopant. The doping of the base substrate 110 with the first conductive type dopant may include making the density of the first conductive type dopant in the base substrate 110 to be uniform.

The first doping region DA1 may surround the second doping region DA2. The second doping region DA2 may surround the third doping region DA3. The second doping region DA2 may be located between the first doping region DA1 and the third doping region DA3. The third doping region DA3 may surround the fourth doping region DA4. The third doping region DA3 may be located between the second doping region DA2 and the fourth doping region DA4. The third doping region DA3 may define the fourth doping region DA4. For example, the third doping region DA3 may be a shape of an octagonal ring surrounding the fourth doping region DA4.

Figure 7B:
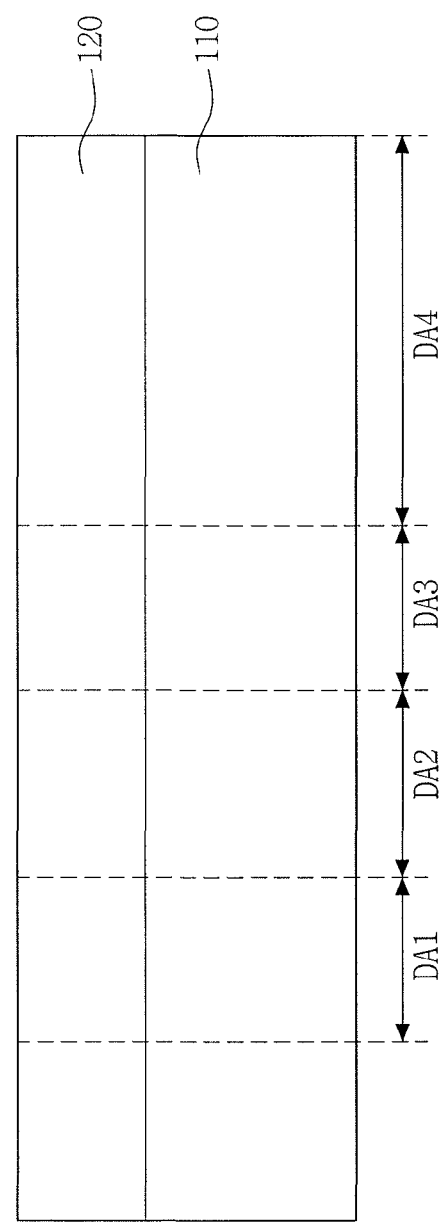

Referring to FIGS. 7A and 7B, the method of forming a semiconductor device in accordance with the embodiment may include forming a buried layer 120 in the base substrate 110.

The formation of the buried layer 120 may include doping a region close to a top of the base substrate 110 with a second conductive type dopant. The formation of the buried layer 120 may include implanting the second conductive type dopant to the entire top of the base substrate 110 and diffusing the second conductive type dopant.

Figure 8B:
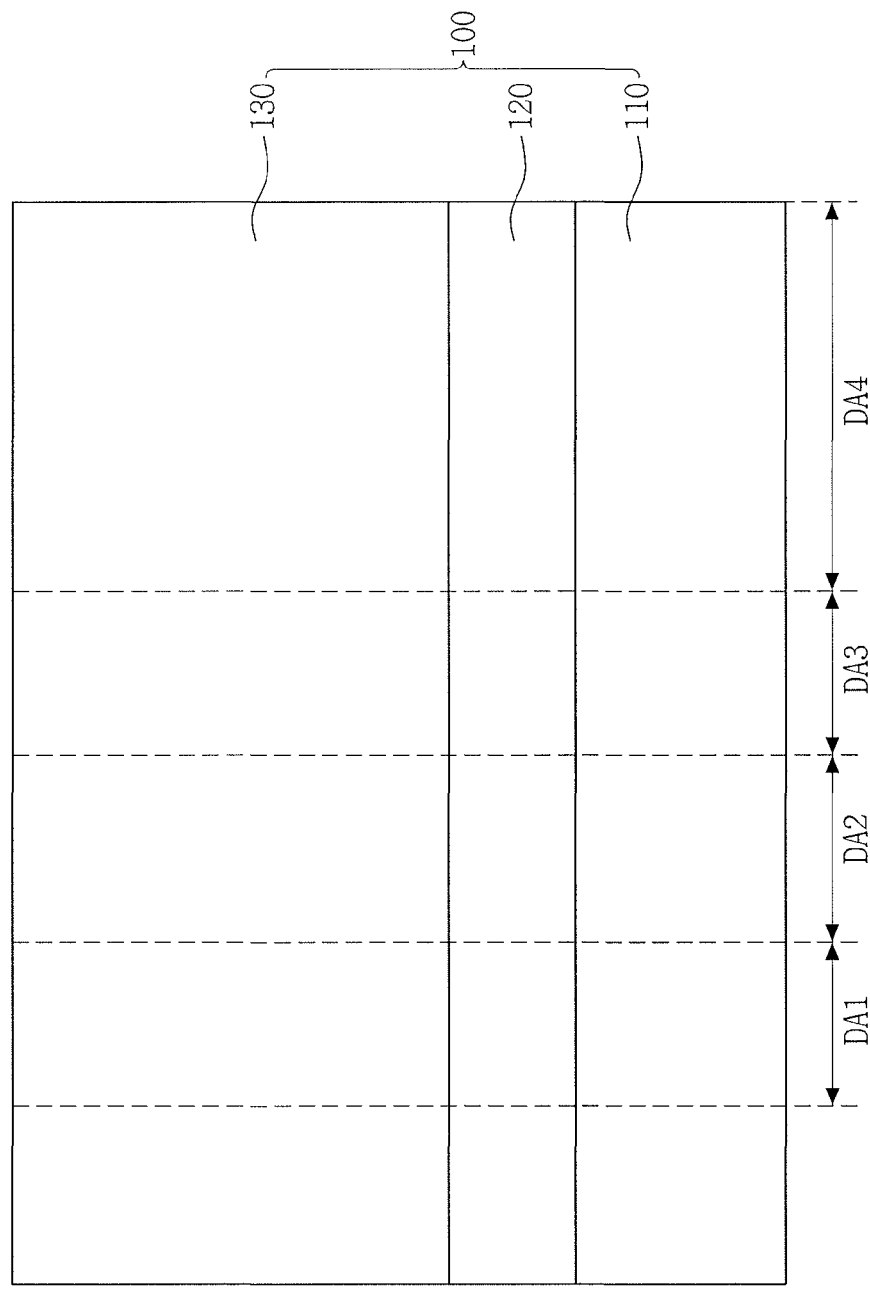

Referring to FIGS. 8A and 8B, the method of forming a semiconductor device in accordance with the embodiment may include forming an epitaxial layer 130 on the buried layer 120.

The formation of the epitaxial layer 130 may include forming the epitaxial layer 130 having the second conductive type dopant on the buried layer 120. The base substrate 110, the buried layer 120, and the epitaxial layer 130 may constitute a semiconductor substrate 100.

Referring to FIGS. 9A and 9B, the method of forming a semiconductor device in accordance with the embodiment may include forming a first mask pattern 910 having a first opening 911 and a second opening 912 on the semiconductor substrate 100.

The first opening 911 may expose the third doping region DA3 of the semiconductor substrate 100. The first opening 911 may partially expose the third doping region DA3 of the semiconductor substrate 100. The first mask pattern 910 may cover an edge of the third doping region DA3. The second opening 912 may expose the first doping region DA1 of the semiconductor substrate 100. The second opening 912 may partially expose the first doping region DA1 of the semiconductor substrate 100. The first mask pattern 910 may cover an edge of the first doping region DA1.

Figure 10A:
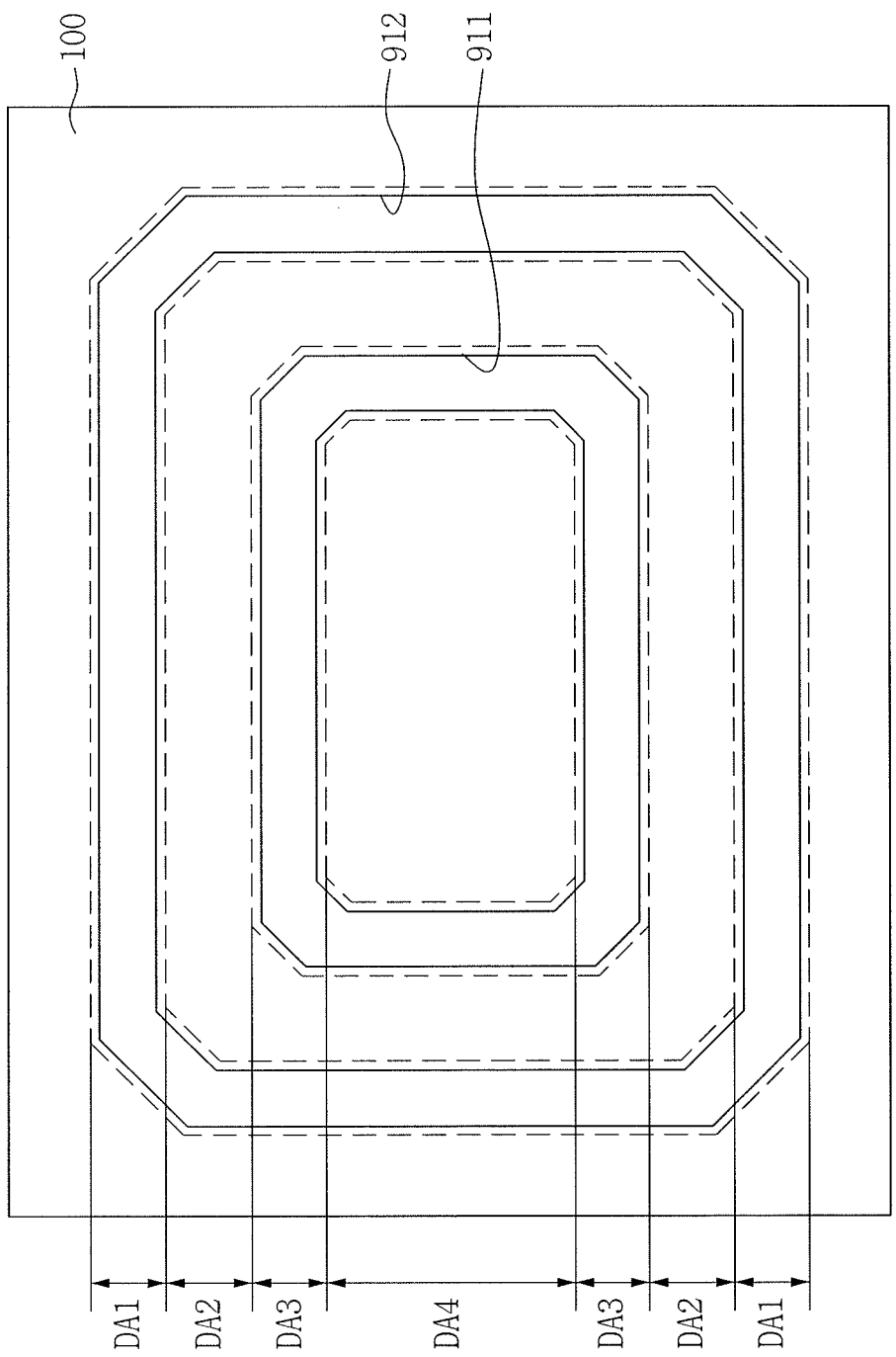

Referring to FIGS. 10A and 10B, the method of forming a semiconductor device in accordance with the embodiment may include forming a preliminary well region PW in the first doping region DA1 and the third doping region DA3 of the semiconductor substrate 100.

The formation of the preliminary well region PW may include injecting the first conductive type dopant into the first doping region DA1 and the third doping region DA3 of the semiconductor substrate 100 using the first mask pattern 910.

In the method of forming a semiconductor device in accordance with an embodiment, two preliminary well regions PW may be respectively formed in the first doping region DA1 and third doping region DA3 of the semiconductor substrate 100. In the method of forming a semiconductor device in accordance with the embodiment, at least one preliminary well region PW may be respectively formed in the first doping region DA1 and the third doping region DA3 of the semiconductor substrate 100.

Figure 11A:
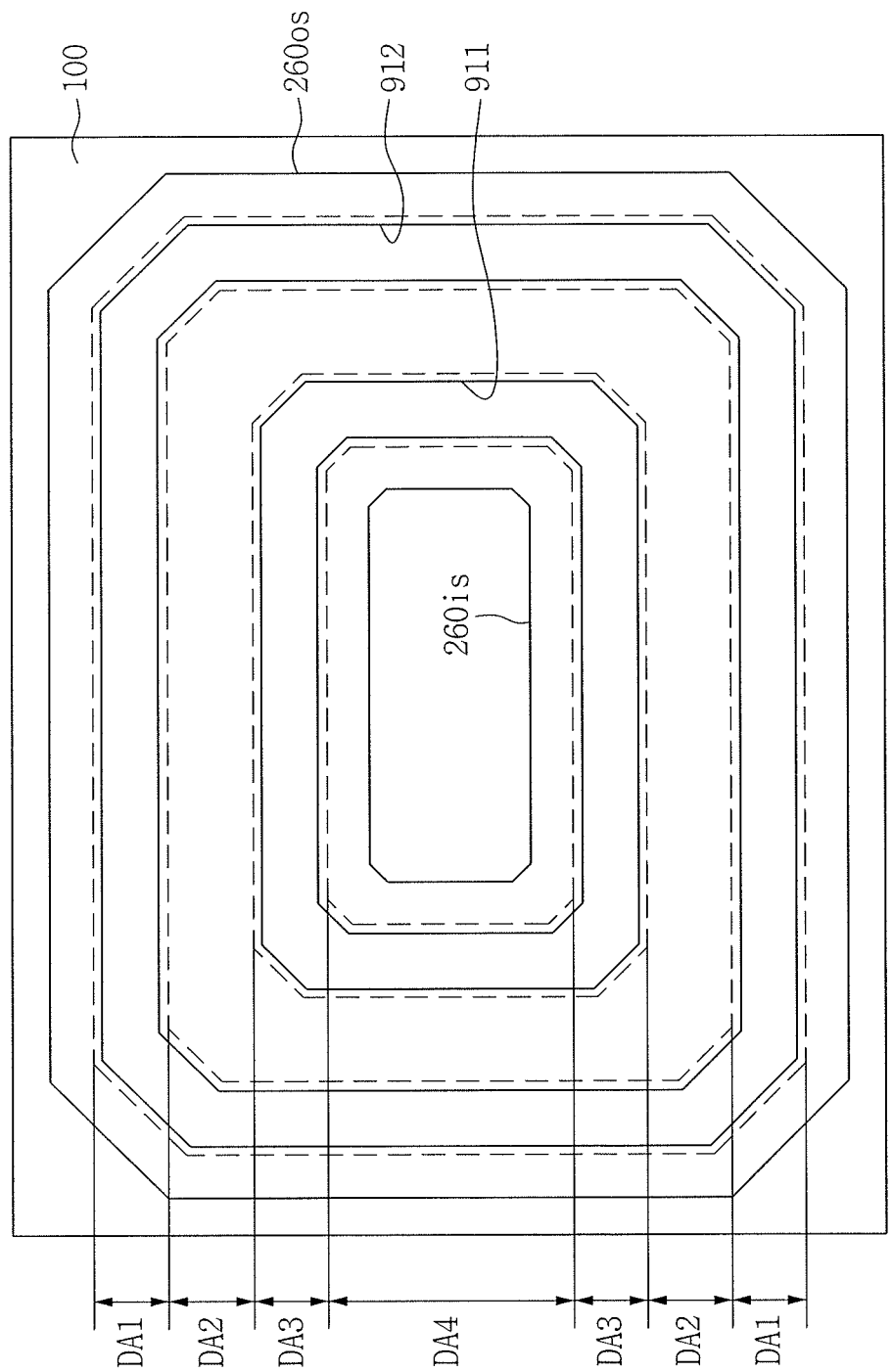
Figure 11B:
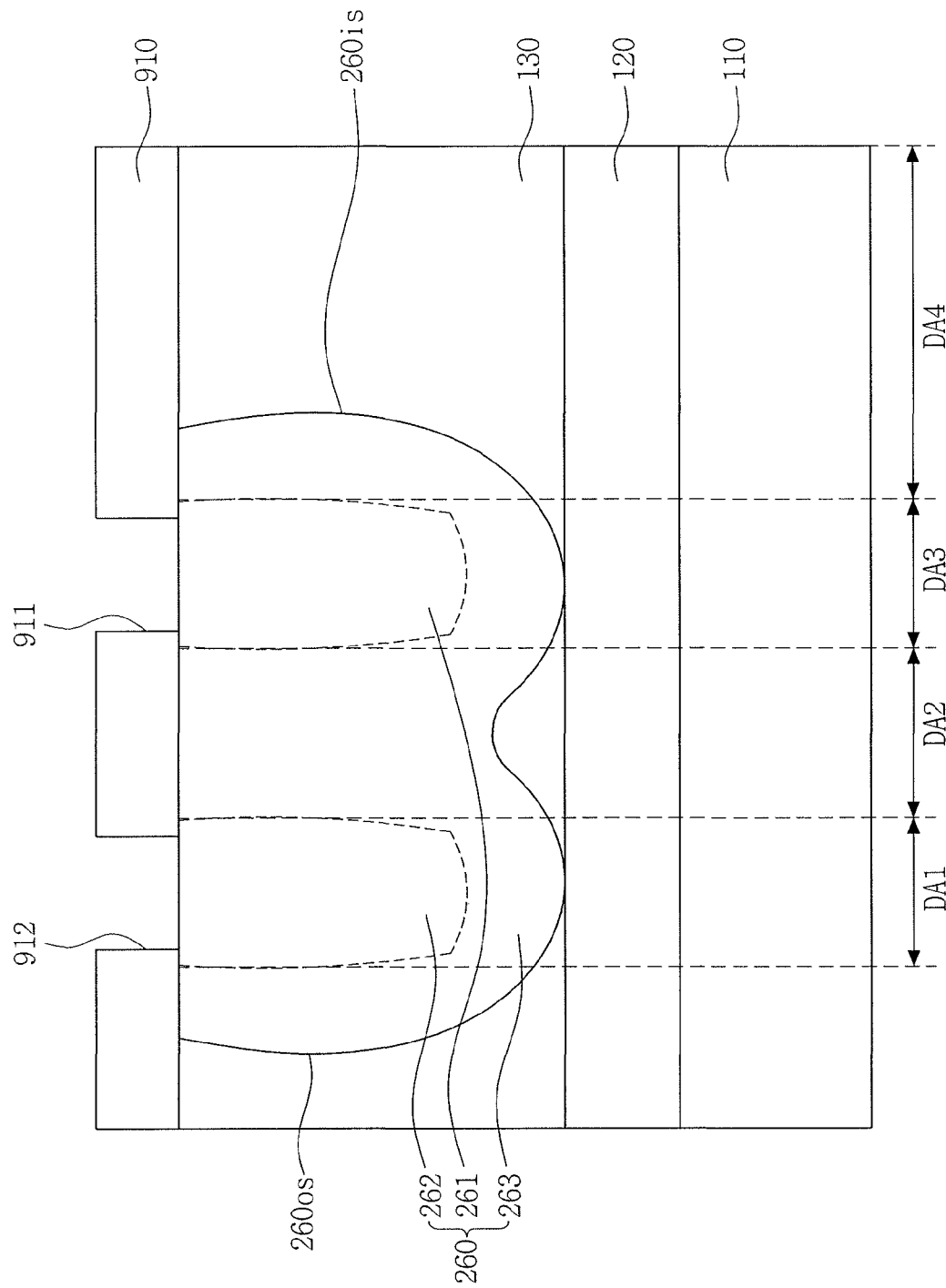

Referring to FIGS. 11A and 11B, the method of forming a semiconductor device in accordance with the embodiment may include forming a first well 260 having a first well inner region 261, a second well inner region 262, and a well outer region 263 in the semiconductor substrate 100

The formation of the first well 260 may include diffusing the first conductive type dopant (e.g., from the preliminary well region PW). The diffusion of the first conductive type dopant may include heating the semiconductor substrate 100 at a first process temperature for a first process time. For example, the formation of the first well 260 may include heating the semiconductor substrate 100 at about 1100° C. to about 1200° C. for about one to about two hours.

The first well inner region 261 may be located in the third doping region DA3. The density of the first conductive type dopant in the first well inner region 261 may be uniform. The second well inner region 262 may be located in the first doping region DA1. The average density of the first conductive type dopant in the second well inner region 262 may be substantially the same as that in the first well inner region 261.

The well outer region 263 may surround a side and bottom of the first well inner region 261 and a side and bottom of the second well inner region 262. The inner side 260is of the first well 260 may be located in the fourth doping region DA4. The outer side 260os of the first well 260 may be located outside of the first doping region DA1.

Between the first well inner region 261 and the second well inner region 262, a side of the well outer region 263 may be the same as a side of the first well inner region 261 and a side of the second well inner region 262. The formation of the first well 260 may include doping (e.g., filling) the second doping region DA2 located between the first well inner region 261 and the second well inner region 262 with the first conductive type dopant.

The density of the first conductive type dopant in the well outer region 263 may not be uniform. The density of the first conductive type dopant in the well outer region 263 may decrease as the distance from the first well inner region 261 and the second well inner region 262 increases. The average density of the first conductive type dopant in the well outer region 263 may be lower than that in the first well inner region 261.

Figure 12A:
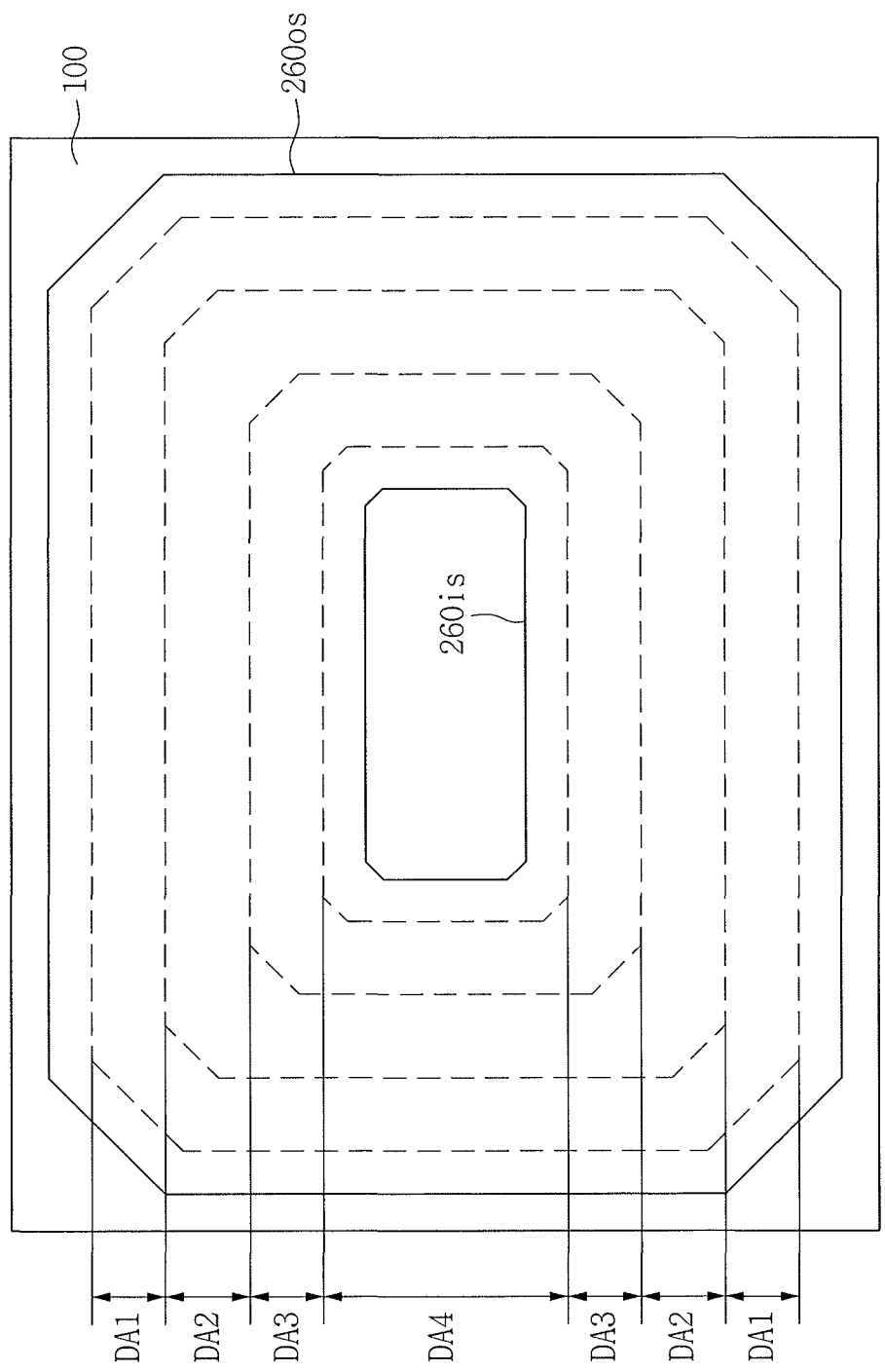
Figure 12B:
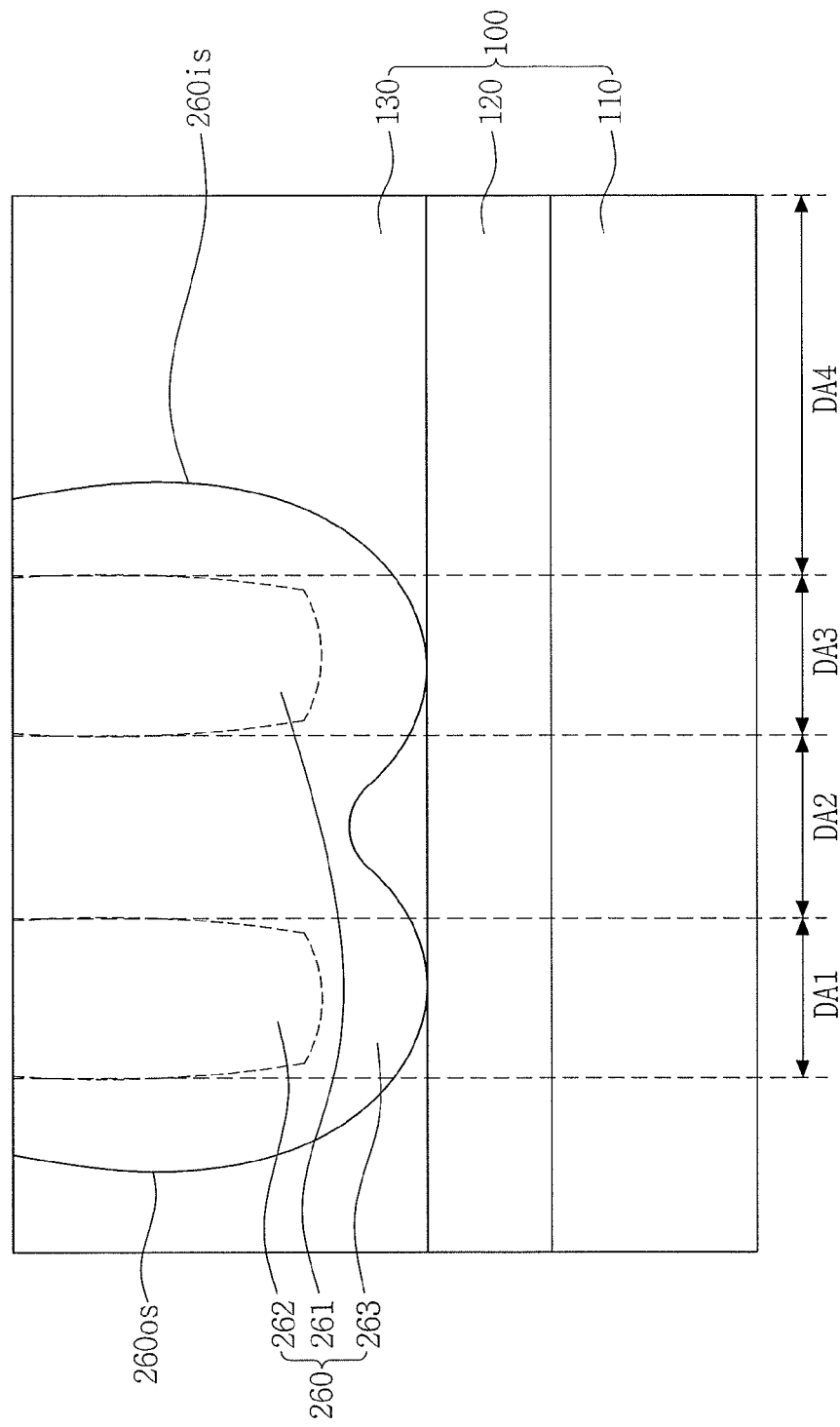

Referring to FIGS. 12A and 12B, the method of forming a semiconductor device in accordance with the embodiment may include removing the first mask pattern 910.

Figure 13A:
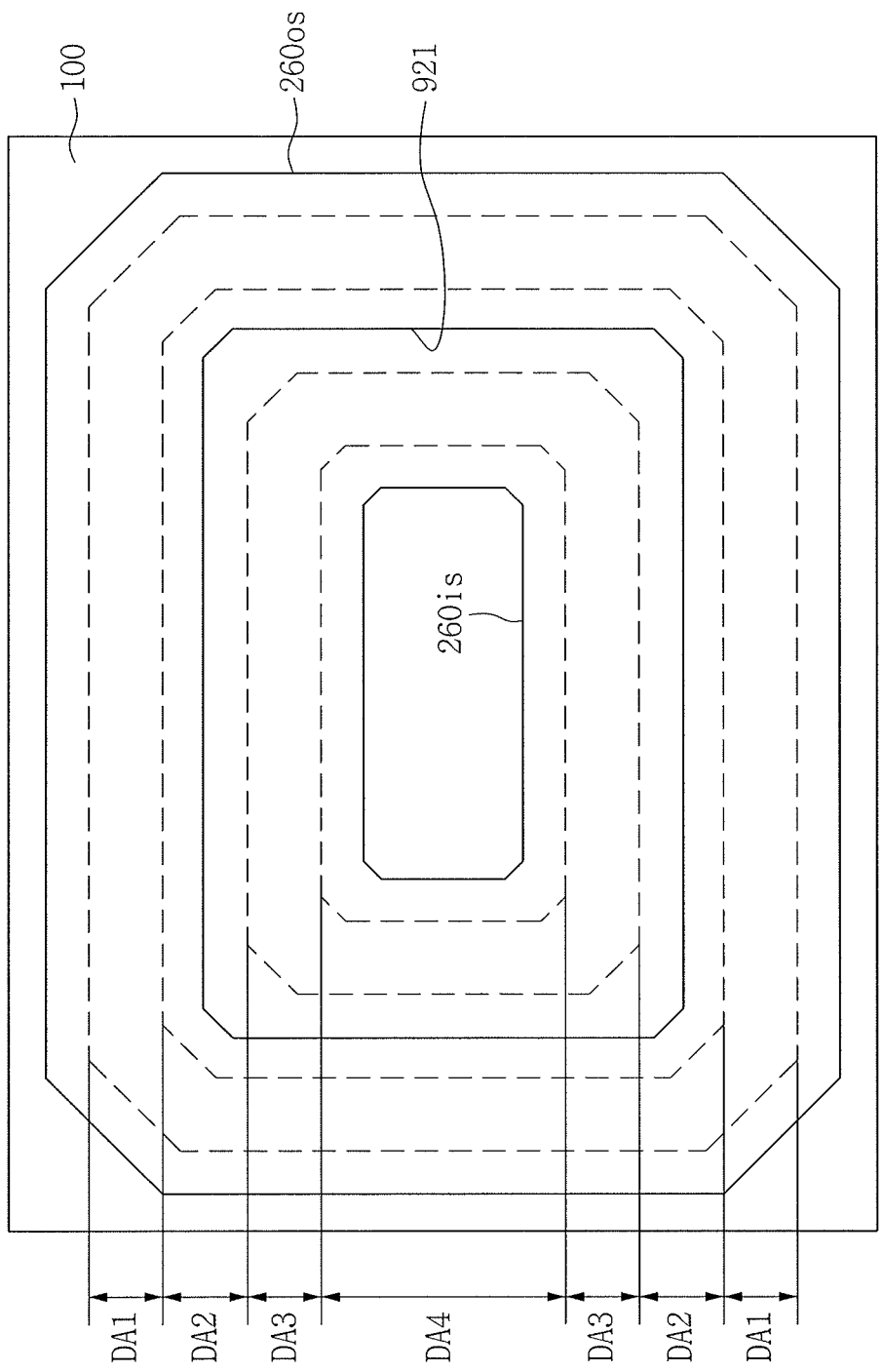

Referring to FIGS. 13A and 13B, the method of forming a semiconductor device in accordance with the embodiment may include forming a second mask pattern 920 having a third opening 921 on the semiconductor substrate 100.

The third opening 921 may expose the third doping region DA3 and the fourth doping region DA4 of the semiconductor substrate 100. The third opening 921 may partially expose the second doping region DA2 of the semiconductor substrate 100. The third opening 921 may expose an edge of the second doping region DA2 located close to the third doping region DA3. The second mask pattern 920 may cover the edge of the second doping region DA2 located close to the first doping region DA1. The third opening 921 may be a shape of an octagonal hole.

Figure 14A:
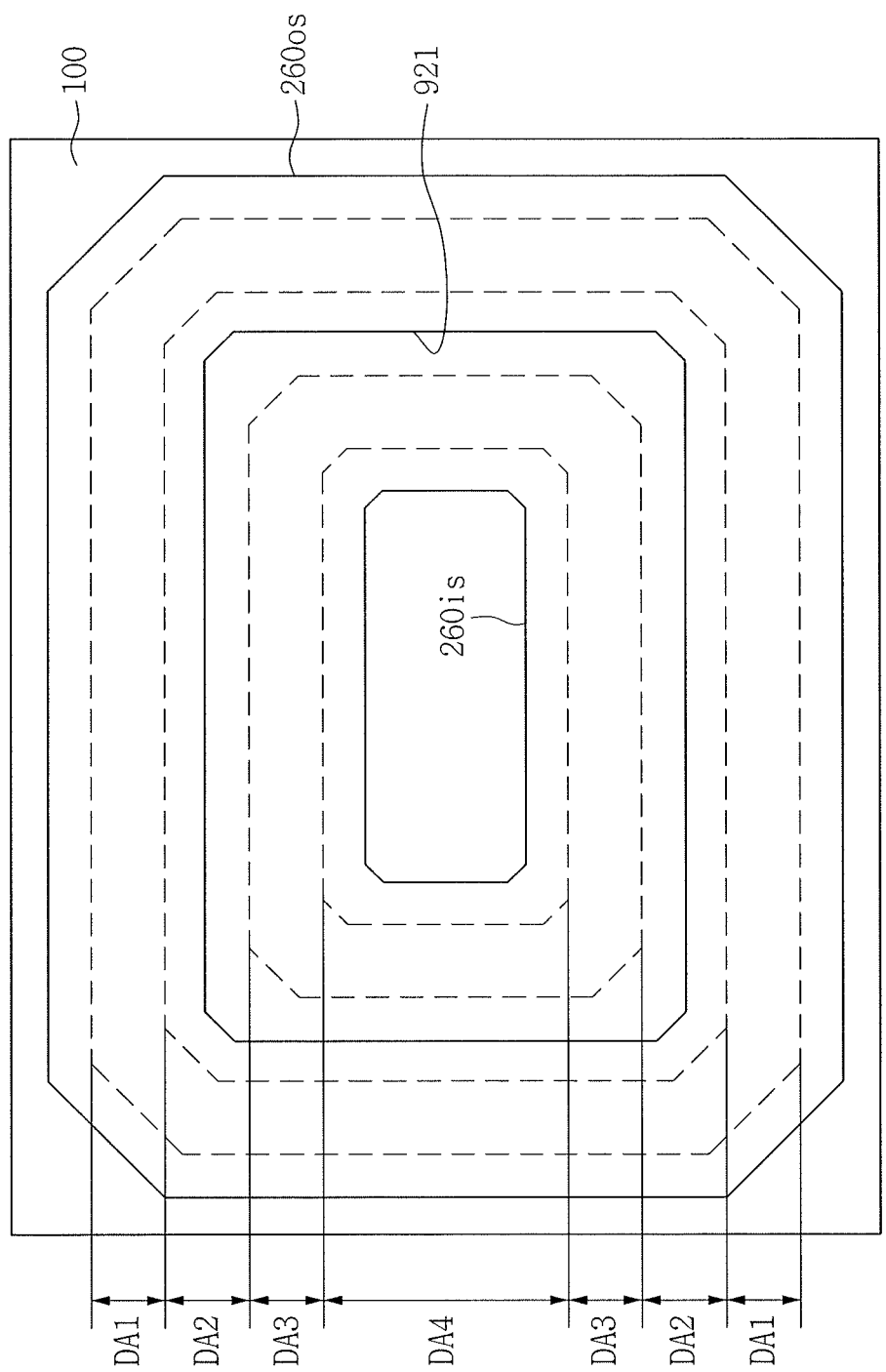
Figure 14B:
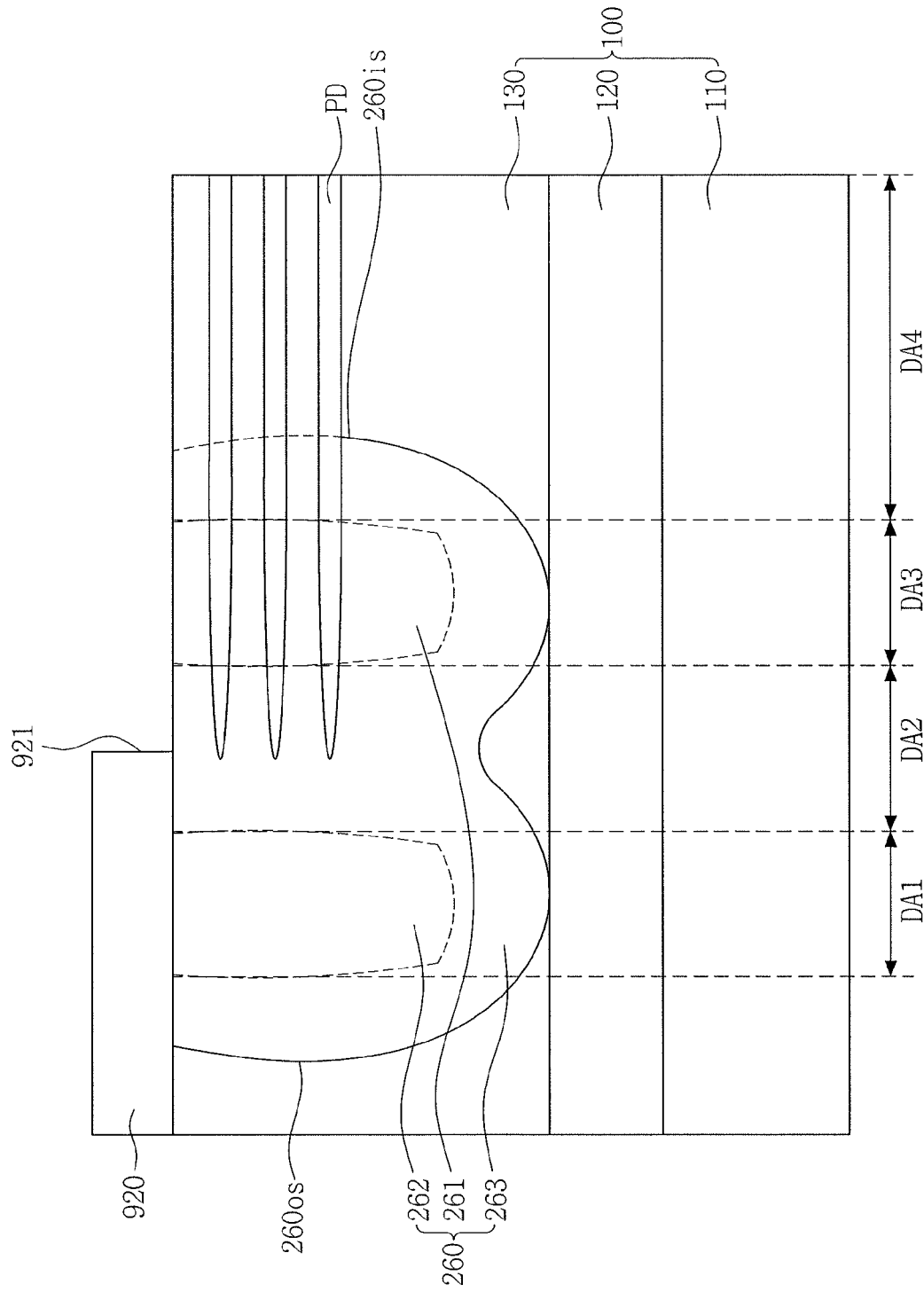

Referring to FIGS. 14A and 14B, the method of forming a semiconductor device in accordance with the embodiment may include forming a preliminary drift region PD in the second to fourth doping region DA2 to DA4 of the semiconductor substrate 100.

The formation of the preliminary drift region PD may include implanting the second conductive type dopant into the second to fourth doping region DA2 to DA4 of the semiconductor substrate 100 using the second mask pattern 920.

In the method of forming a semiconductor device in accordance with the embodiment, three preliminary drift regions PD are illustrated as being formed in the second to fourth doping region DA2 to DA4 of the semiconductor substrate 100. However, at least one preliminary drift region PD may be Ruined in the second to fourth doping region DA2 to DA4 of the semiconductor substrate 100 in the method of forming a semiconductor device in accordance with the embodiment.

Figure 15A:
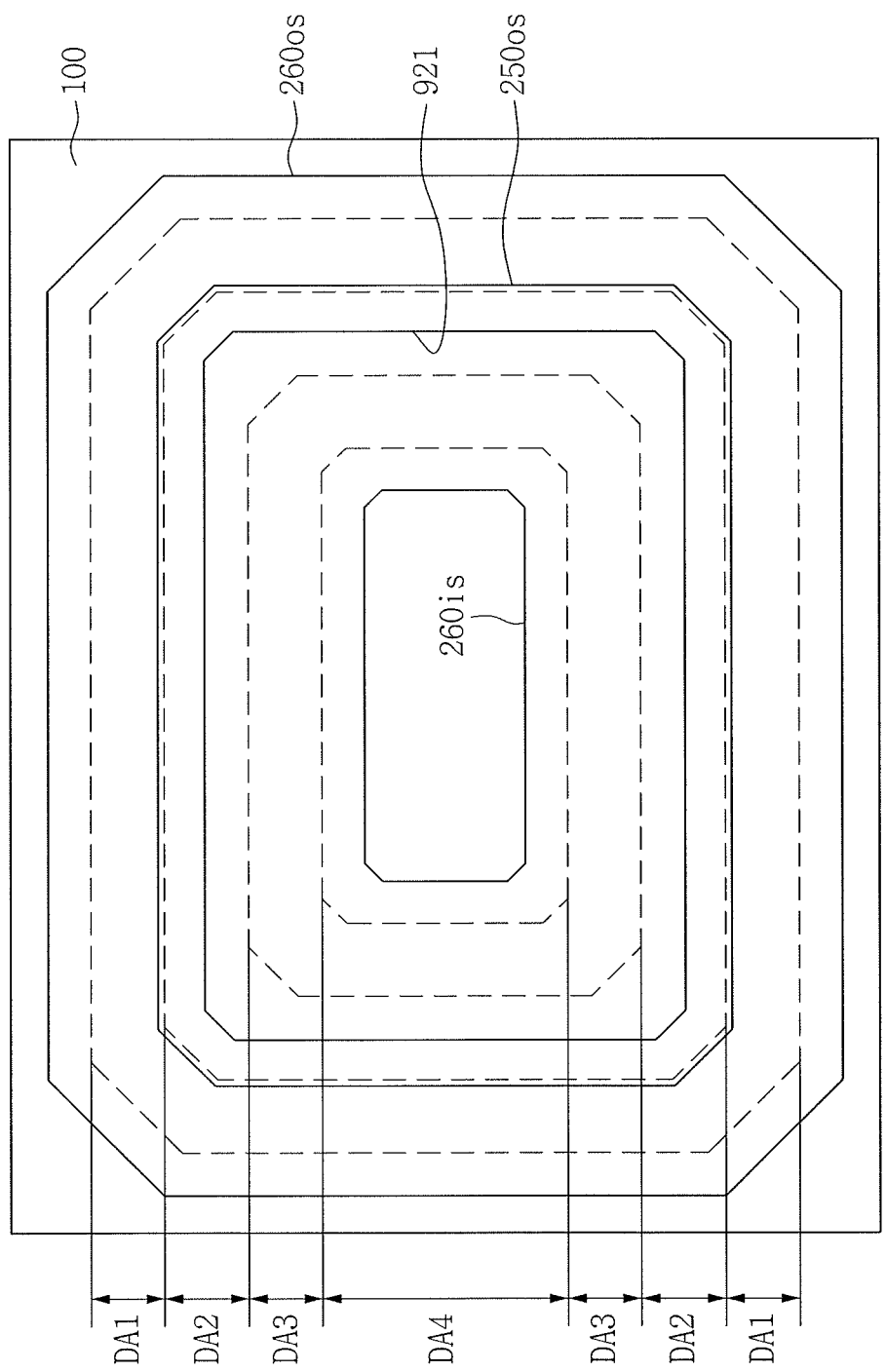
Figure 15B:
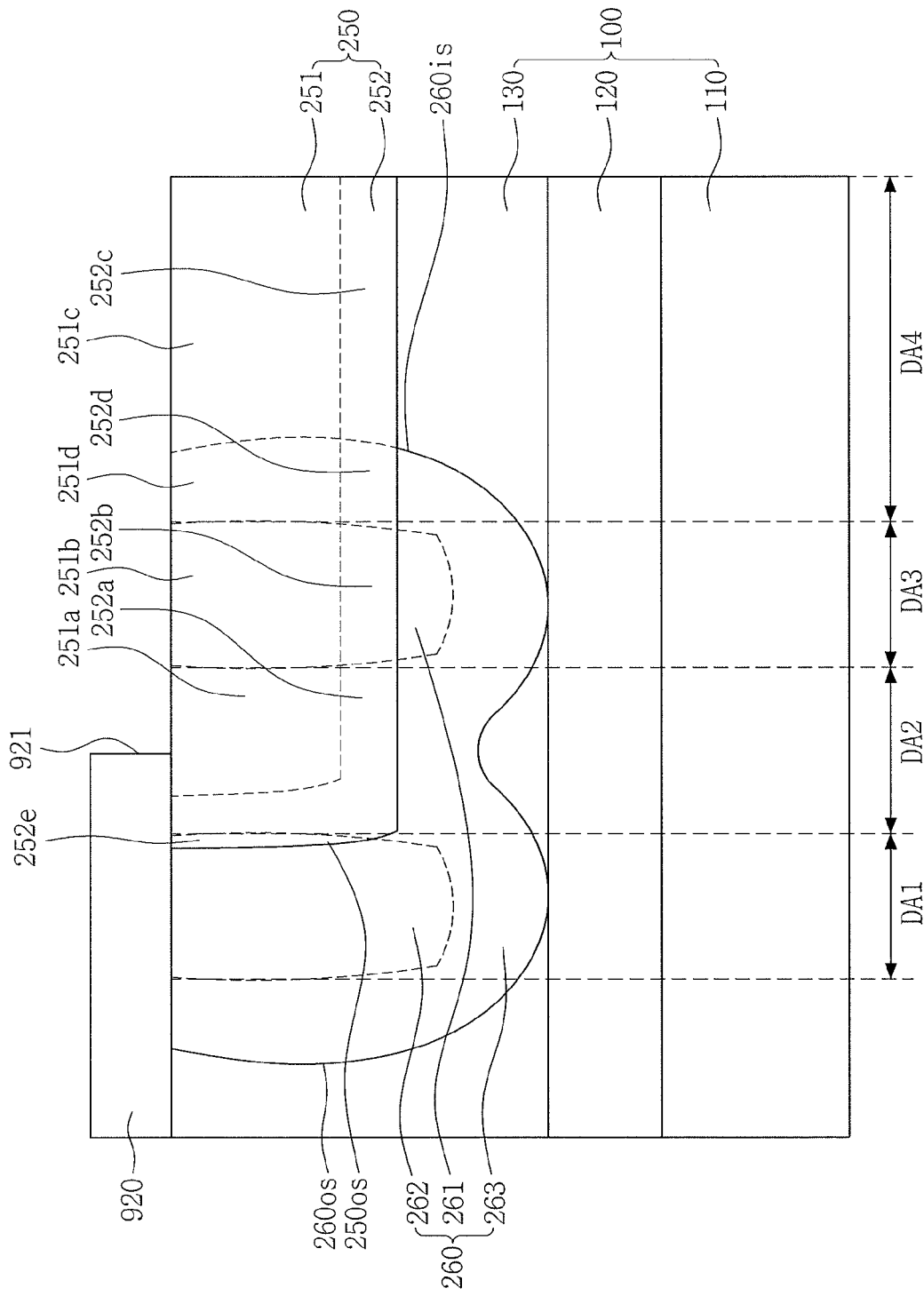

Referring to FIGS. 15A and 15B, the method of forming a semiconductor device in accordance with an embodiment may include forming a drift region 250 having a drift inner region 251 and drift outer region 252 in the semiconductor substrate 100.

The formation of the drift region 250 may include diffusing the second conductive type dopant (e.g., from the preliminary drift region PD). The diffusion of the second conductive type dopant may include heating the semiconductor substrate 100 at a second process temperature for a second process time. The second process temperature may be lower than the first process temperature. The second process time may be shorter than the first process time. For example, the formation of the drift region 250 may include heating the semiconductor substrate 100 at about 1050° C. to about 1200° C. for about 30 minutes to about 2 hours. The diffusion range of the second conductive type dopant may be narrower than that of the first conductive type dopant.

The lowest level of the drift region 250 may be higher than the lowest level of the first well 260. The outer side 250os of the drift region 250 may be located in the first doping region DA1 of the semiconductor substrate 100. The drift region 250 may be partially formed in the first well 260.

The drift outer region 252 may surround a side and bottom of the drift inner region 251. The density of the second conductive type dopant in the drift inner region 251 may be uniform. The density of the second conductive type dopant in the drift outer region 252 may decrease as the distance from the drift inner region 251 increases. The average density of the second conductive type dopant in the drift outer region 252 may be lower than that in the drift inner region 251.

The drift inner region 251 may include a first drift inner region 251a, a second drift inner region 251b, a third drift inner region 251c, and a fourth drift inner region 251d. The drift outer region 252 may include a first drift outer region 252a, a second drift outer region 252b, a third drift outer region 252c, and a fourth drift outer region 252d.

The first drift inner region 251a and the first drift outer region 252a may be located in the second doping region DA2 of the semiconductor substrate 100. The second drift inner region 251b and the second drift outer region 252b may be located in the third doping region DA3 of the semiconductor substrate 100. The third drift inner region 251c, the third drift outer region 252c, the fourth drift inner region 251d, and the fourth drift outer region 252d may be located in the fourth doping region DA3 of the semiconductor substrate 100. A boundary 251dc between the third drift inner region 251c and the fourth drift inner region 251d, and a boundary 252dc between the third drift outer region 252c and the fourth drift outer region 252d may be substantially the same as (i.e., may be aligned along the z-direction with) an extension line of the inner side 260is of the first well 260.

The first drift inner region 251a, the second drift inner region 251b, the fourth drift inner region 251d, the first drift outer region 252a, the second drift outer region 252b, and the fourth drift outer region 252d may include the first conductive type dopant. The third drift inner region 251c and the third drift outer region 252c may not include the first conductive type dopant.

Figure 16A:
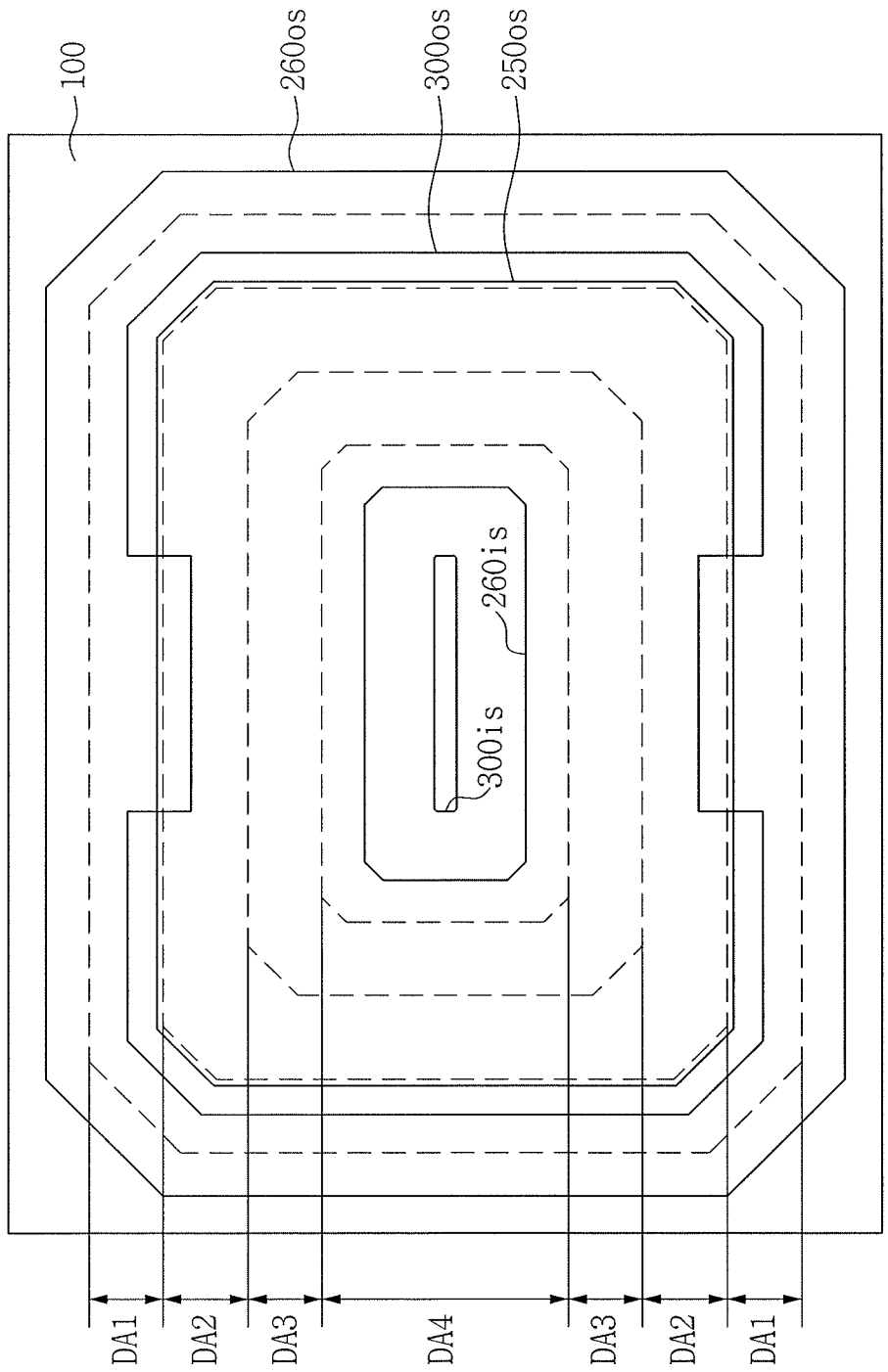
Figure 16B:
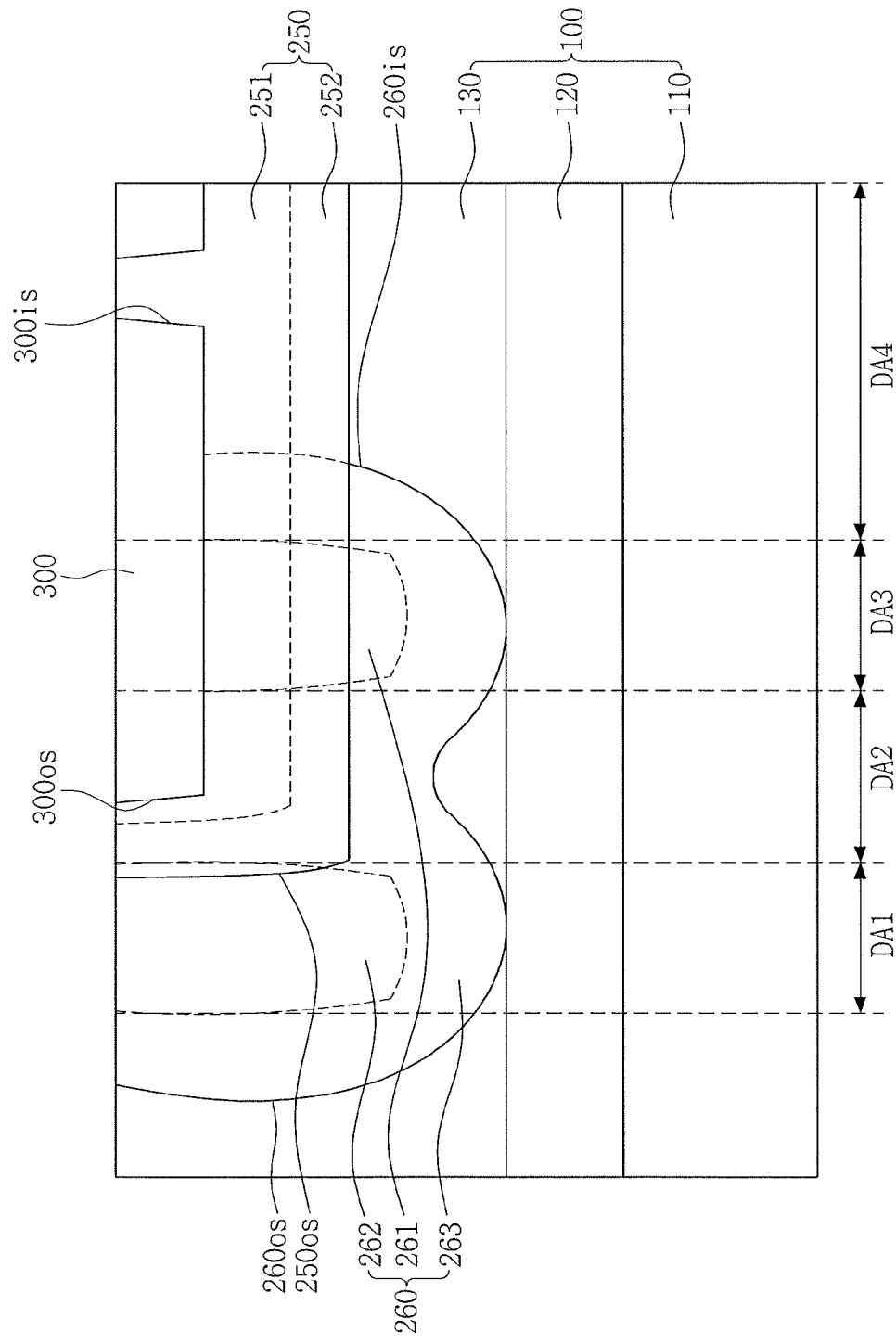

Referring to FIGS. 16A and 16B, the method of forming a semiconductor device in accordance with the embodiment may include forming a shallow trench isolation 300 in the semiconductor substrate 100.

An outer side 300os of the shallow trench isolation 300 may be located in the first doping region DA1 of the semiconductor substrate 100. The shallow trench isolation 300 may partially vertically overlap the second well inner region 262. The outer side 300os of the shallow trench isolation 300 may be located between the outer side 250os of the drift region 250 and the outer side 260os of the first well 260.

The outer side 300os of the shallow trench isolation 300 may partially located in the second doping region DA2 of the semiconductor substrate 100. The shallow trench isolation 300 may not partially vertically overlap the second well inner region 262. The shallow trench isolation 300 may partially expose a top of the drift outer region 252. The outer side 300os of the shallow trench isolation 300 may be partially located between the outer side 250os of the drift region 250 and the inner side 260is of the first well 260.

An inner side 300is of the shallow trench isolation 300 may be located in the fourth doping region DA4 of the semiconductor substrate 100. The inner side 300is of the shallow trench isolation 300 may be a shape of a closed curve surrounding a part of the drift region 250. The drift region 250 surrounded by the inner side 300is of the shallow trench isolation 300 may be parallel to the outer side 300os of the shallow trench isolation 300 located in the second doping region DA2 of the semiconductor substrate 100. The drift region 250 surrounded by the inner side 300is of the shallow trench isolation 300 may be parallel to the drift outer region 252 exposed by the shallow trench isolation 300.

Figure 17A:
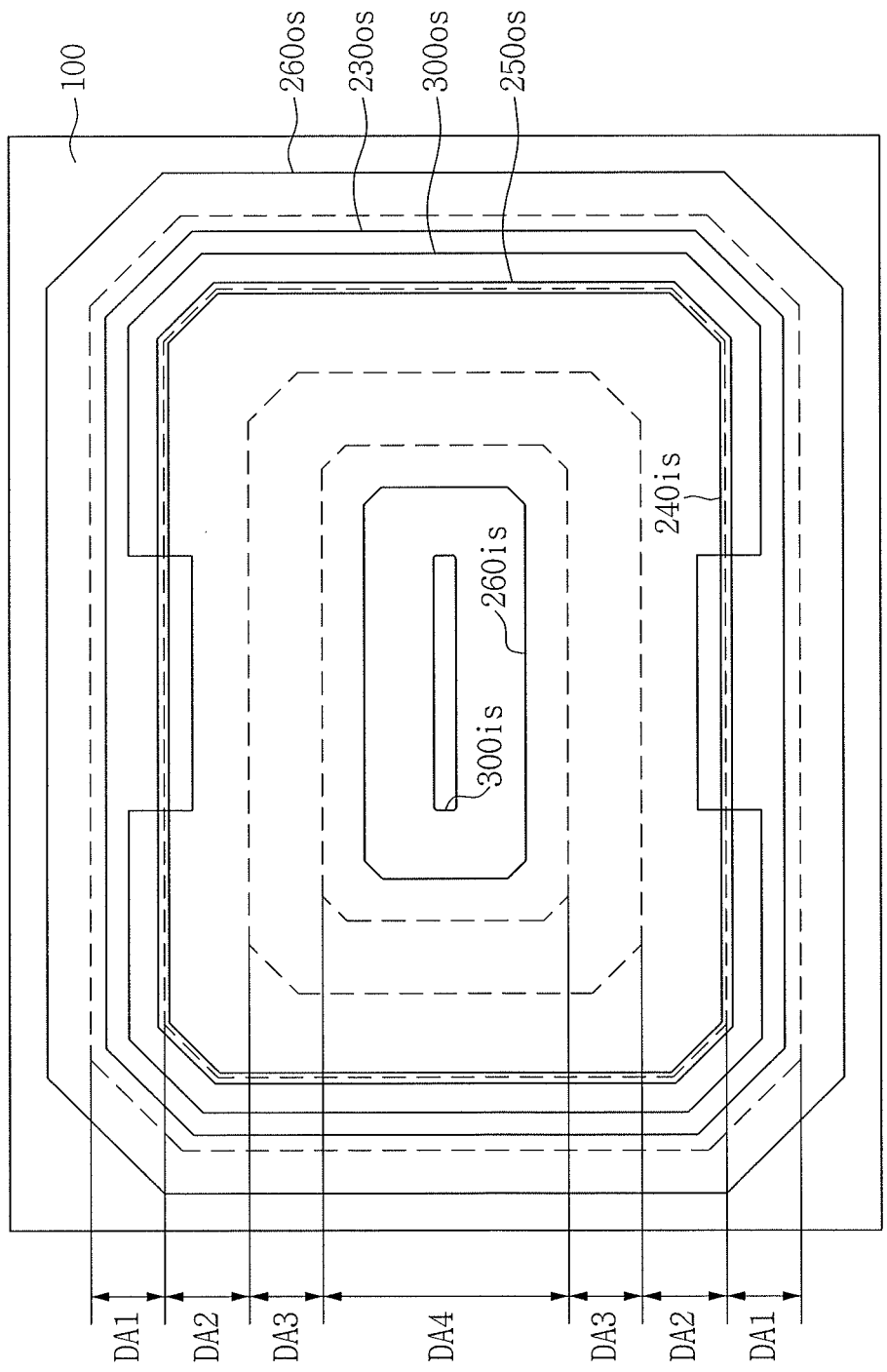
Figure 17B:
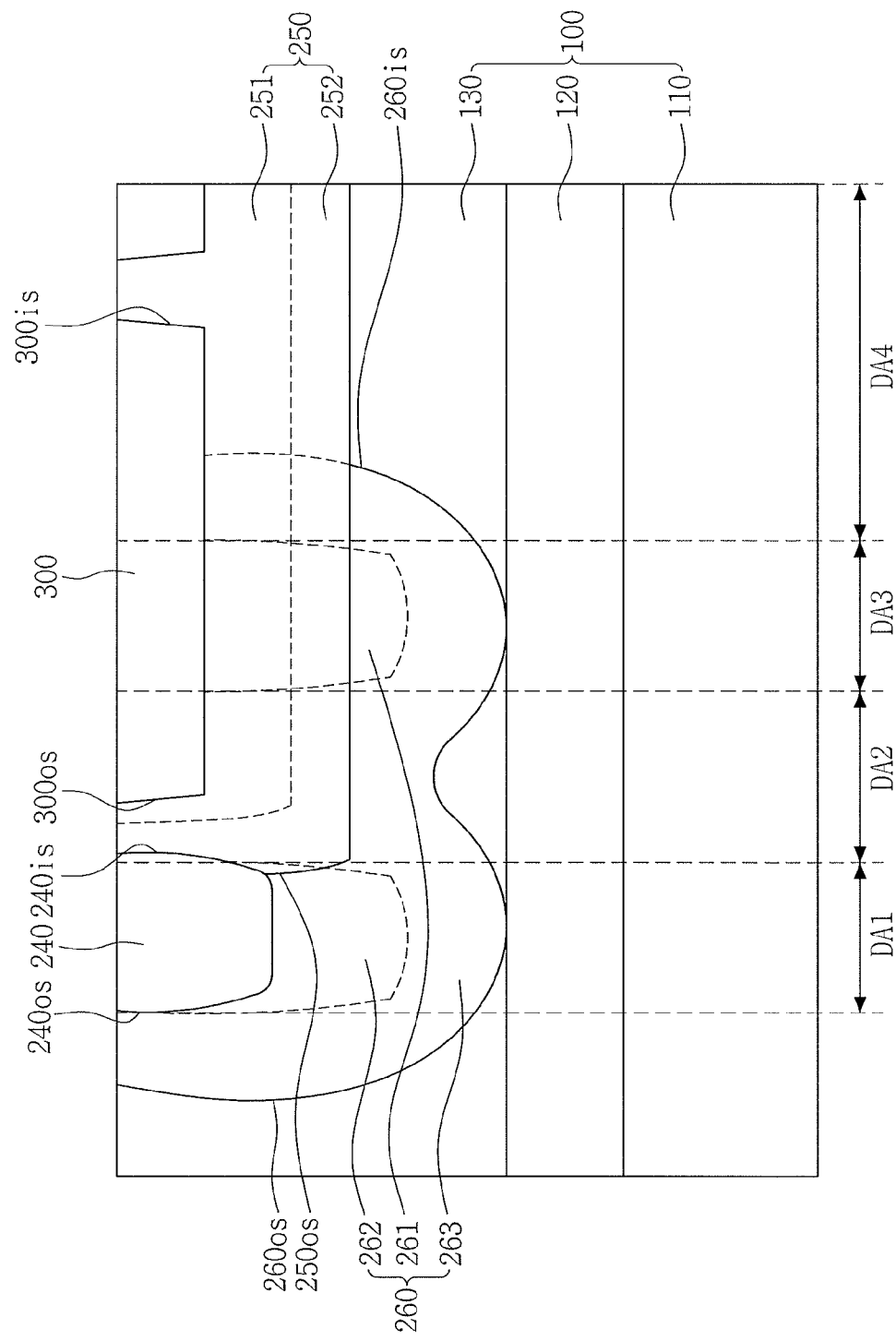

Referring to FIGS. 17A and 17B, the method of forming a semiconductor device in accordance with the embodiment may include forming a body region 240 in the first well 260.

The formation of the body region 240 may include doping the first conductive type dopant in the first well 260.

An inner side 240is of the body region 240 may be located in the second doping region DA2. The body region 240 may partially vertically overlap the drift outer region 252. The body region 240 may be spaced apart from the drift inner region 251. An outer side 240os of the body region 240 may be located in the first doping region DA1. The formation of the body region 240 may include forming the body region 240 in the second well inner region 262.

Figure 18A:
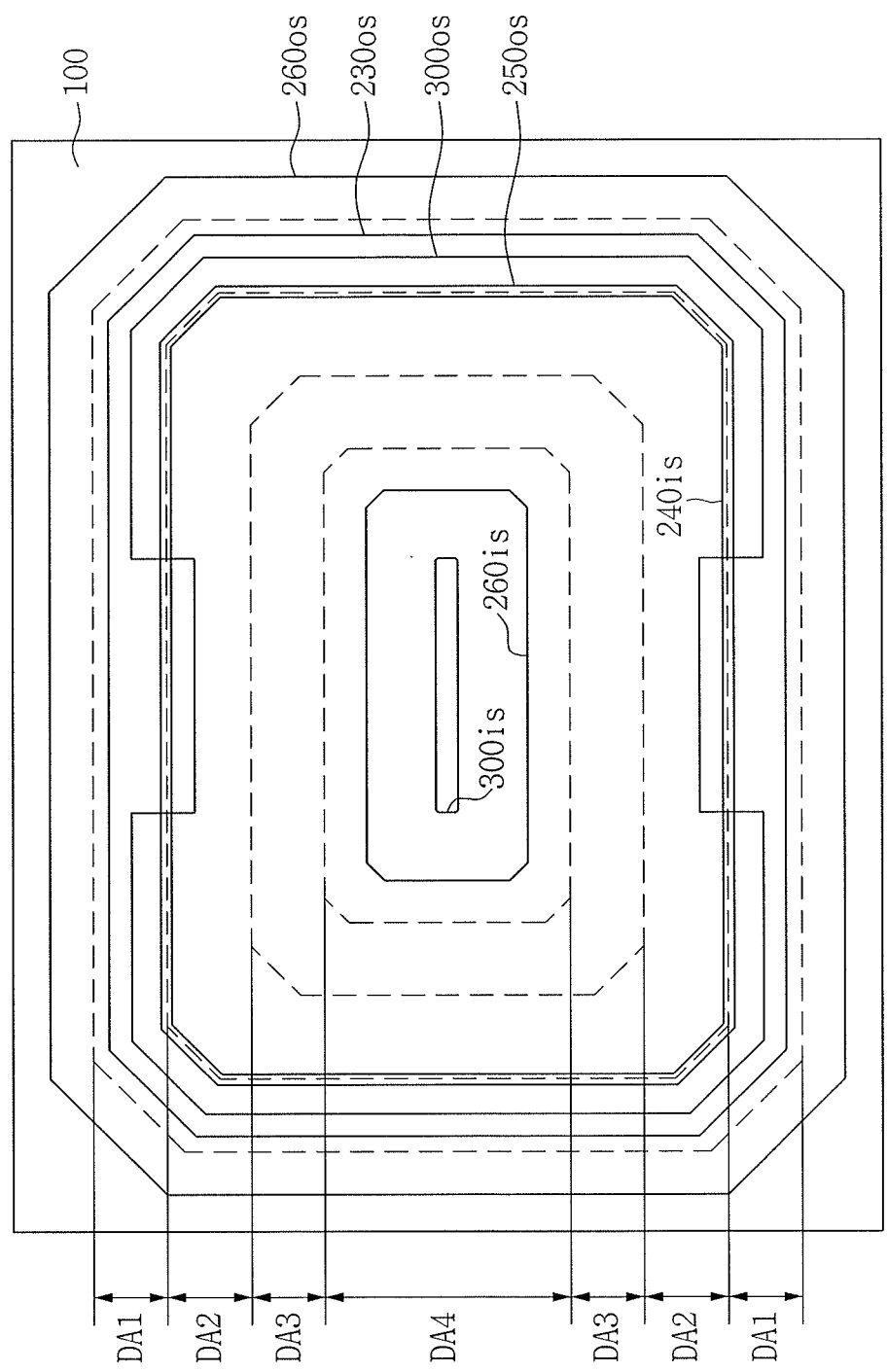
Figure 18B:
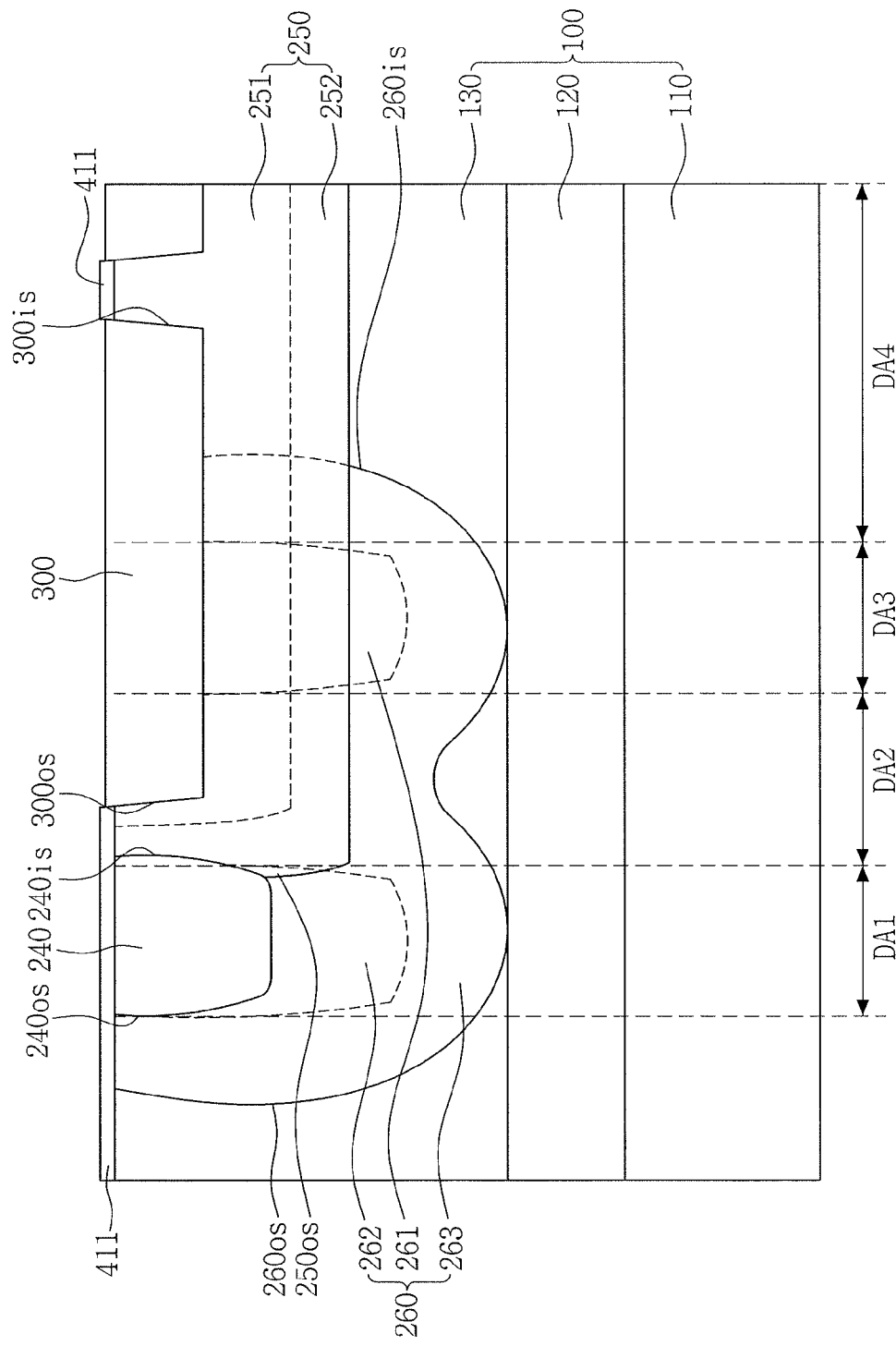

Referring to FIGS. 18A and 18B, the method of forming a semiconductor device in accordance with the embodiment may include forming an oxide layer 411 in the semiconductor substrate 100.

The formation of the oxide layer 411 may include oxidizing a surface of the semiconductor substrate 100. The formation of the oxide layer 411 may include oxidizing a top of the epitaxial layer 130.

The oxidation of the upper surface of the epitaxial layer 130 may include heating the semiconductor substrate 100 at a third process temperature for a third process time. The third process temperature may be lower than the second process temperature. The third process time may be shorter than the second process time. For example, the formation of the oxide layer 411 may include heating the semiconductor substrate 100 at about 800° C. to about 900° C. for about one hour.

The formation of the oxide layer 411 may be performed at a lower temperature than the formation of the drift region 250 and the first well 260 in the method of forming a semiconductor device in accordance with the embodiment. Accordingly, the drift region 250 and the first well 260 may be maintained (e.g., may be substantially prevented from being deformed) during the process of forming the oxide layer 411 in the method of forming a semiconductor device in accordance with the embodiment.

The oxide layer 411 may not be formed on the shallow trench isolation 300. A top level of the oxide layer 411 may be higher than that of the shallow trench isolation 300.

Figure 19B:
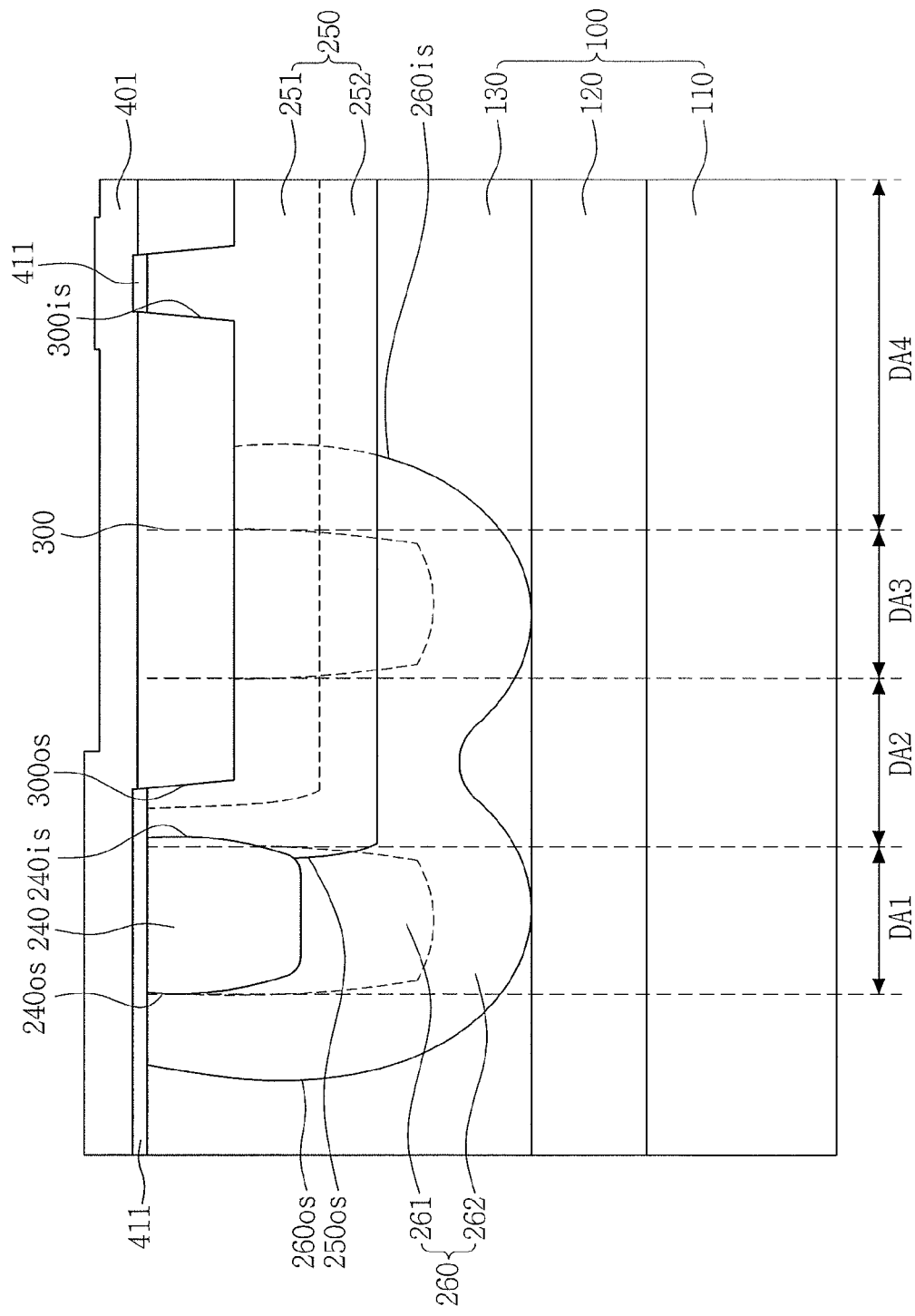

Referring to FIGS. 19A and 19B, the method of forming a semiconductor device in accordance with the embodiment may include forming a gate layer 401 on the oxide layer 411.

The gate layer 401 may be in direct contact with a top of the shallow trench isolation 300.

Figure 20A:
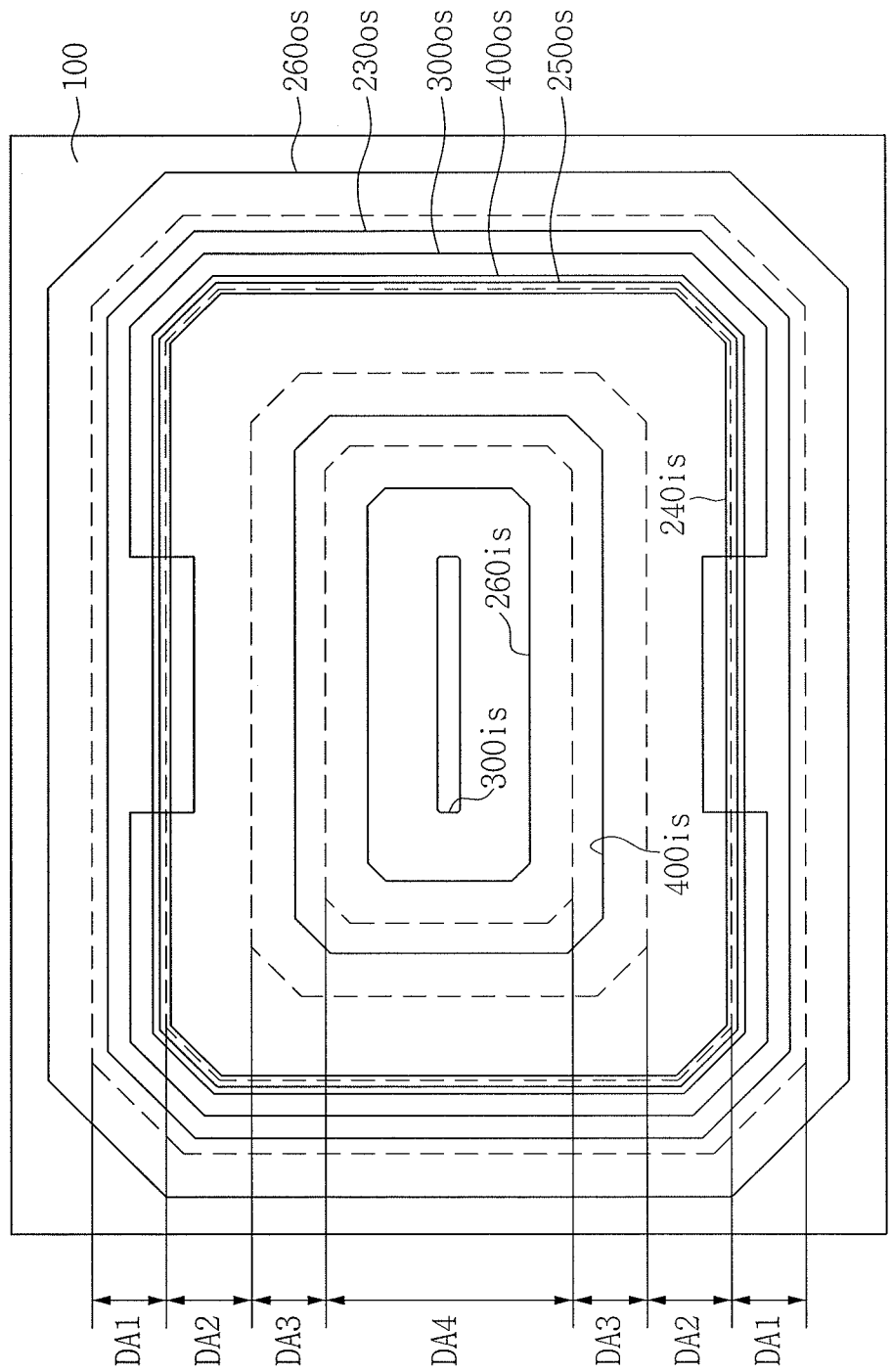
Figure 20B:
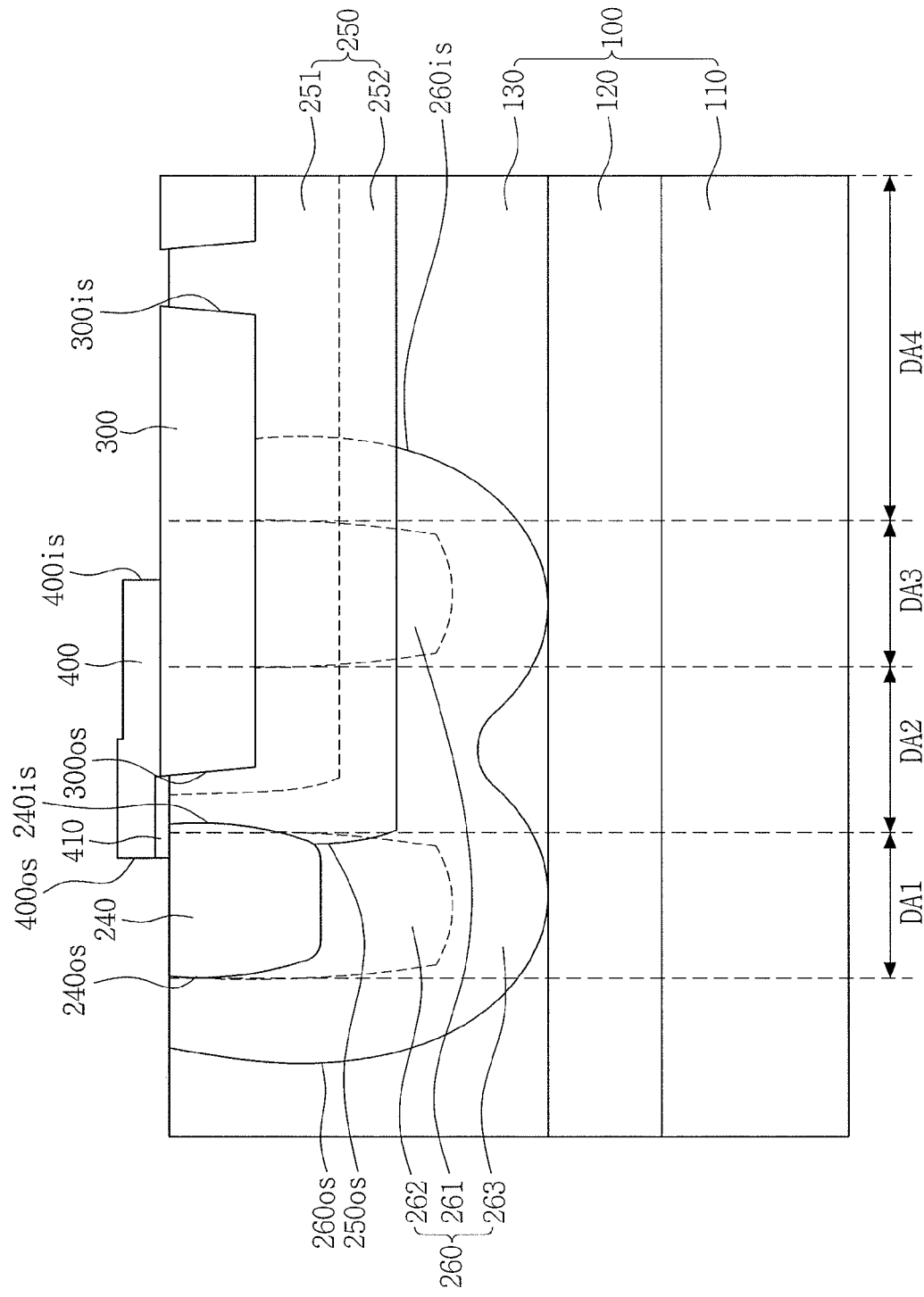
Figure 21:
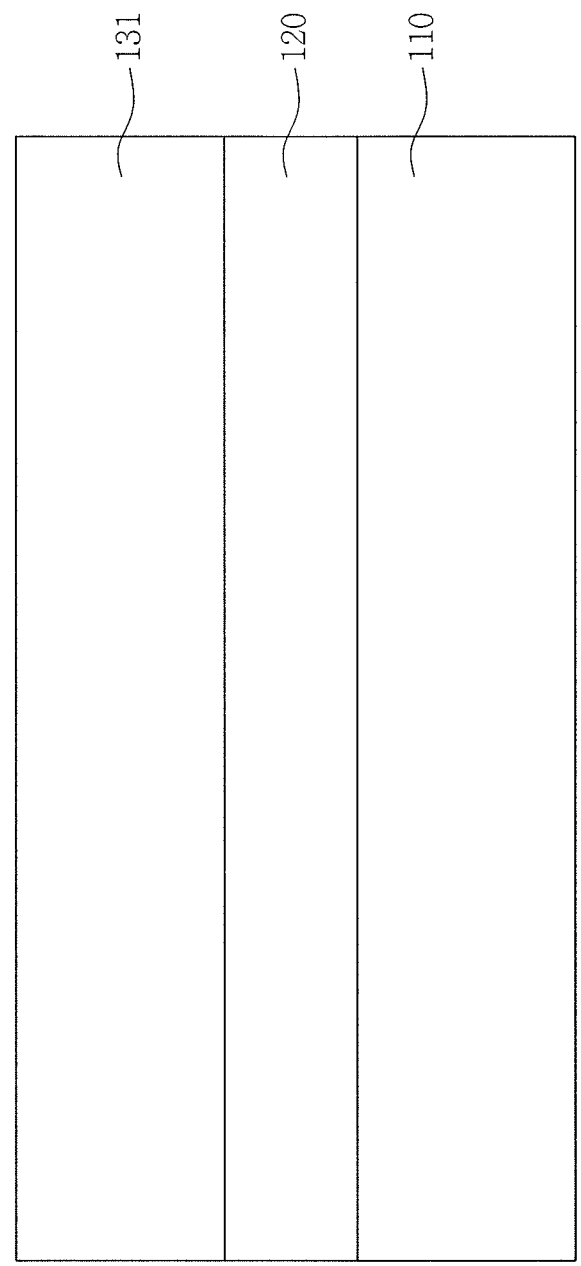
FIGS. 21 to 26 illustrate cross-sectional views of sequential stages in a method of forming a semiconductor device in accordance with another embodiment.

Referring to FIGS. 20A and 20B, the method of forming a semiconductor device in accordance with the embodiment may include forming a gate pattern 400 and an oxide pattern 410 on the semiconductor substrate 100.

The formation of the gate pattern 400 and the oxide pattern 410 may include patterning the gate layer 401 and patterning the oxide layer 411. The patterning of the oxide layer 411 and the patterning of the gate layer 401 may be performed at the same time. The shape of the gate pattern 400 may be substantially the same as that of the body region 240. For example, the shape of the gate pattern 400 may be a shape of an octagonal ring.

Referring to FIGS. 1A and 1B, the method of forming a semiconductor device in accordance with the embodiment may include forming a first source/drain region 210 and a second source/drain region 220 in the semiconductor substrate 100.

The formation of the first source/drain region 210 and the second source/drain region 220 may include forming the first source/drain region 210 in the drift region 250 and forming the second source/drain region 220 in the body region 240. The formation of the first source/drain region 210 may include doping the second conductive type dopant in the drift region 250. The formation of the second source/drain region 220 may include doping the second conductive type dopant in the body region 240. The formation of the first source/drain region 210 and the formation of the second source/drain region 220 may be performed at the same time.

The method of forming a semiconductor device in accordance with the embodiment may further include forming a body contact region 230 in the body region 240. The formation of the body contact region 230 may include doping the first conductive type dopant in the body region 240. The formation of the body contact region 230 may be performed after the formation of the second source/drain region 220.

FIGS. 21 to 26 illustrate cross-sectional views of sequential stages in a method of forming a semiconductor device in accordance with another embodiment.

A method of forming a semiconductor device in accordance with an embodiment will be described with reference to FIG. 5 and FIGS. 21 to 26. First, referring to FIG. 21, the method of forming a semiconductor device in accordance with the embodiment may include forming a second conductive type buried layer 120 in a first conductive type base substrate 110 and forming a second conductive type first epitaxial layer 131 on the buried layer 120.

The formation of the first epitaxial layer 131 may include forming the first epitaxial layer 131 having a second conductive type dopant on the buried layer 120.

Figure 22:
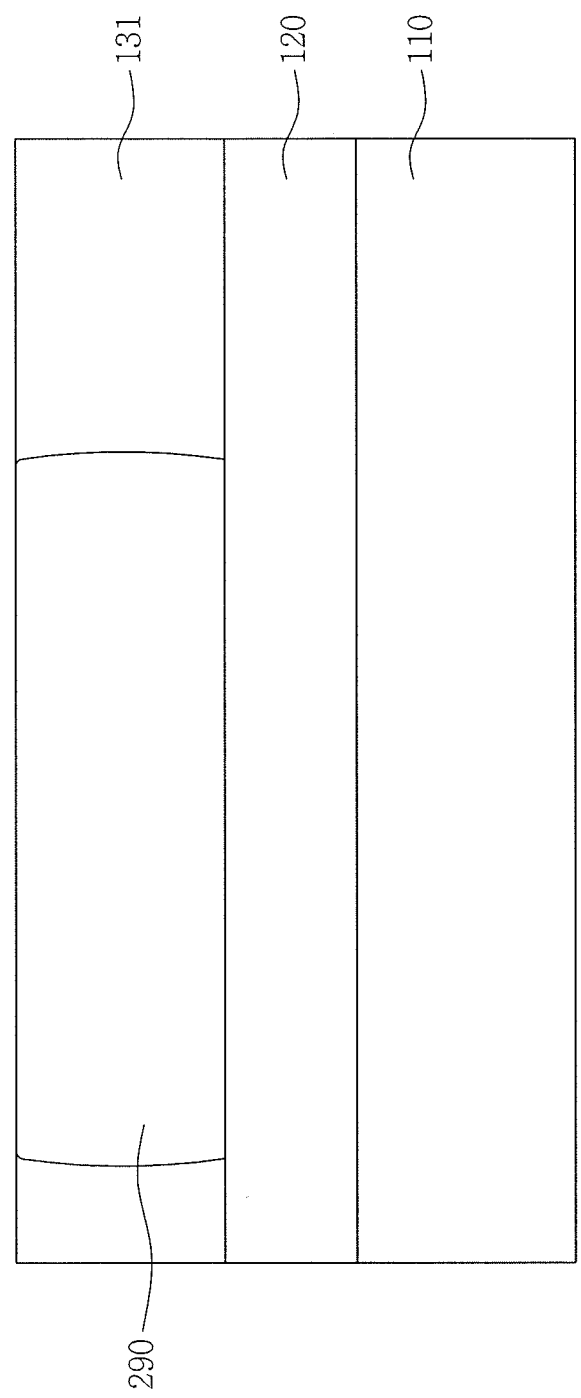

Referring to FIG. 22, the method of forming a semiconductor device in accordance with the embodiment may include forming a first well 290 in the first epitaxial layer 131.

The formation of the first well 290 may include doping a first conductive type dopant in the first epitaxial layer 131. The density of the first conductive type dopant in the first well 290 may be uniform.

Figure 23:
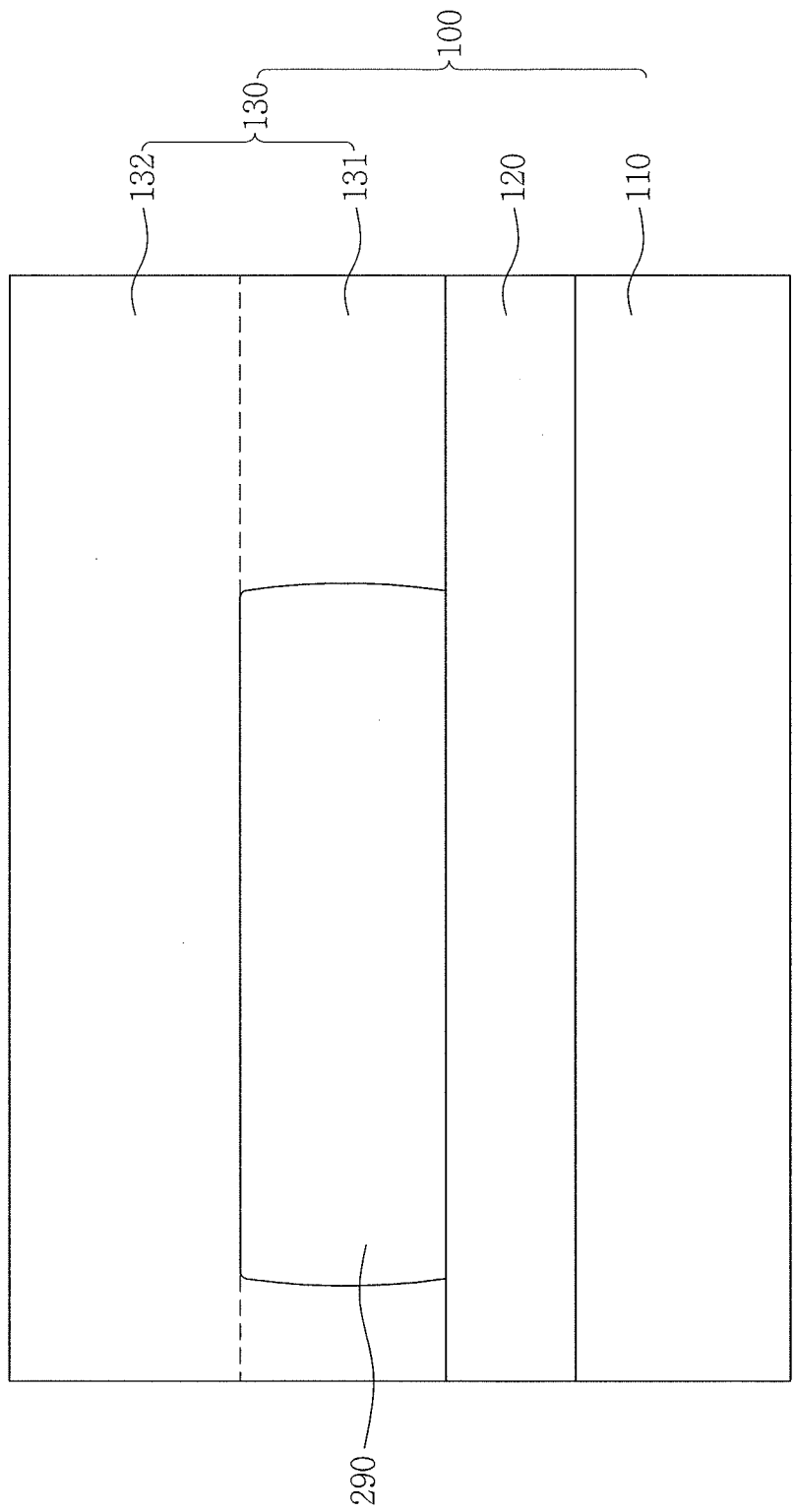

Referring to FIG. 23, the method of forming a semiconductor device in accordance with the embodiment may include forming a second conductive type second epitaxial layer 132 on the first epitaxial layer 131.

The formation of the second epitaxial layer 132 may include forming the second epitaxial layer 132 having the second conductive type dopant on the first epitaxial layer 131.

The first epitaxial layer 131 and the second epitaxial layer 132 may constitute an epitaxial layer 130. The base substrate 110, the buried layer 120, and the epitaxial layer 130 may constitute a semiconductor substrate 100.

Figure 24:
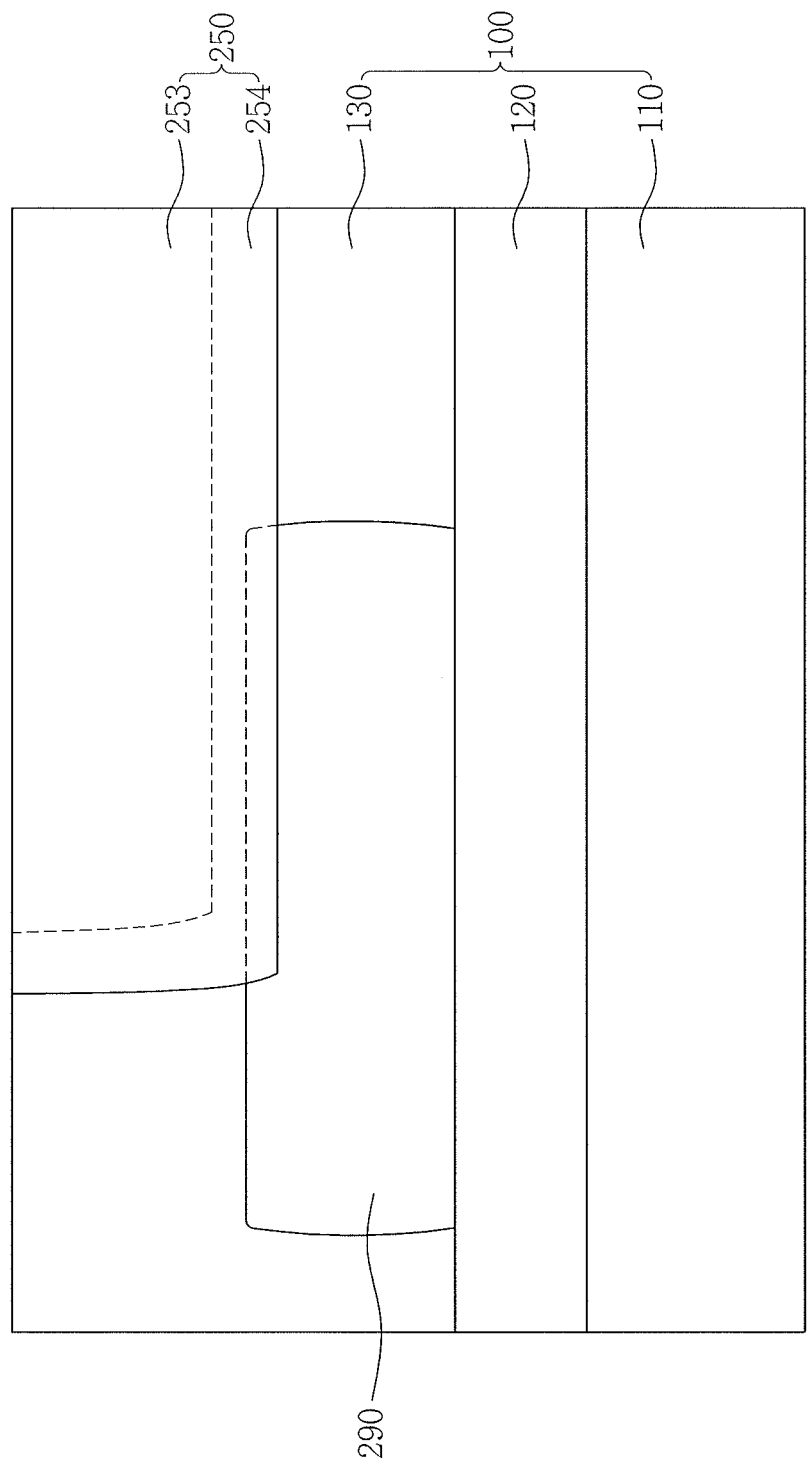

Referring to FIG. 24, the method of forming a semiconductor device in accordance with the embodiment may include forming a drift region 250 having a drift inner region 253 and a drift outer region 254 in the epitaxial layer 130.

The formation of the drift region 250 may include implanting the second conductive type dopant in the epitaxial layer 130 and diffusing the second conductive type dopant.

A bottom level of the drift outer region 254 may be lower than a top level of the first well 290. The drift outer region 254 may include a drift lower region 254f. The drift lower region 254f may be located between a bottom level of the drift outer region 254 and the top level of the first well 290. The drift lower region 254f may include the first conductive type dopant and the second conductive type dopant. A bottom level of the drift inner region 253 may be higher than a top level of the first well 290.

Figure 25:
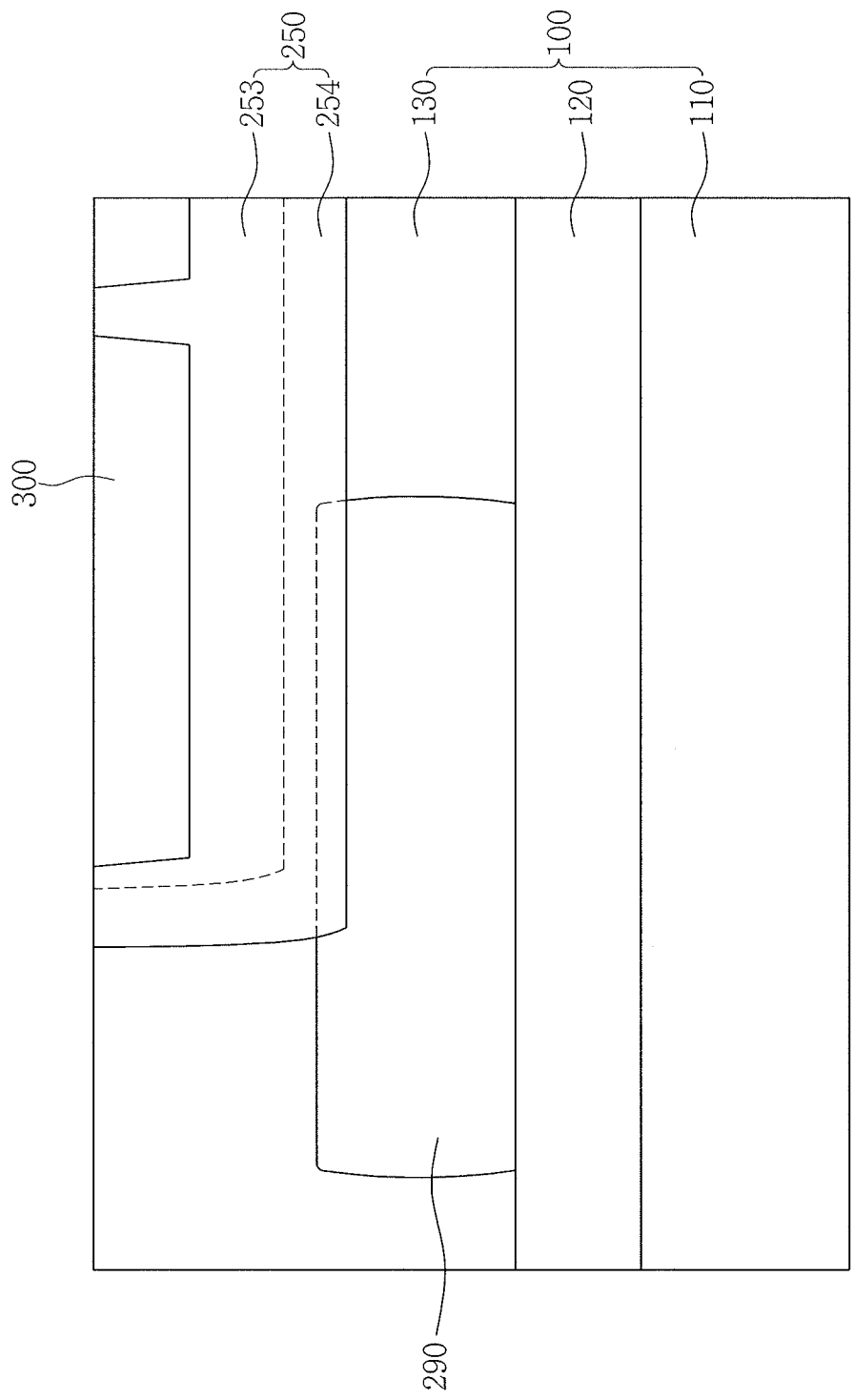

Referring to FIG. 25, the method of forming a semiconductor device in accordance with the embodiment may include forming a shallow trench isolation 300 in the semiconductor substrate 100. The shallow trench isolation 300 may be partially located in the drift inner region 253.

Figure 26:
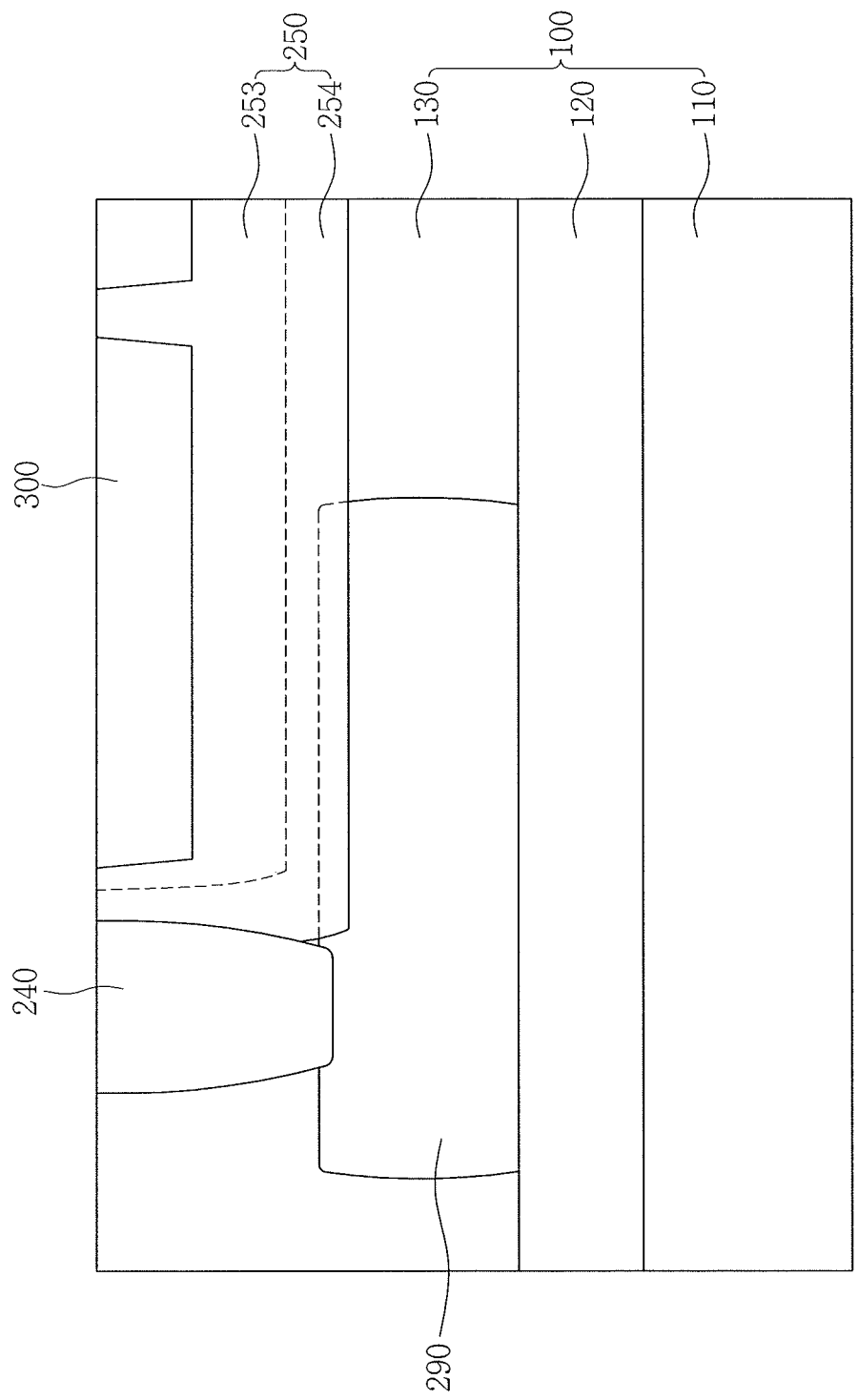

Referring to FIG. 26, the method of forming a semiconductor device in accordance with the embodiment may include forming a body region 240 in the semiconductor substrate 100.

The formation of the body region 240 may include doping the first conductive type dopant in the semiconductor substrate 100. A bottom level of the body region 240 may be lower than the top level of the first well 290. The body region 240 may partially vertically overlap the drift region 250. The body region 240 may be spaced apart from the drift inner region 253.

Referring to FIG. 5, the method of forming a semiconductor device in accordance with an embodiment may include forming a first source/drain region 210 in the drift region 250 and forming a second source/drain region 220 and a body contact region 230 in the body region 240.

Figure 27:
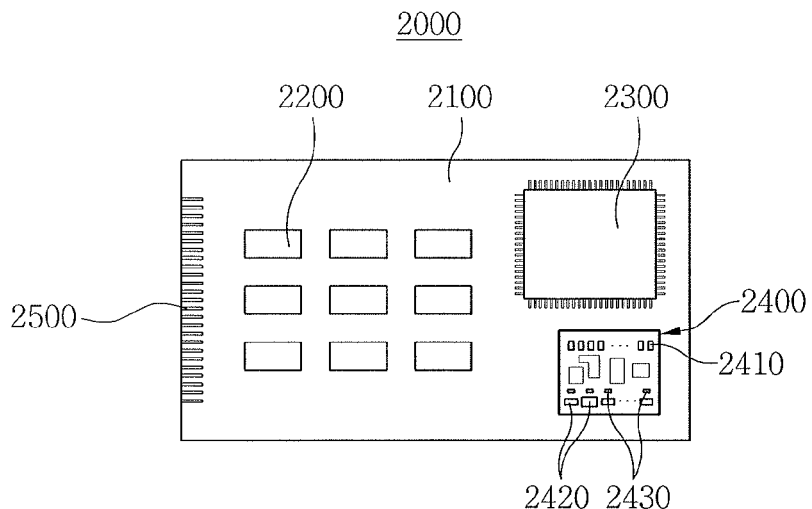
FIG. 27 illustrates a configuration diagram of a semiconductor module including a semiconductor device in accordance with an embodiment.

FIG. 27 illustrates a configuration diagram of a semiconductor module including a semiconductor device in accordance with an embodiment.

Referring to FIG. 27, a semiconductor module 2000 may include a module substrate 2100, memories 2200, a microprocessor 2300, power management IC (PMIC) 2400, and input/output terminals 2500. The memories 2200, the microprocessor 2300 and the PMIC 2400 may be mounted on the module substrate 2100. The semiconductor module 2000 may include a memory card or a card package.

The PMIC 2400 may include at least one of Low Drop-Out (LDO) regulator 2410, at least one of buck converter 2420, and controller 2430. The buck converter 2420 may include a linear regulator or switching regulator. The LDO 1410 and the buck converter 2420 may include a semiconductor device in accordance with various embodiments. In the semiconductor module 100 in accordance with an embodiment, operation characteristics of the LDO 2410 and the buck converter 2420 may be improved. Thus, in the semiconductor module 100 in accordance with an embodiment, the power supplying the memory 2200 and the microprocessor 2300 may be effectively managed.

Figure 28:
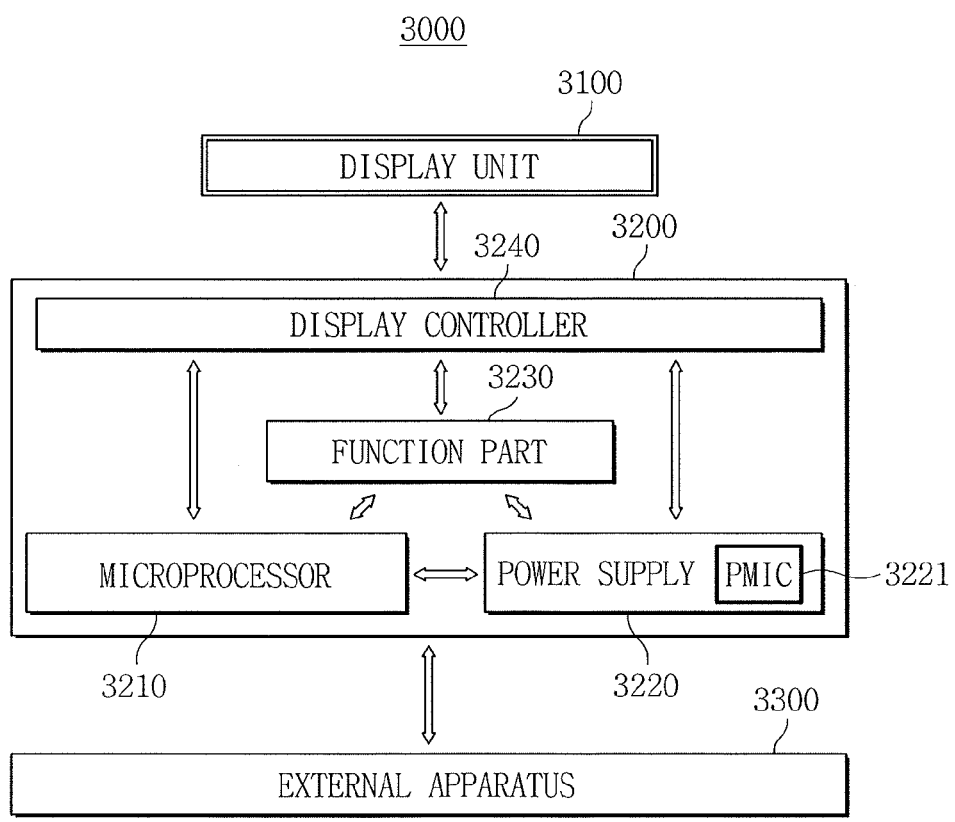
FIG. 28 illustrates a configuration diagram of a mobile system including a semiconductor device in accordance with an embodiment.

FIG. 28 illustrates a configuration diagram of a mobile system including a semiconductor device in accordance with an embodiment.

Referring to FIG. 28, a mobile system 3000 may include a display unit 3100, a body 3200, and an external apparatus 3300. The body 3200 may include a microprocessor unit 3210, a power supply 3220, a function part 3230, and a display controller 3240.

The display unit 3100 may be electrically connected with the body unit 3200. The display unit 3100 may display an image processed by a display controller 3240 of the body unit 3200.

The body 3200 may be a system board or a mother board including a printed circuit board (PCB). The microprocessor unit 3210, the power supply 3220, the function part 3230, and the display controller unit 3240 may be mounted or installed on the body 3200.

The microprocessor unit 3210 may receive a voltage from the power supply 3220 to control the function unit 3230 and the display controller unit 3240. The power supply 3220 may receive a constant voltage from an external power source, divide the voltage into various levels, and supply those voltages to the microprocessor 3210, the function part 3230, and the display controller 3240.

The power supply 3220 may include PMIC 3221. The PMIC 3221 may include a semiconductor device in accordance with an embodiment. In the mobile system 3000 in accordance with an embodiment, the efficiency of PMIC 3221 may be improved. Thus, in the semiconductor module 100 in accordance with an embodiment, the power may be effectively supplied to the microprocessor unit 3210, the function part 3230, and the display controller 3240.

The function unit 3230 may perform various functions of the mobile systems 3000. For example, the function unit 3230 may include several components that can perform functions of, e.g., a mobile phone such as dialing, video output to the display unit 3100 through communication with an external apparatus 3300, and sound output to a speaker. For example, the function unit 3230 may function as an image processor. If the mobile system 3000 is connected to a memory card, etc. in order to expand capacity, the function unit 3230 may function as a memory card controller. If the mobile system 3000 includes a universal serial bus (USB) in order to expand functionality, the function unit 3230 may function as an interface controller.

Figure 29:
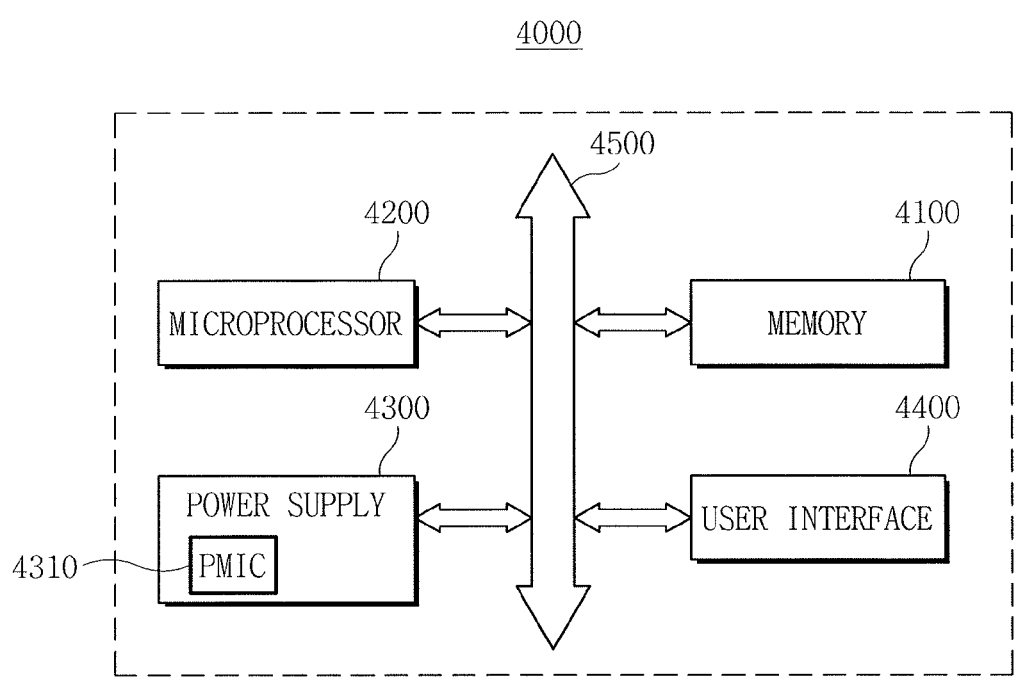
FIG. 29 illustrates a configuration diagram of an electronic system including a semiconductor device in accordance with an embodiment.

FIG. 29 illustrates a configuration diagram of an electronic system including a semiconductor device in accordance with an embodiment.

Referring to FIG. 29, the electronic system 4000 may include a memory system 4100, a microprocessor 4200, a power supply 4300, and a user interface 4400.

The memory system 4100 may store codes for booting the microprocessor 4200, data processed by the microprocessor 4200, or external input data. The memory system 4100 may include a controller and memory. The microprocessor 4200 may program and control the electronic system 4000. The microprocessor 4200 may include RAM used as an operation memory of the microprocessor 4200. The power supply 4300 may receive a constant voltage from an external power source to supply suitable voltages to the memory system 4100, the microprocessor 4200, and the user interface 4400. The user interface 440 may perform data communication using a bus 4500. The user interface 4400 may be used to input data to, or output data from the electronic system 4000.

The power supply 4300 may include a PMIC 4310. The PMIC 4310 may include a semiconductor device in accordance with an embodiment. In an embodiment, the electronic system 4000 may be stably performed because the PMIC 4310 effectively supplies the power.

By way of summary and review, a semiconductor device may perform a variety of roles in electronic apparatuses. The semiconductor device may include a body region and a drift region. The semiconductor device may include, e.g., a laterally diffused (or double-diffused) metal oxide semiconductor (LDMOS). In a LDMOS used as a high voltage device in a power management IC (PMIC), a high voltage P-well (HVPW) may be formed to increase a breakdown voltage. However, the on-resistance may be increased by compensating an n-drift region adjacent to a p-body of the HVPW.

The semiconductor device according to the embodiments may allow for the breakdown voltage between a first source/drain region and a second source/drain region to increase while decreasing the turn-on resistance. The semiconductor device may include a HVPW that includes a center region doped by a lower concentration than the other regions, and an n-drift region adjacent to a body may be compensated to the center region of the HVPW. Thus, the on-resistance of the semiconductor device (e.g., a LDMOS) may be decreased without degradation of the breakdown voltage. Therefore, the operation characteristics may be improved in the semiconductor device and the method of forming the same in accordance with an embodiment.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a semiconductor device, the method comprising:
providing a semiconductor substrate including a first doping region, a second doping region, a third doping region, and a fourth doping region, wherein the second doping region is between the first doping region and the third doping region, and the third doping region is between the second doping region and the fourth doping region;
forming a preliminary well region by injecting a first conductive type dopant into the first doping region and the third doping region;
forming a well including a first well inner region, a second well inner region, and a well outer region by diffusing the first conductive type dopant, wherein the first well inner region is in the first doping region, the second well inner region is in the third doping region, and the well outer region surrounds the first well inner region and the second well inner region;
forming a drift region by doping a second conductive type dopant into the second to fourth doping regions, wherein a lowest level of the drift region is above a lowest level of the well; and
forming a body region by doping a first conductive type dopant into the first doping region, wherein the body region is in contact with a side of the drift region.

2. The method as claimed in claim 1, wherein forming the well includes doping the second doping region between the first well inner region and the second well inner region with the first conductive type dopant.

3. The method as claimed in claim 1, wherein:
forming the drift region includes injecting the second conductive type dopant into the second to fourth doping regions and diffusing the second conductive type dopant to form a drift inner region and a drift outer region, and
the drift outer region surrounds the drift inner region.

4. The method as claimed in claim 3, wherein:
forming the body region includes forming the body region spaced apart from the drift inner region, and
the body region partially overlaps the drift outer region.

5. The method as claimed in claim 3, further comprising:
forming a shallow trench isolation in the drift region, the shallow trench isolation being spaced apart from the drift outer region.

6. The method as claimed in claim 5, further comprising:
forming an oxide layer by oxidizing a surface of the semiconductor substrate;
forming a gate layer on the oxide layer; and
forming an oxide pattern and a gate pattern by patterning the oxide layer and the gate layer.

7. The method as claimed in claim 6, wherein forming the oxide layer includes oxidizing the surface of the semiconductor substrate at a temperature that is less than temperatures for forming the well and the drift region.

8. The method as claimed in claim 1, wherein providing the semiconductor substrate includes:
providing a base substrate;
forming a buried layer by doping a second conductive type dopant in the base substrate; and
forming an epitaxial layer including the second conductive type dopant on the buried layer.

9. The method as claimed in claim 8, wherein the well is formed such that the well outer region is in contact with the buried layer.

* * * * *